(12) United States Patent
Endo et al.

(10) Patent No.: US 7,824,995 B2
(45) Date of Patent: Nov. 2, 2010

(54) SIC SEMICONDUCTOR DEVICE AND METHOD FOR MANUFACTURING THE SAME

(75) Inventors: Takeshi Endo, Obu (JP); Tsuyoshi Yamamoto, Kariya (JP); Eiichi Okuno, Mizuho (JP)

(73) Assignee: Denso Corporation, Kariya (JP)

( * ) Notice: Subject to any disclaimer, the term of this patent is extended or adjusted under 35 U.S.C. 154(b) by 163 days.

(21) Appl. No.: 12/071,717

(22) Filed: Feb. 26, 2008

(65) Prior Publication Data

US 2008/0203402 A1 Aug. 28, 2008

(30) Foreign Application Priority Data

Feb. 28, 2007 (JP) .............................. 2007-049703

(51) Int. Cl.
 *H01L 29/72* (2006.01)
(52) U.S. Cl. ...................... 438/308; 438/197; 438/585; 438/779; 438/796
(58) Field of Classification Search ................. 438/197, 438/308, 585, 779, 796
See application file for complete search history.

(56) References Cited

U.S. PATENT DOCUMENTS

| | | | |
|---|---|---|---|
| 5,736,753 | A | 4/1998 | Ohno et al. |
| 5,976,936 | A | 11/1999 | Miyajima et al. |
| 6,020,600 | A | 2/2000 | Miyajima et al. |
| 6,573,534 | B1 | 6/2003 | Kumar et al. |
| 6,764,963 | B2 | 7/2004 | Fukuda et al. |
| 2003/0013266 | A1 | 1/2003 | Fukuda et al. |
| 2004/0242022 | A1 | 12/2004 | Kosugi et al. |
| 2007/0045631 | A1 | 3/2007 | Endo et al. |
| 2007/0048917 | A1* | 3/2007 | Yamamoto et al. .......... 438/197 |
| 2008/0203441 | A1 | 8/2008 | Endo |

FOREIGN PATENT DOCUMENTS

| | | |
|---|---|---|
| JP | A-10-112460 | 4/1998 |
| JP | A-11-31691 | 2/1999 |
| JP | A-11-031691 | 2/1999 |
| JP | A-2000-252461 | 9/2000 |
| JP | A-2006-269641 | 10/2006 |

OTHER PUBLICATIONS

U.S. Appl. No. 12/071,718, filed Feb. 26, 2008, Endo.
Extended European Search Report dated Jul. 9, 2009 issued from the European Patent Office in corresponding European patent application No. 08003499.4-1235.
J. Senzaki, et al., "Effects of Pyrogenic Reoxidation Annealing on Inversion Channel Mobility of 4H-SiC Metal-Oxide-Semiconductor Field-Effect Transistor Fabricated on (1120) Face," Japanese Journal of Applied Physics, Japan Society of Applied Physics, Nov. 2001, vol. 40, No. 11B, part 2, pp. L1201-L1203.
H. Yano, et al., "High Channel Mobility in Inversion Layers of 4H-SiC MOSFET's by Utilizing (1120) Face," *IEEE Electron Device Letters*, Dec. 1999, IEEE Service Center, vol. 20. No. 12.

(Continued)

*Primary Examiner*—Edward Wojciechowicz
(74) *Attorney, Agent, or Firm*—Posz Law Group, PLC

(57) ABSTRACT

A SiC semiconductor device includes: a SiC substrate having a main surface; a channel region on the substrate; first and second impurity regions on upstream and downstream sides of the channel region, respectively; a gate on the channel region through a gate insulating film. The channel region for flowing current between the first and second impurity regions is controlled by a voltage applied to the gate. An interface between the channel region and the gate insulating film has a hydrogen concentration equal to or greater than $2.6 \times 10^{20}$ $cm^{-3}$. The interface provides a channel surface perpendicular to a (0001)-orientation plane.

49 Claims, 32 Drawing Sheets

OTHER PUBLICATIONS

J. Senzaki, et al., "Significant Improvement of Inversion Channel Mobility in 4H-Sic MOSFET on (1120) Face Using Hydrogen Post-Oxidation Annealing," *Materials Science Forum* (2002), vol. 389-393, pp. 1061-1064.

J. Senzaki, et al., "Excellent Effects of Hydrogen Postoxidation Annealing on Inversion Channel Mobility of 4H-SiC MOSFET Fabricated on (1120) Face" *IEEE Electron Device Letters*, Jan. 2002, IEEE Service Center, vol. 23, No. 1.

* cited by examiner

■D₂(M/z=4) SPECTRUM

■D₂O(M/z=20) SPECTRUM

SIC SEMICONDUCTOR DEVICE AND METHOD FOR MANUFACTURING THE SAME

CROSS REFERENCE TO RELATED APPLICATIONS

This application is based on Japanese Patent Application No. 2007-49703 filed on Feb. 28, 2007, the disclosure of which is incorporated herein by reference. This application is also related to U.S. patent application No. 12/071,718, entitled "SIC SEMICONDUCTOR DEVICE AND METHOD FOR MANUFACTURING THE SAME", filed on. Feb. 26, 2008.

FIELD OF THE INVENTION

The present invention relates to a SiC semiconductor device and a method for manufacturing a SiC semiconductor device.

BACKGROUND OF THE INVENTION

In Patent Documents 1 to 3, a forming method of an MOS interface is disclosed based on test results using a substrate having a (0001) Si plane. The channel mobility of an MOS-FET having a channel formed on the (0001) Si plane thereof however does not become 10 $cm^2$/Vs or greater.

In Patent Document 4, on the other hand, disclosed is a method of increasing the channel mobility in an MOS structure to 30 $cm^2$/Vs or greater by subjecting an SiC semiconductor device using, for a channel, a plane a, that is, a (11-20) plane in the plane orientation of a crystal to hydrogen annealing or treatment in a wet atmosphere. More specifically, the channel mobility is improved by carrying out the hydrogen annealing or treatment in a wet atmosphere at a properly selected concentration or temperature.

[Patent Document 1] Japanese Patent No. 3443589
[Patent Document 2] Japanese Patent No. 3491050
[Patent Document 3] Japanese Patent No. 3525149
[Patent Document 4] Japanese Patent Laid-Open No. 2003-69012 corresponding to U.S. Pat. No. 6,764,963

The channel mobility obtained in the method disclosed in Patent Document 4 is still insufficient and a further improvement in the channel mobility is expected. The improvement in the channel mobility is expected not only when a (11-20) plane is used but also when another plane direction is used.

Thus, it is required for an SiC semiconductor device to improve channel mobility.

SUMMARY OF THE INVENTION

In view of the above-described problem, it is an object of the present disclosure to provide a SiC semiconductor device with high channel mobility in an MOS structure. It is another object of the present disclosure to provide a method for manufacturing a SiC semiconductor device with high channel mobility.

According to a first aspect of the present disclosure, a silicon carbide semiconductor device having an MOS structure includes: a substrate made of silicon carbide and having a main surface; a channel region made of silicon carbide on the substrate, wherein the channel region provides a current path as a channel; a first impurity region disposed on an upstream side of the current path and a second impurity region disposed on a downstream side of the current path; a gate insulating film disposed on a surface of the channel region; and a gate disposed on the gate insulating film. The channel of the channel region for flowing current between the first impurity region and the second impurity region is controlled by a voltage applied to the gate. An interface between the channel region and the gate insulating film has a hydrogen concentration equal to or greater than $2.6 \times 10^{20}$ $cm^{-3}$. The interface provides a channel surface perpendicular to a (0001)-orientation plane.

It is possible to obtain a silicon carbide semiconductor device having high channel mobility by using the substrate made of silicon carbide and having as a main surface a plane vertical to the (0001) Si plane; terminating dangling bonds at the interface between the channel region and the gate insulating film with H or OH; and controlling a hydrogen concentration at the interface to as high as $2.6 \times 10^{20}$ $cm^{-3}$ or greater.

According to a second aspect of the present disclosure, a method for manufacturing a silicon carbide semiconductor device having an MOS structure includes: preparing a substrate made of silicon carbide and having a main surface; forming a channel region made of silicon carbide on the substrate, wherein the channel region provides a current path as a channel; forming a first impurity region on an upstream side of the current path and a second impurity region on a downstream side of the current path; forming a gate insulating film on a surface of the channel region; forming a gate on the gate insulating film; and performing a heat treatment. The channel of the channel region for flowing current between the first impurity region and the second impurity region is controlled by a voltage applied to the gate. The performing the heat treatment includes: reducing temperature in a range between 800° C. and 900° C.; and maintaining a wet atmosphere or a hydrogen atmosphere continuously in the reducing the temperature. The interface provides a channel surface perpendicular to a (0001)-orientation plane.

Thus, at the time of the temperature reduction in the heat treatment step, the temperature is reduced to the termination-desorption temperature or less while continuously maintaining the wet atmosphere or hydrogen atmosphere in a temperature range of from 800 to 900° C., which is a termination-desorption temperature. This enables termination of the dangling bonds at the interface between the gate insulating film and the channel region with H or OH elements, thereby making it possible to obtain a silicon carbide semiconductor device having higher channel mobility.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

Figure 1:
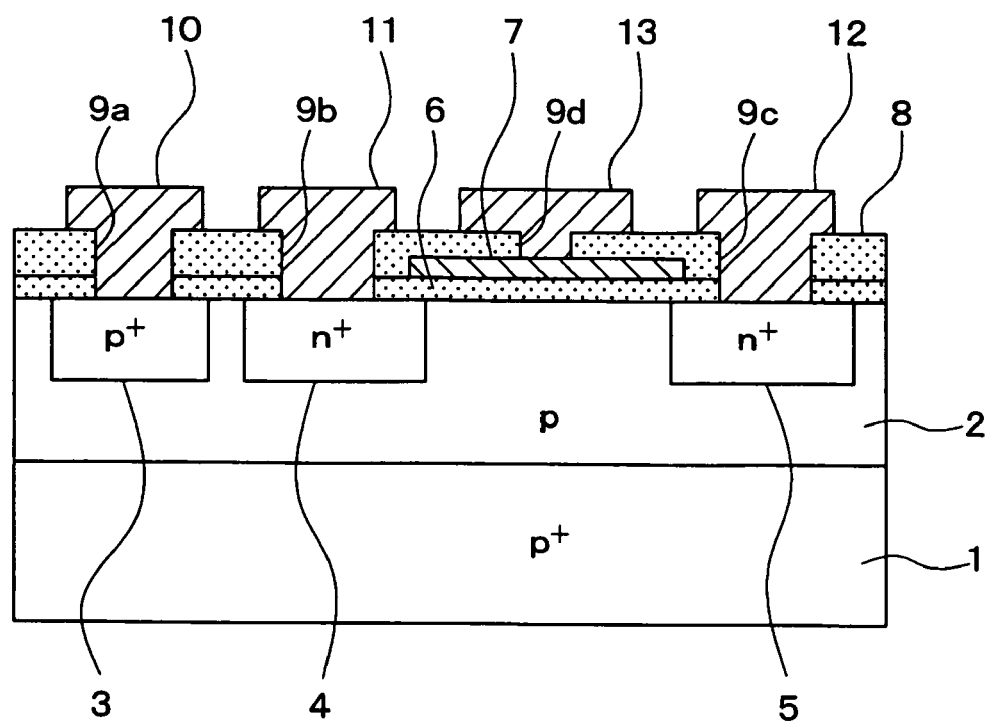
FIG. 1 shows a cross-sectional constitution of an inversion mode lateral MOSFET according to a first embodiment.

In order to accomplish a SiC semiconductor device having high channel mobility, the present inventors have carried out an investigation on the channel mobility when a gate oxide film formed in a wet atmosphere is subjected to wet annealing or hydrogen annealing. As a result, it has been confirmed that sufficient channel mobility cannot be attained only by forming the gate oxide film at a predetermined concentration or predetermined temperature in a wet atmosphere or by carrying out hydrogen annealing at a predetermined concentration or predetermined temperature.

For improving the channel density, it is effective to reduce an interface state density at an interface between SiC and the gate oxide film in a MOS structure. One of the methods to reduce the interface state density is to terminate dangling bonds at the interface between SiC and the gate oxide film by an element of H or OH. More specifically, channel mobility can be improved by fixing elements H or OH to stay in a defective portion of the lower layer portion of the gate oxide film contiguous to SiC.

The present inventors have carried out an extensive investigation with a view to realizing such a structure. As a result, it has been confirmed that since dangling bonds at the interface between SiC and the gate oxide film are terminated with H or OH at a certain temperature, in other words, a desorption temperature (which will hereinafter be called "termination-desorption temperature"), what is important for realizing the above-described structure is whether an atmosphere allows desorption of H or OH at this termination-desorption temperature or not.

Described specifically, termination or desorption of H or OH occurs at the termination-desorption temperature so that at this temperature, desorption occurs when the condition permits desorption preferentially to termination, while desorption can be prevented when the condition permits termination preferentially to desorption.

Even when gate oxidation is performed in a wet atmosphere, desorption of H or OH from dangling bonds occurs when the atmosphere is not a wet atmosphere at the termination-desorption temperature. This means that the above structure cannot be realized. Even when hydrogen annealing is performed, desorption of H or OH occurs unless the atmosphere is always a hydrogen atmosphere at temperatures exceeding the termination-desorption temperature. This also means that the above structure cannot be realized.

Therefore, the present inventors manufactured an inversion mode lateral MOSFET having a channel length of 10 μm and a channel width of 70 μm on an SiC substrate having, as a main surface thereof, a plane a, that is, a (11-20) plane by using a conventional method and an investigation method in which, at the time of temperature reduction when a gate oxide film was formed by wet oxidation, a wet atmosphere was maintained until the temperature decreased to a termination-desorption temperature or less; and investigated its electric field effect channel mobility (which will hereinafter be called "channel mobility") and magnitude of a drain current relative to a gate voltage.

Described specifically, according to the conventional method, an MOSFET was manufactured by forming a gate oxide film by wet oxidation at 1080° C. for 80 minutes, switching the atmosphere from wet to $N_2$, and then reducing the temperature to 600° C. at 10° C./min and its channel mobility and the like were studied. On the other hand, according to the investigation method, an MOSFET was manufactured by forming a gate oxide film by wet oxidation similar to that in the conventional method and, at the time of temperature reduction in its gate oxide film formation step, reducing the temperature to 600° C. at 10° C./min while keeping the wet atmosphere and its channel mobility and the like were studied. The results of these MOSFETs are shown in FIGS. 25A to 25B.

Figure 25A:
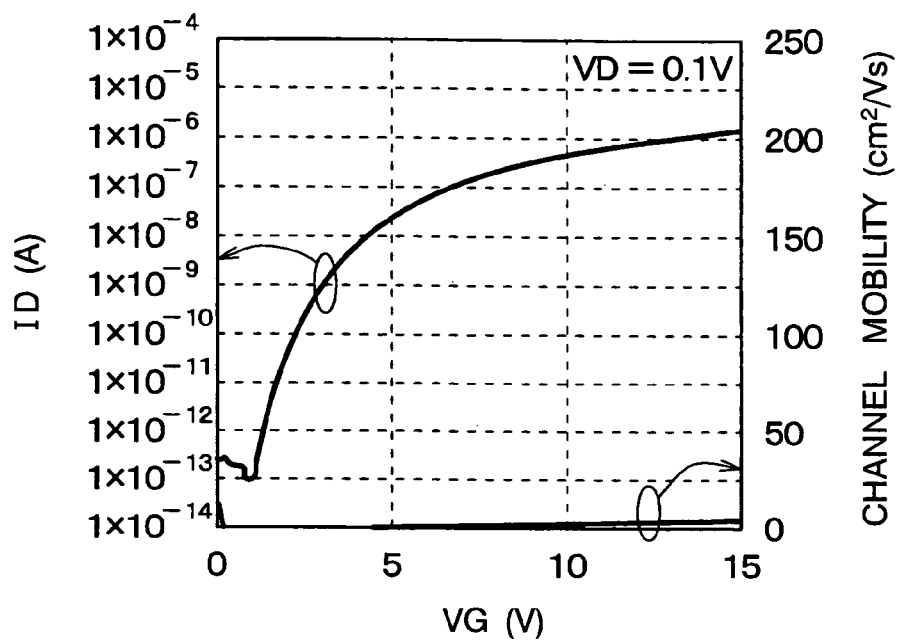
FIGS. 25A and 25B show the investigation results of the relationship between channel mobility and magnitude of a drain current relative to gate voltage.

As illustrated in FIG. 25A, the MOSFET manufactured using the conventional method had very small channel mobility, suggesting that sufficient channel mobility cannot be obtained only by forming the gate oxide film in a wet atmosphere.

Figure 25B:
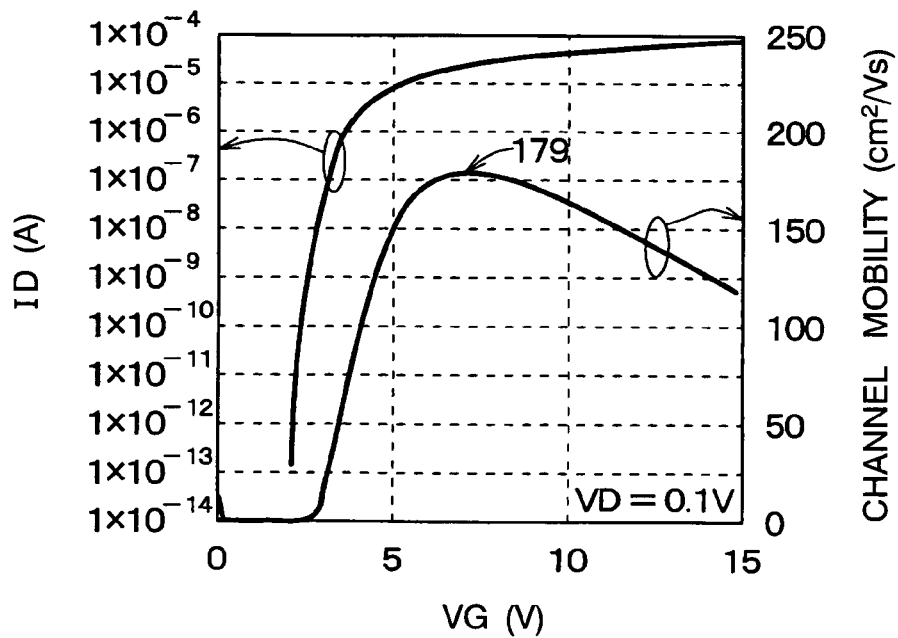

As illustrated in FIG. 25B, the MOSFET manufactured using the investigation method had, on the other hand, high channel mobility and large drain current. It is presumed that by maintaining the wet atmosphere at the time of temperature reduction to 600° C. which is supposed to be not greater than the termination-desorption temperature, occurrence of the desorption of H or OH from dangling bonds preferential to termination can be prevented, whereby the desorption can be prevented.

In the above-described test, the wet atmosphere is maintained until the temperature decreases to 600° C. at the time of temperature reduction in the gate oxide film formation step and it is then switched to a nitrogen atmosphere based on the following test results.

Figure 26A:
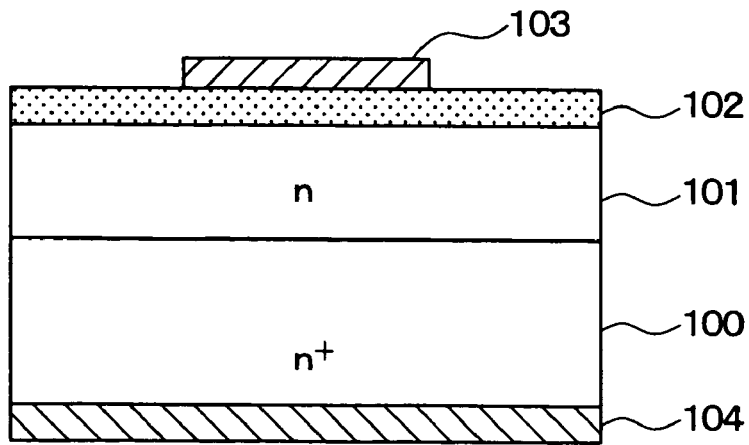
FIG. 26A is a cross-sectional view of an MOS capacitor as a sample used in a test.
Figure 26B:
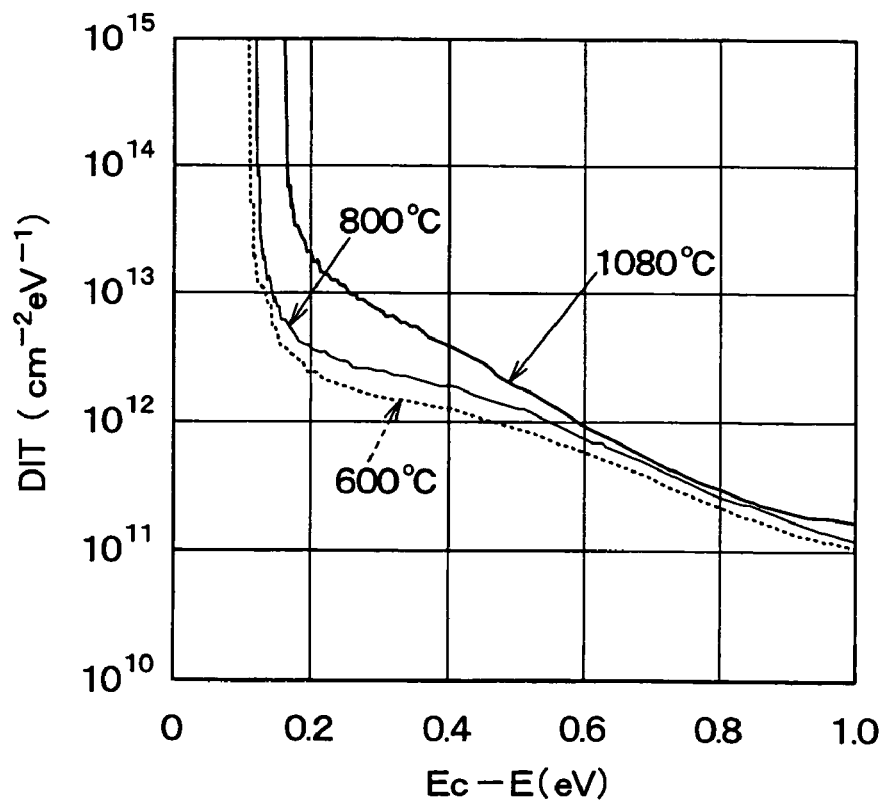
FIG. 26B is a graph showing the relationship between an atmosphere switching temperature and interface state density.

FIG. 26A is a cross-sectional view of an MOS capacitor used as a sample in the test, while FIG. 26B shows the relation between a switching temperature of an atmosphere and an interface state density.

As illustrated in FIG. 26A, an n type epitaxial layer 101 having an impurity concentration adjusted to $1 \times 10^{16}$ cm$^{-3}$ was formed on an n$^+$ type layer 100. A gate oxide film 102 was formed on a substrate having, as a surface thereof, a plane a by gate oxidation thereof. The gate oxidation was performed by raising the temperature to 1080° C. in a nitrogen atmosphere, carrying out wet oxidation for 80 minutes in an atmosphere switched to wet one, and then reducing the temperature at 10° C./min without switching the wet atmosphere. At this time, the switching temperature from the wet atmosphere to the nitrogen atmosphere was switched to 1080° C., 800° C. and 600° C. An MOS capacitor was constructed by depositing Ni 103 and Ni 104 having a thickness of 500 nm on the surface and backside surface, respectively and then, patterning Ni to φ 500 μm.

The interface state density ($D_{it}$) of each of the MOS capacitors manufactured while changing the switching temperature was then evaluated. As a result, it has been confirmed that as illustrated in FIG. 26B, the interface state density decreases by reducing the switching temperature from the wet atmosphere to the nitrogen atmosphere at the time of temperature reduction.

Figure 27:
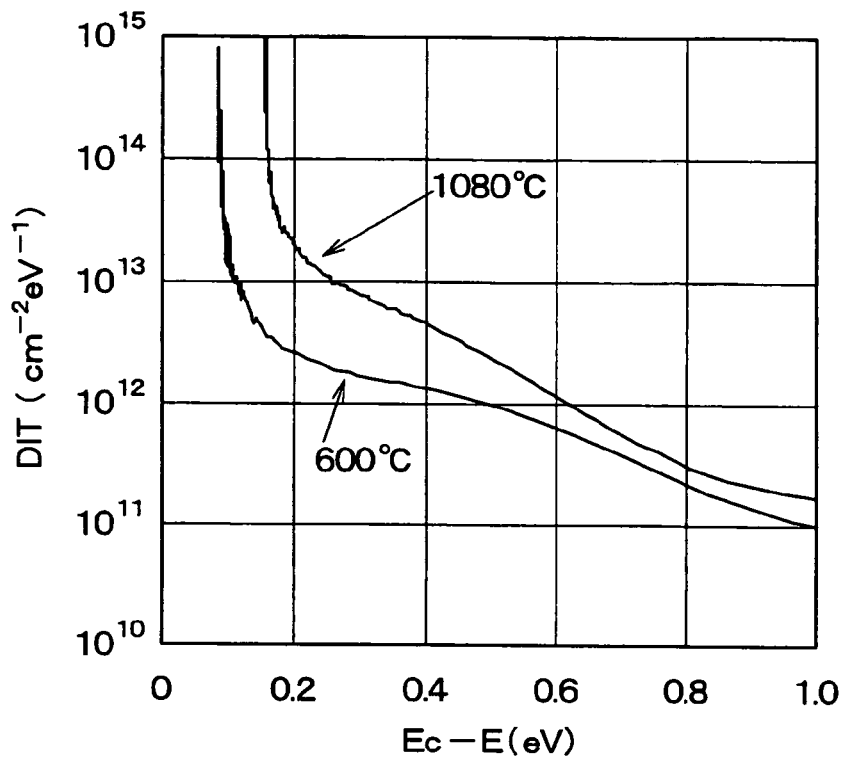
FIG. 27 illustrates the relationship between an atmosphere switching temperature and interface state density.

In order to study the relationship between the switching temperature of the atmosphere and the interface state density when similar to the (11-20) plane, a (1-100) plane vertical to the (0001) Si plane was used, an MOS capacitor having a similar structure to that of FIG. 26A was manufactured using a substrate having a (1-100) plane as a surface thereof. FIG. 27 shows the relationship between the switching temperature of the atmosphere and the interface state density.

As illustrated in FIG. 27, it has been confirmed by the evaluation of the interface state density ($D_{it}$) that when the (1-100) plane is employed, the interface state density also decreases by reducing the switching temperature of the atmosphere from wet to nitrogen at the time of temperature reduction.

It is apparent from these test results that the interface state density can be reduced depending on the switching temperature of the atmosphere from wet to nitrogen, and this leads to an improvement in channel mobility. In the above-described method, the wet atmosphere is therefore maintained until the temperature decreases to 600° C. at the time of temperature reduction in the gate oxidation film formation step and then, it is switched to the nitrogen atmosphere.

Figure 28C:
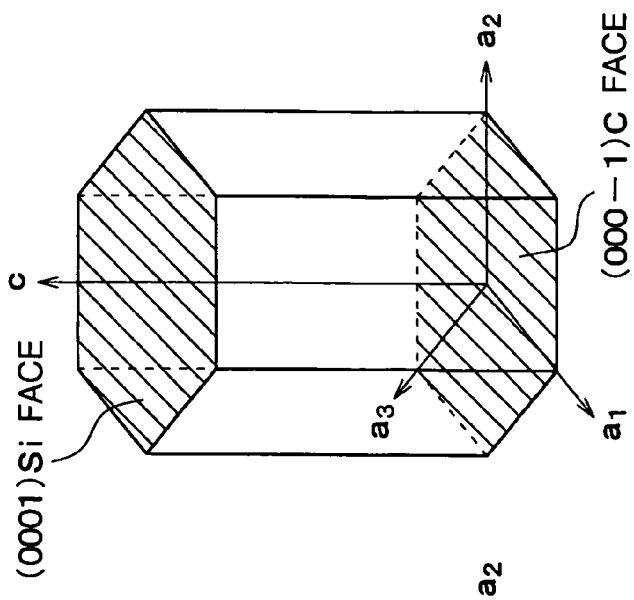
FIGS. 28A to 28C are schematic views of a crystal plane illustrating the relationship between the crystal structure of hexagonal SiC and plane orientation of the crystal, that is, a (11-20) plane, (1-100) plane, (0001) Si plane and (000-1) C plane.
Figure 28B:
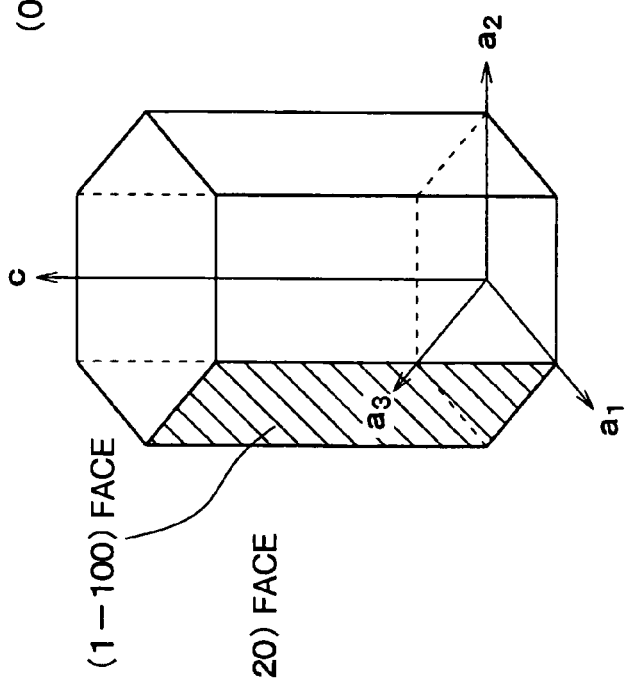
Figure 28A:
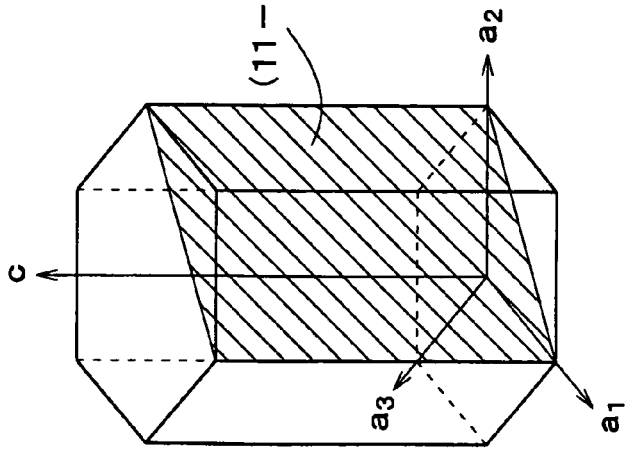

FIGS. 28A to 28C are schematic views of crystal planes showing the relationship between the crystal structure of hexagonal SiC and plane orientations of the crystal, that is, (11-20) plane, (1-100) plane, (0001) Si plane and (000-1) C plane. As illustrated in FIG. 28C, the upper surface and bottom surface of the hexagonal crystal correspond to a (0001) Si plane and a (0001) C plane, respectively, and a (11-20) plane and a (1-100) plane are vertical thereto. A number of planes other than (11-20) plane and (1-100) plane are vertical to the (0001) Si plane or (000-1) C plane and any plane is presumed to provide similar characteristics because a difference in an area density between Si atoms and C atoms is as small as approximately 15% at the maximum.

Figure 29A:
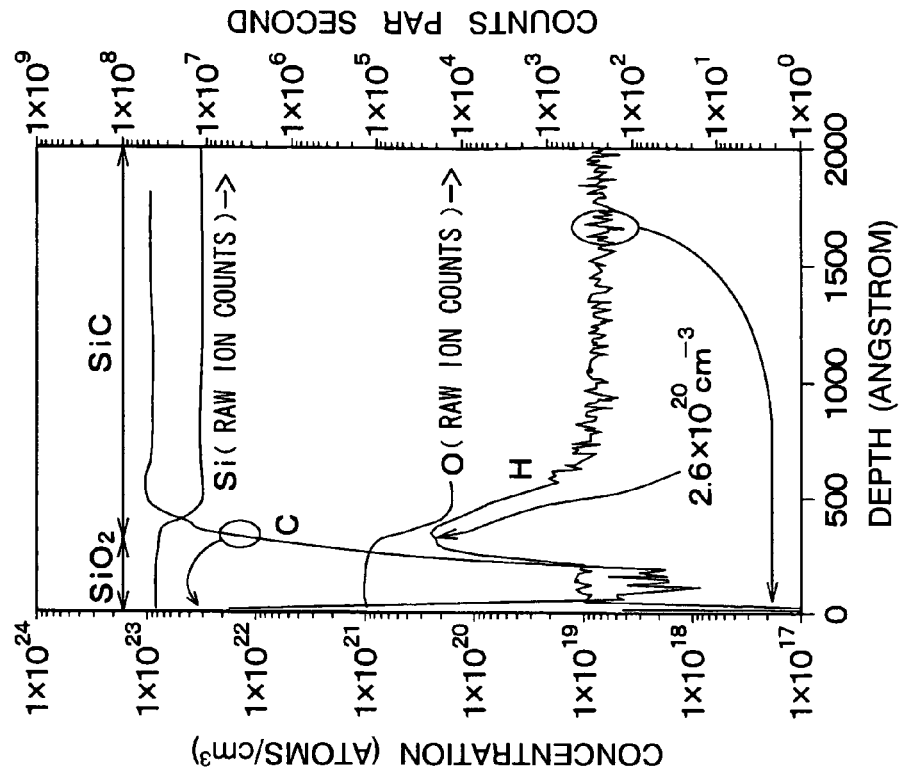
FIGS. 29A and FIG. 29B show a hydrogen concentration in the vicinity of the interface between SiC and gate oxide film ($SiO_2$) in the MOSFETs manufactured by the conventional method and the method to be investigated, respectively.
Figure 29B:
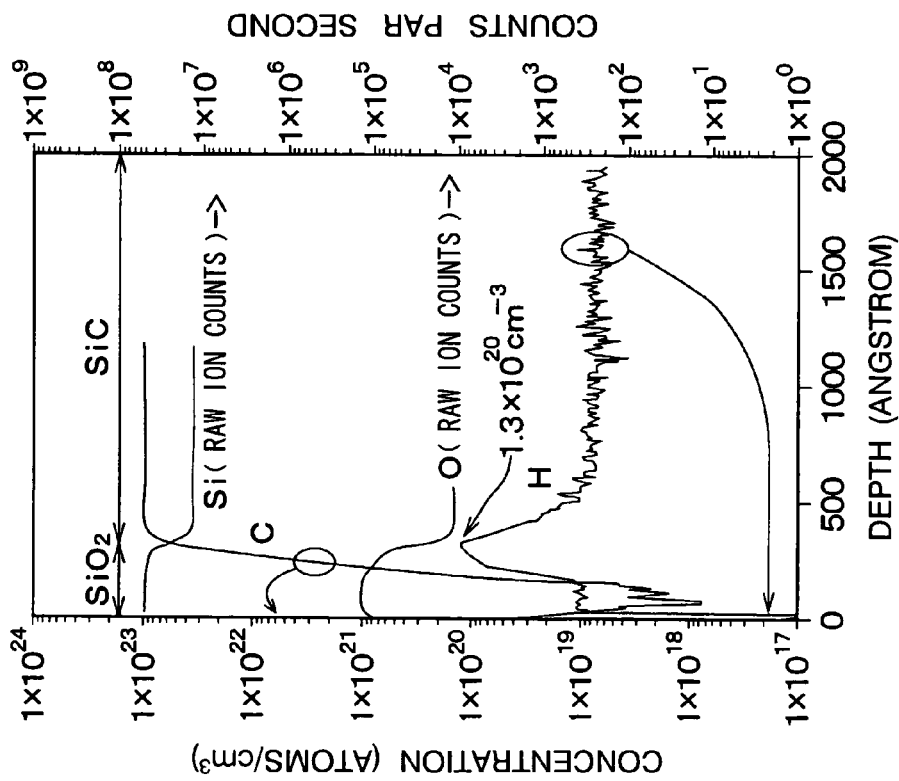

In order to examine the termination effect of dangling bonds with H or OH by the above-described test, a hydrogen concentration at the interface when the (11-20) plane was employed was compared by SIMS analysis. FIGS. 29A and 29B illustrate hydrogen concentrations in the vicinity of the interface between SiC and gate oxide film (SiO$_2$) in MOSFETs manufactured by the conventional method and the investigation method, respectively.

When a hydrogen concentration at the interface between SiC and gate insulating film is compared, it is apparent from these graphs that the hydrogen concentration is approximately $1.3 \times 10^{20}$ cm$^{-3}$ in the conventional method, while it is approximately $2.6 \times 10^{20}$ cm$^{-3}$ in the investigation method, approximately twice the hydrogenation concentration of the conventional method. This suggests that employment of the investigation method enables termination of dangling bonds with an element H or OH compared with the conventional method. A hydrogen concentration is high at the interface, which means termination of dangling bonds with an element H or OH leads to an improvement of the channel mobility. Similarly, SIMS analysis of a hydrogen concentration at the interface when the (1-100) plane was used was also performed. In this case, it is also confirmed that a hydrogen concentration at the interface is higher in the investigation method than in the conventional method.

Thus, the dangling bonds at the interface between SiC and the gate oxide film can be terminated with H or OH by continuing the wet atmosphere at least until the temperature becomes the termination-desorption temperature or less at the time of temperature reduction in forming the gate oxide film.

From a viewpoint similar to such a finding, it may be possible to form the gate oxide film in advance by a method different from wet oxidation using a wet atmosphere and switch the atmosphere to a wet one only at the time of temperature reduction, thereby terminating the dangling bonds at the interface between SiC and the gate oxide film with H or OH at the time of temperature reduction.

The gate oxide film is formed, for example, by oxidizing the substrate in a dry atmosphere, an $N_2O$ atmosphere, an NO atmosphere, an ozone atmosphere or an $H_2O$ radical atmosphere or depositing LTO, TEOS or HTO by CVD. The temperature in a chamber for forming the gate oxide film is high so that it is only necessary to switch the atmosphere to wet one by introducing $H_2O$ into the chamber, and then reduce the temperature to the termination-desorption temperature or less.

The description was made of the case where the gate insulating film was made of an oxide film. When this method is employed, the gate insulating film may be made of another insulating film. Examples of it include $HfO_2$, HfSiON, HfAlO, $Al_2O_3$, $Ta_2O_5$, and $Si_3N_4$.

Similarly, dangling bonds at the interface between SiC and gate insulating film are terminated with H or OH not at the time of temperature reduction during formation of the gate oxide film (gate insulating film) but by an annealing step after the gate oxide film formation step. If these methods are employed in combination, a larger number of dangling bonds at the interface between SiC and gate oxide film can be terminated with H or OH, leading to a further improvement of the channel mobility.

Next, with a view to analyzing the above-described termination-desorption temperature, a gate oxide film was formed as described above on a substrate having a (11-20) plane as a main surface by maintaining the wet atmosphere until the time of temperature reduction in the gate oxide film formation step and then annealing the substrate at various temperatures in an Ar atmosphere not causing termination of dangling bonds with H or OH. The test results are shown in FIG. 30.

Figure 30:
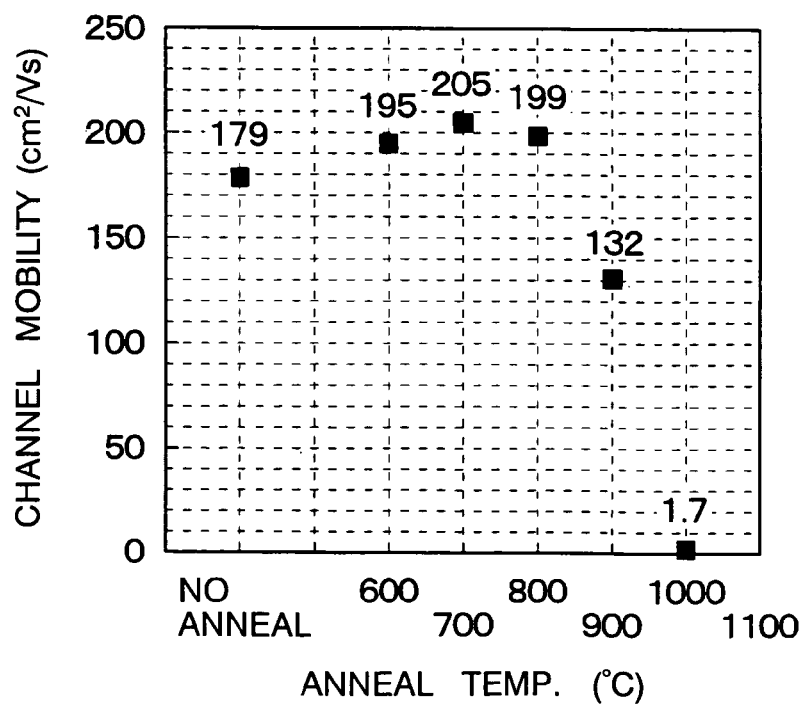
FIG. 30 illustrates the relationship between annealing temperature and channel mobility.

FIG. 30 shows the relationship between annealing temperature and channel mobility of an MOSFET having a structure used in the test of FIGS. 25A and 25B. The relationship in the case where no annealing was performed is also included as a reference in the graph.

As shown in this graph, when no annealing is performed, channel mobility becomes as high as 179 $cm^2/Vs$.

When the annealing step is performed, on the other hand, the channel mobility becomes higher at an annealing temperature of from 600 to 700° C., compared with that when no annealing is performed. The channel mobility reaches 205 $cm^2/Vs$ at 700° C. When the annealing temperature is increased to 800° C., the channel mobility becomes 199 $cm^2/Vs$. Thus, the channel mobility starts decreasing. As the annealing temperature is higher than 800° C., the channel mobility drastically decreases. It is understood that when the annealing temperature is increased to 1000° C., the channel mobility reaches a value close to zero.

It can be confirmed from the results that desorption of H or OH mainly occurs at 800 to 900° C. and it is accelerated at a temperature exceeding it. The termination of dangling bonds with H or OH occurs in a temperature range similar to that of desorption so that the termination-desorption temperature is presumed to be mainly 800 to 900° C. It can also be confirmed that until the annealing at 800° C., the channel mobility of a sample subjected to annealing is higher than that of a sample not subjected to annealing. Accordingly, annealing at 800° C. or less, preferably 700° C. or less after formation of the gate oxide film contributes to a further improvement of the channel mobility. A similar test was made by using a substrate having a (1-100) plane as a main surface. Similar to the above test results, a drastic reduction in the channel mobility occurred at from 800 to 900° C., suggesting that desorption of H or OH occurred at from 800 to 900° C. It has also been confirmed that annealing at 800° C. or less, more preferably 700° C. or less after formation of the gate oxide film improves channel mobility further.

Further, a thermal desorption analysis was made to determine the termination-desorption temperature in detail. Described specifically, the temperature of a substrate having a gate oxide film formed thereon is raised by laser heating in a vacuum chamber and a desorbed element is analyzed by a mass spectrometer. This enables determination of the desorption gas and desorption temperature in detail.

Existence of a large amount of hydrogen in the air however makes it difficult to discriminate it from trace hydrogen at the interface of MOS. Deuterium (D), an isotope of hydrogen present in only a trace amount in the air was used as a termination element of dangling bonds and the deuterium was analyzed. Since deuterium is an isotope of hydrogen, they are presumed to have similar properties relating to termination and desorption.

A preparation process of an analysis sample will next be described. First, an n type 4H—SiC substrate having a (11-20) plane as a main surface thereof used as a substrate is subjected to wet oxidation by bubbling heavy water ($D_2O$) in accordance with a bubbling oxidation method, whereby a gate oxide film is formed. The gate oxide film is formed in accordance with a similar recipe to that shown in FIG. 4 except for use of $D_2O$ instead of $H_2O$. The thermal desorption analysis of this sample is performed using $D_2$ and $D_2O$ as analyzing elements. The analysis is performed supposing that $D_2$ is formed by bonding of desorbed D, while $D_2O$ is formed by bonding of desorbed OD and D and $D_2O$ is present in water in the insulating film.

Figure 31A:
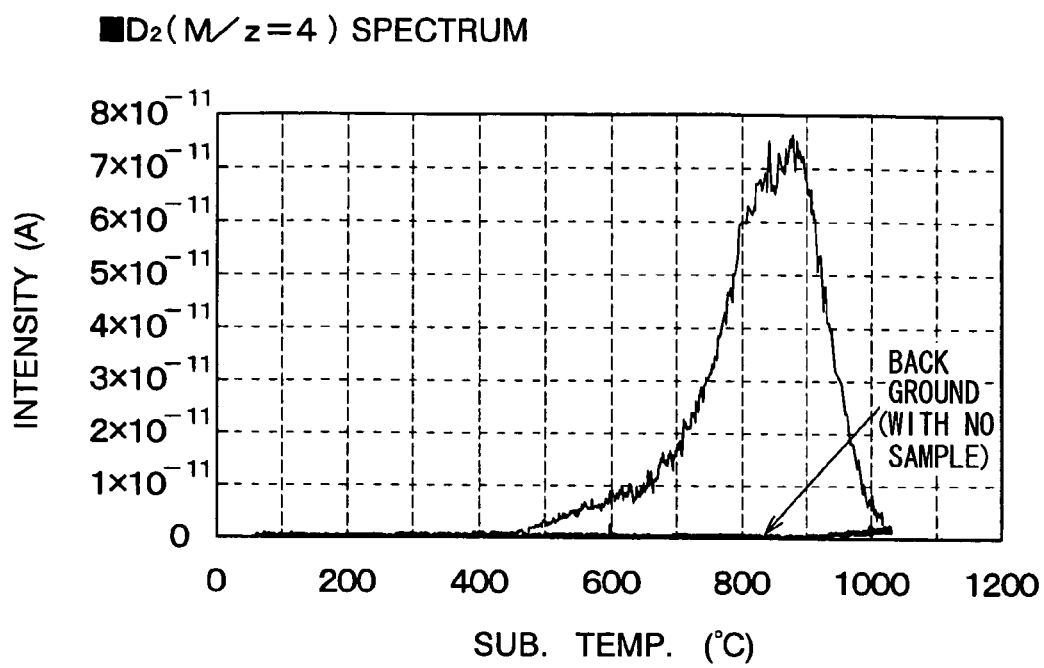
FIG. 31A shows the analysis results, by thermal desorption analysis, of the desorption temperature of deuterium.
Figure 31B:
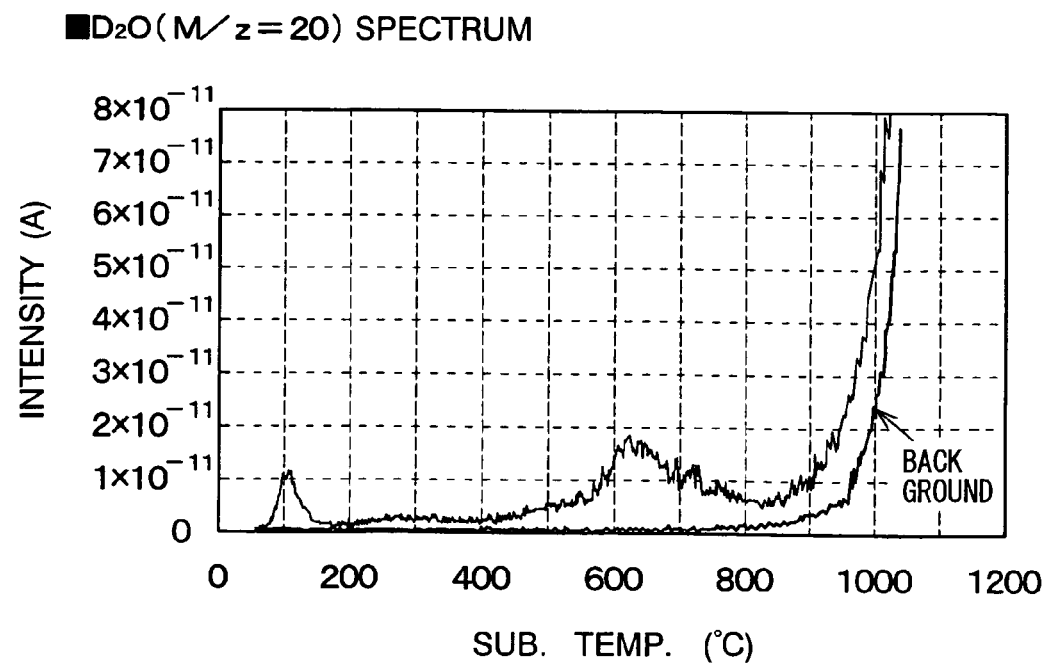
FIG. 31B is a graph showing the analysis results, by thermal desorption analysis, of the desorption temperature of heavy water.

FIG. 31A is a graph showing the analysis results of $D_2$, while FIG. 31B is a graph showing the analysis results of $D_2O$. In these graphs, a current intensity of the mass spectrometer is plotted along the ordinate. The graph plotted as a background in these drawings shows the results of analysis without a sample. A difference obtained by subtracting a background mass from the graph of the analysis result of $D_2$ or $D_2O$ corresponds to a pure analysis mass of $D_2$ or $D_2O$.

As shown in FIG. 31A, desorption of $D_2$ occurs at from 700° C. to 1000° C. and particularly, a desorption peak appears at from 800° C. to 900° C., which shows good coincidence with a temperature at which channel mobility deteriorates. It is therefore possible to determine that the H - or OH - termination-desorption temperature of the dangling bonds is from 700° C. to 1000° C., especially from 800° C. to 900° C. As illustrated in FIG. 31B, on the other hand, desorption of $D_2O$ occurs at from 600° C. to 800° C. and particularly, a desorption peak appears at from 600° C. to 700° C. This corresponds to the occurrence of an improvement of channel mobility until annealing at 700° C. or less or 800° C. or less. Termination elements for dangling bonds contributing to an improvement in the channel mobility are therefore presumed to be mainly hydrogen. Further, annealing for removing moisture from the gate insulating film is presumed to contribute also to the improvement in the channel mobility.

Similar tests were performed on a substrate having a (1-100) plane as a main surface. As a result, the desorption temperature of $D_2$ was, similar to that when a substrate having a (11-20) plane was used, from 700 to 1000° C., especially from 800 to 900° C.

Figure 32:
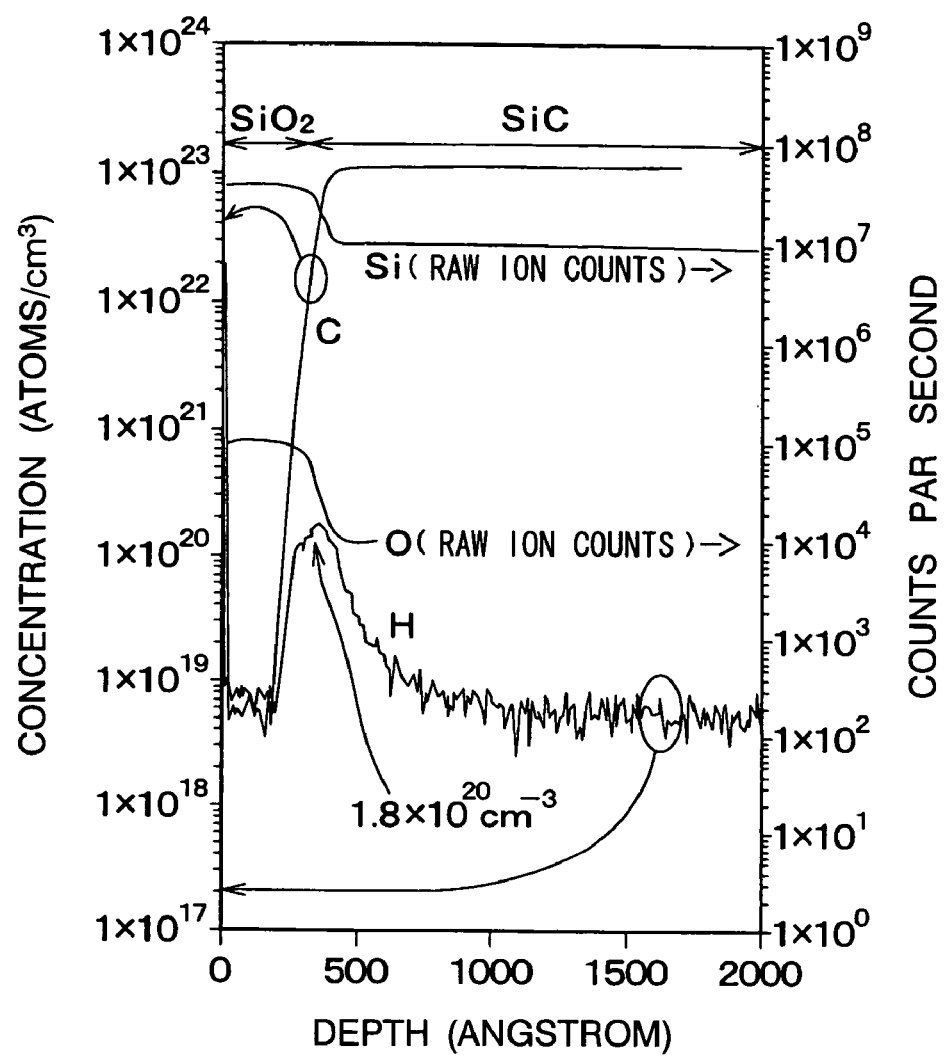
FIG. 32 shows the investigation results of a hydrogen concentration when an annealing step is performed at 1000° C. for 10 minutes.

FIG. 32 shows investigation results of a hydrogen concentration when Ar annealing of the sample analyzed in FIG. 29B was performed for 10 minutes at an annealing temperature of 1000° C. As illustrated in the graph, the hydrogen concentration at the interface between SiC and the gate oxide film becomes smaller than that shown in FIG. 29B. Desorption of H or OH from the dangling bonds at the interface between SiC and the gate oxide film can be confirmed.

These results suggest that in order to carry out an annealing step capable of causing termination with H or OH preferentially to desorption, it may be necessary to adjust the annealing temperature to the termination-desorption temperature or greater, employ an atmosphere capable of terminating the dangling bonds with H or OH at the termination-desorption temperature or greater, and maintain this atmosphere until the temperature decreases to the termination-desorption temperature or less at the time of temperature reduction in the annealing step.

Accordingly, it is necessary to carry out the annealing step at an annealing temperature of 800° C. or greater and continuously maintain the atmosphere under which dangling bonds can always be terminated with H or OH when the temperature becomes 800° C. or greater (preferably 700° C. or greater).

The above-described termination-desorption temperature can also be applied to that at the time of temperature reduction in the gate oxide film formation step. Described specifically, it is possible to keep the terminated state of dangling bonds, at the interface between SiC and gate oxide film, with H or OH even after the gate oxide film formation step if the wet atmosphere is maintained during the term of temperature reduction starting from 800 to 900° C., preferably from 1000° C. till 700° C. or less.

Since the termination effect of dangling bonds with H or OH was high at from 800 to 900° C. as described above, the annealing effect in this temperature range was examined.

Figure 33A:
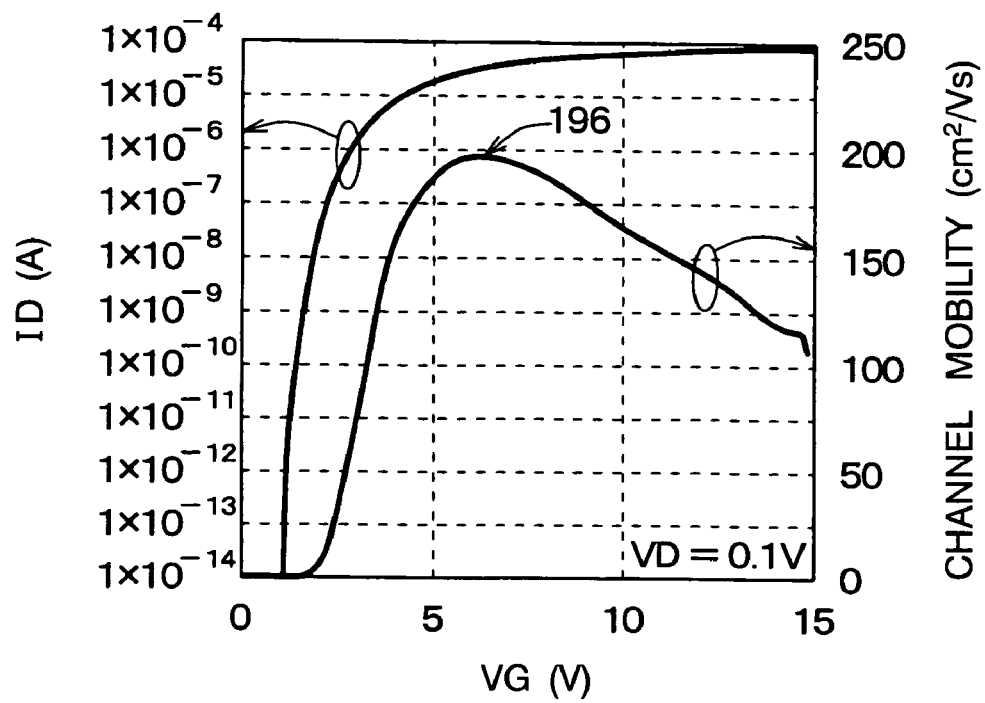
FIGS. 33A and 33B show the investigation results of the relationship between channel mobility and magnitude of drain current relative to gate voltage.
Figure 33B:
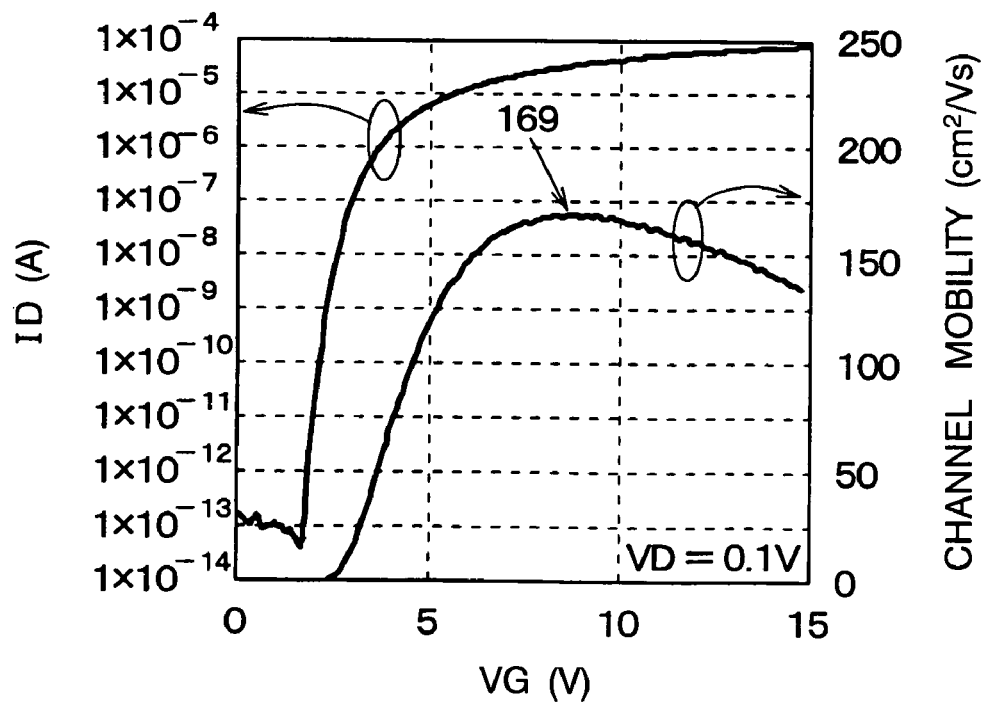

Described specifically, an MOSFET having a similar structure to that used in the test of FIGS. 25A and 25B was manufactured and it was examined. In manufacturing the MOSFET having a structure used in the test of FIGS. 25A and 25B, a gate oxide film was formed by maintaining a wet atmosphere until the temperature becomes the termination-desorption temperature; a polysilicon film doped with an n type impurity was formed on the resulting gate oxide film; the polysilicon film was then patterned to form a gate electrode; and then annealing step was performed in the wet atmosphere. The annealing step was performed for 120 minutes while adjusting the temperature at the time of starting or terminating annealing at 600° C., increasing or decreasing the temperature at a temperature gradient of 10° C./min and setting the maximum temperature at 850° C. This wet annealing step also serves as a round-off oxidation step of polysilicon constituting the gate. The channel mobility and magnitude of a drain current of the MOSFET thus obtained were studied relative to a gate voltage. FIGS. 33A and 33B show the results of them. FIG. 33A is a graph showing the results when the (11-20) plane was used, while FIG. 33B is a graph showing the results when the (1-100) plane was used.

As is apparent from FIG. 33A, the channel mobility becomes 196 cm$^2$/Vs when the (11-20) plane is used. Namely, first, the channel mobility can be improved by forming the gate oxide film by continuously maintaining the wet atmosphere until the temperature becomes the termination-desorption temperature. Further, the high channel mobility can be maintained by annealing in the wet atmosphere. Thus the channel mobility can be improved synergistically. Similarly, the channel mobility becomes 169 cm$^2$/Vs when the (1-100) plane is used. Also in this case, high channel mobility can be kept and the channel mobility can be improved synergistically.

In particular, when the interface between SiC and the gate oxide film is covered with a gate electrode as is after formation of the gate electrode, the thickness of a layer covering the interface increases and the gate electrode seems to play a role as a cap layer. Therefore, when annealing is performed under a situation permitting the termination of dangling bonds with H or OH preferentially to the desorption, the dangling bonds can be terminated with H or OH while preventing desorption of H or OH by the cap layer, which is likely to enhance the channel mobility further. In particular, when the gate electrode is made of polysilicon, hydrogen generated by an oxidizing reaction in the wet atmosphere contributes to the termination of dangling bonds, which is likely to enhance the channel mobility further.

Figure 34:
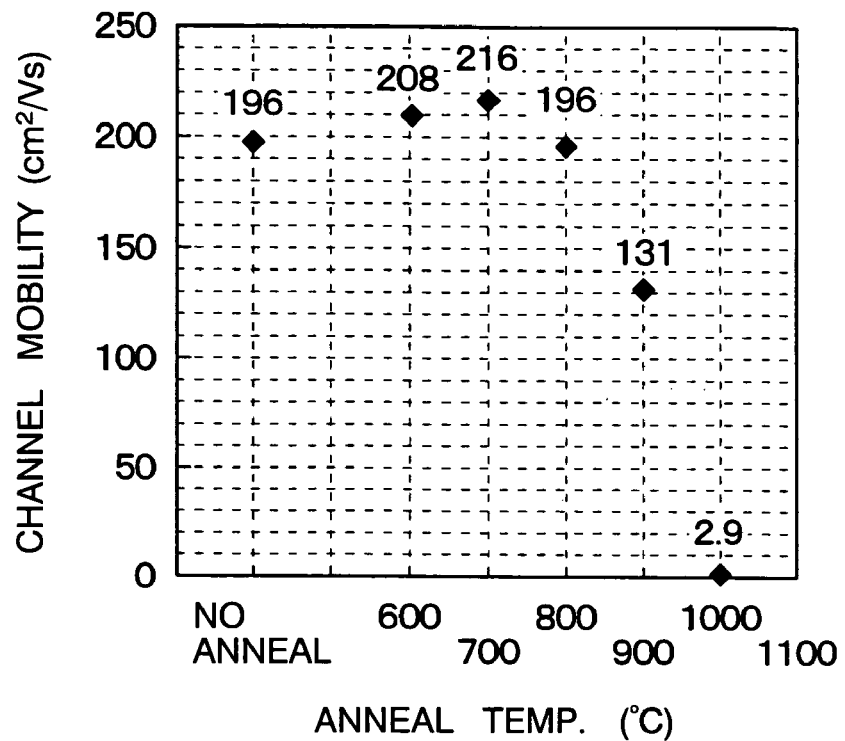
FIG. 34 is a graph showing the investigation results of annealing temperature dependence of channel mobility.

In addition, annealing temperature dependence of the channel mobility of the MOSFET subjected to round-off oxidation as the above-described wet annealing treatment was studied in an Ar atmosphere as in FIG. 30. FIG. 34 is a graph showing the results when a (11-20) plane was employed. It is apparent from the graph that the channel mobility continues to show an improvement until the temperature of 700° C. and it reaches its maximum, that is, 216 cm$^2$/Vs at 700° C. The channel mobility becomes 196 cm$^2$/Vs at an annealing temperature of 800° C. and the channel mobility starts decreasing. As the annealing temperature becomes higher than this temperature, the channel mobility drastically decreases. At an annealing temperature of 1000° C., the channel mobility reaches close to zero. The H— or OH— termination-desorption temperature of dangling bonds determined from these results is from 700 to 1000° C., especially from 800 to 900° C. It can also be confirmed that moisture removing annealing at 800° C. or less, preferably 700° C. or less is effective for improving the channel mobility.

Figure 35:
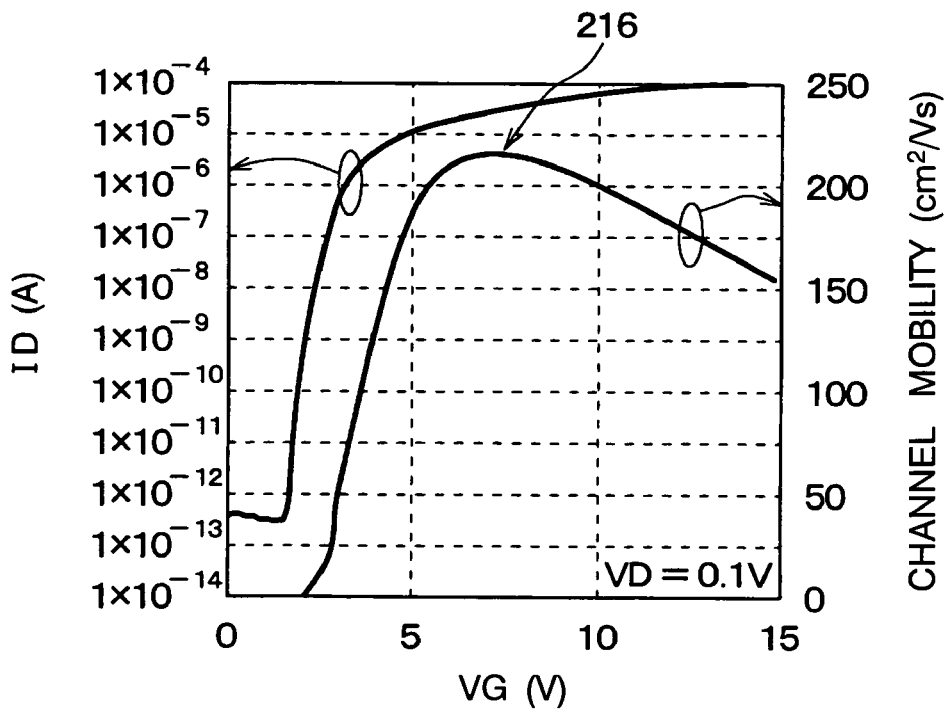
FIG. 35 illustrates the investigation results of channel mobility and magnitude of drain current relative to gate voltage in the MOSFET subjected to Ar annealing at 700° C.

FIG. 35 illustrates the investigation results of channel mobility and magnitude of drain current relative to gate voltage with respect to an MOSFET using a substrate having a (11-20) plane as a main surface and subjected to both round-off oxidation to be performed as wet annealing treatment and Ar annealing at 700° C. It has channel mobility of 216 cm$^2$/Vs.

Temperature dependence of annealing (wet annealing) in the wet atmosphere was studied in order to realize higher channel mobility. Concretely, a lateral MOSFET was manufactured in the following manner and its temperature dependence was studied.

In the gate insulating film formation step, after formation of a TEOS film having a thickness of 100 nm at 680° C. by using an LPCVD device, wet annealing was performed. In the wet annealing, the temperature was raised from 600° C. at 10° C./min in the wet atmosphere. After keeping the wet annealing temperature for 10 minutes, the temperature was decreased at 10° C./min to 600° C. without switching the wet atmosphere. The wet annealing temperature was set to seven levels of 1080° C., 1000° C., 950° C., 900° C., 850° C., 800° C., and 750° C. In addition, round-off oxidation at 850° C. was conducted as the above-described wet annealing treatment at all of those levels in order to heighten the channel mobility.

Figure 36:
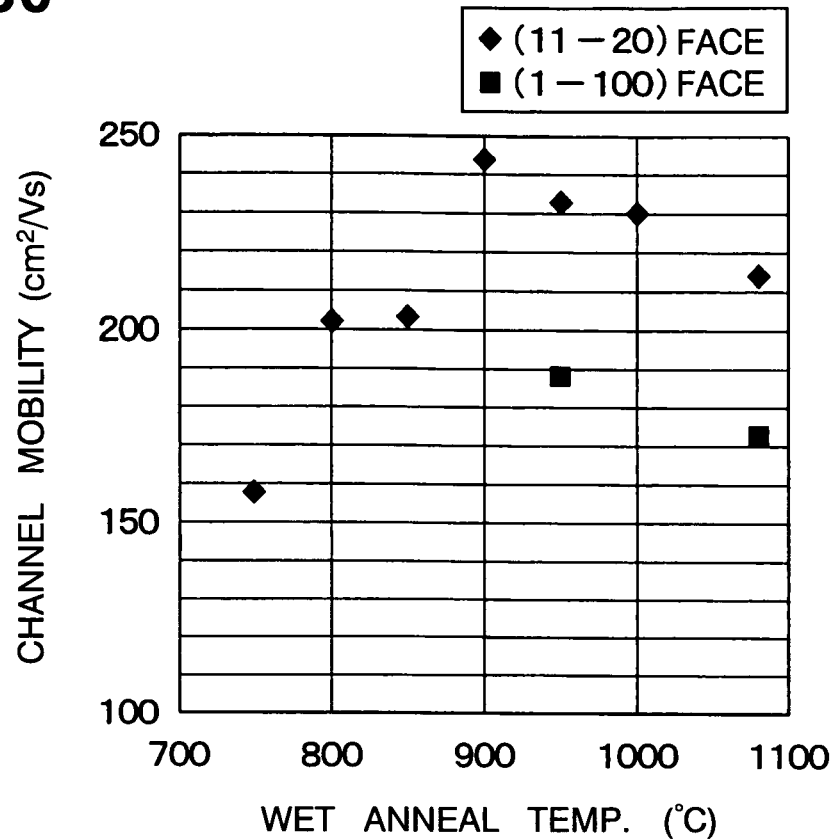
FIG. 36 illustrates the evaluation results of channel mobility of a lateral MOSFET.

FIG. 36 shows the evaluation results of the channel mobility of the lateral MOSFET manufactured as described above. As is apparent from the graph, the MOSFET using a (11-20) plane has high channel mobility exceeding 200 $cm^2$/Vs. at 800° C. or greater and in spite of a little decreasing tendency of channel mobility at wet annealing temperature of 900° C. or greater, wet annealing (or annealing in a hydrogen atmosphere) is highly effective. These results also suggest that the termination-desorption temperature is from 700 to 1000° C. (especially from 800 to 900° C.) and wet annealing (or annealing in a hydrogen atmosphere) at 900° C. or greater, at least 800° C. or greater is effective. The above-described test was performed on an MOSFET using a (1-100) plane at two levels of 1080° C. and 950° C. It showed a similar tendency to that of the MOSFET having a (11-20) plane. From this result, it can be presumed that also the MOSFET using a (1-100) plane can have high channel mobility when the annealing temperature is set at 900° C. or greater. Accordingly, a device using a plane vertical to a (0001) Si plane can have high channel mobility when wet annealing temperature or wet oxidation temperature is set at the termination-desorption temperature, that is, from 700 to 1000° C., especially 800° C. or greater, preferably 900° C. or greater.

Figure 37:
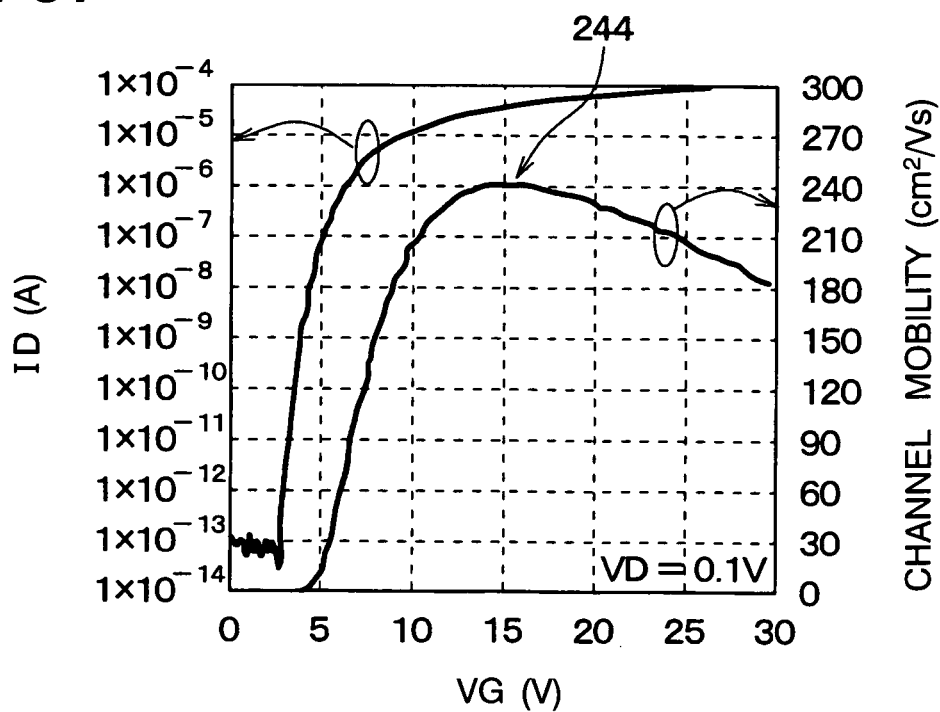
FIG. 37 illustrates the investigation results of channel mobility and magnitude of drain current relative to gate voltage when wet annealing is performed at 900° C.

FIG. 37 illustrates the investigation results of channel mobility and magnitude of drain current relative to gate voltage with respect to an MOSFET having a (11-20) plane and subjected to wet annealing at 900° C. It has channel mobility as high as 244 $cm^2$/Vs.

Then, an MOSFET having a similar structure to that employed in the test of FIGS. 25A and 25B was manufactured using a hydrogen atmosphere (hydrogen annealing) instead of the wet atmosphere and its channel mobility was studied. In the fabrication of the MOSFET having a similar structure to that employed in the test of FIGS. 25A and 25B, a gate oxide film was formed in accordance with the recipe of FIG. 4 which will be described later, and hydrogen annealing was performed after formation of a gate oxide film. Hydrogen annealing was performed by raising the temperature from 600 to 900° C. at a rate of 10° C./min in a hydrogen atmosphere, keeping the temperature at 900° C. for 30 minutes in the hydrogen atmosphere, and then reducing the temperature to 600° C. at a rate of 10° C./min without switching the hydrogen atmosphere. As a result of evaluation of the channel mobility of the MOSFET thus completed, it had channel mobility of 186 $cm^2$/V and no deterioration in characteristics occurred. This suggests that hydrogen annealing produces similar effects to those obtained by annealing in the wet atmosphere.

In the above description, the atmosphere of the gate oxide film formation step or the atmosphere of annealing treatment was examined from the viewpoint of terminating, with H or OH, dangling bonds at the interface between SiC and the gate oxide film. When a device process is designed, it sometimes includes, for example, a heat treatment step at high temperatures exceeding 850° C., such as a reflow treatment of an interlayer insulating film. An MOSFET having a similar structure to that employed in the test of FIGS. 25A and 25B was manufactured and influence of high-temperature treatment was also examined.

Described specifically, an MOSFET having a similar structure to that employed in the test of FIGS. 25A and 25B was manufactured by carrying out wet annealing, which also served as a round-off oxidation step of polysilicon constituting its gate, at 850° C. for 120 minutes, setting the starting and stopping temperature of the wet atmosphere at 600° C. and a temperature raising or reducing rate was set at 10° C./min.

An interlayer insulating film was formed by forming a BPSG film at 420° C. by plasma CVD, followed by reflow at 950° C. for 10 minutes in the wet atmosphere. During that step, a temperature for starting or stopping the wet atmosphere was set at 600° C. and a temperature raising or reducing rate was set at 10° C./min.

With respect to the MOSFET manufactured by the above-described steps, channel mobility and magnitude of drain current relative to gate voltage were studied. The results are shown in FIG. 38.

When a device process is designed, it sometimes includes a heat treatment step other than the above-described gate oxide film formation step. In such a case, desorption of H or OH from dangling bonds may occur at the interface between SiC and gate oxide film.

Figure 38:
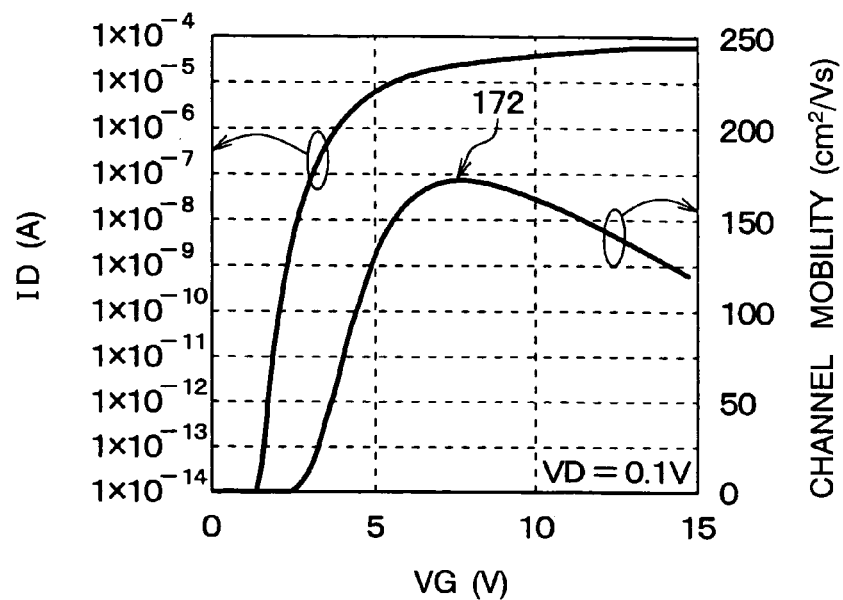
FIG. 38 illustrates the investigation results of the relationship between channel mobility and magnitude of drain current relative to gate voltage.

As is apparent from FIG. 38, the MOSFET has channel mobility of 172 $cm^2$/Vs. This suggests that even if such a heat treatment step is performed, it is possible to prevent occurrence of a large deterioration in characteristics by using the wet atmosphere in a temperature range of 600° C. or greater. It is therefore possible to suppress desorption of H or OH from the dangling bonds at the interface between SiC and the gate oxide film by performing such a heat treatment step in the wet atmosphere. The above-described heat treatment step was performed in the wet atmosphere, but similar results are produced by conducting the heat treatment step in the hydrogen atmosphere. FIG. 38 shows the results of the MOSFET using a (11-20) plane. A significant deterioration in characteristics did not occur even if an MOSFET having a substrate with a (1-100) plane was used instead.

Finally, not the inversion mode lateral MOSFET having a similar structure to that employed in the test of FIGS. 25A and 25B but a lateral accumulation-mode MOSFET (refer to, for example, Japanese Patent Laid-Open No. Hei 10-308510 corresponding to U.S. Pat. No. 5,976,936) having an accumulation type channel made of an impurity layer having a similar conductivity type to that of a source region or a drain region was examined similarly.

Figure 39:
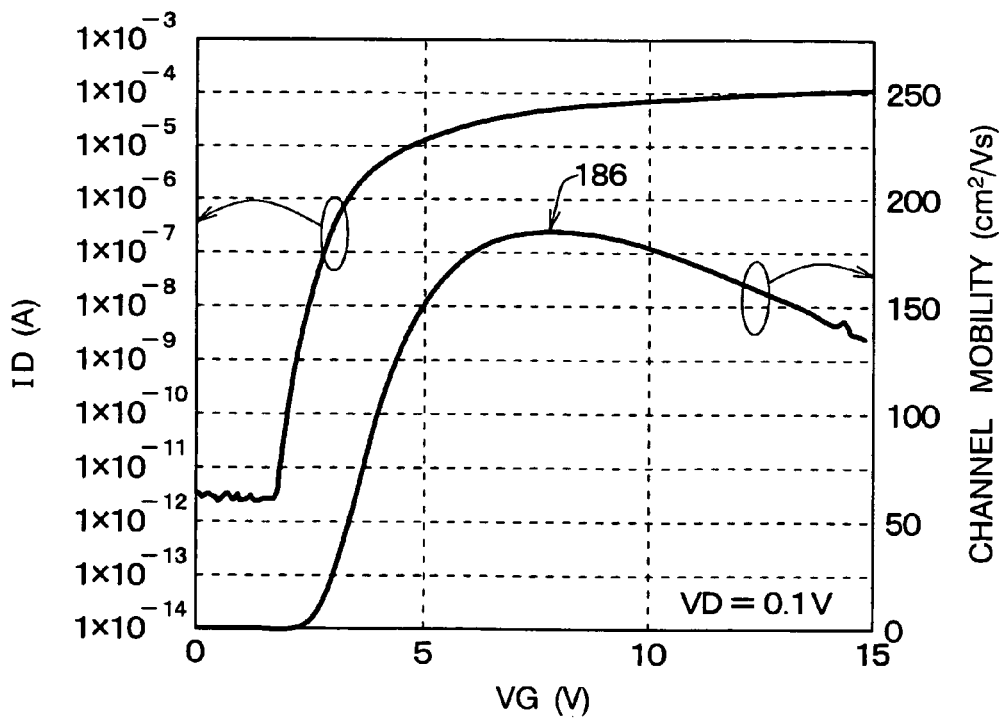
FIG. 39 illustrates the investigation results of the relationship between channel mobility and magnitude of drain current relative to gate voltage.

FIG. 39 shows the investigation results of channel mobility and drain current characteristic relative to gate voltage with respect to an MOSFET having a substrate with a (11-20) plane and manufactured by forming a gate oxide film by conventionally-employed wet oxidation and, at the time of the temperature reduction in the gate oxide film formation step, reducing the temperature to 700° C., which was the termination-desorption temperature or less, at a rate of 1° C./min while maintaining the wet atmosphere.

As shown in the graph, the lateral accumulation-mode MOSFET also had channel mobility as high as 186 $cm^2$/Vs. This suggests that it becomes possible to improve channel mobility of not only an inversion mode semiconductor device but also an accumulation type semiconductor device by maintaining the wet atmosphere or hydrogen atmosphere until the temperature becomes the termination-desorption temperature or less in the gate oxide film formation step; or employing the wet atmosphere or hydrogen atmosphere when the temperature exceeds 700° C. in an annealing step or another heat treatment step after the gate oxide film formation step.

Figure 40A:
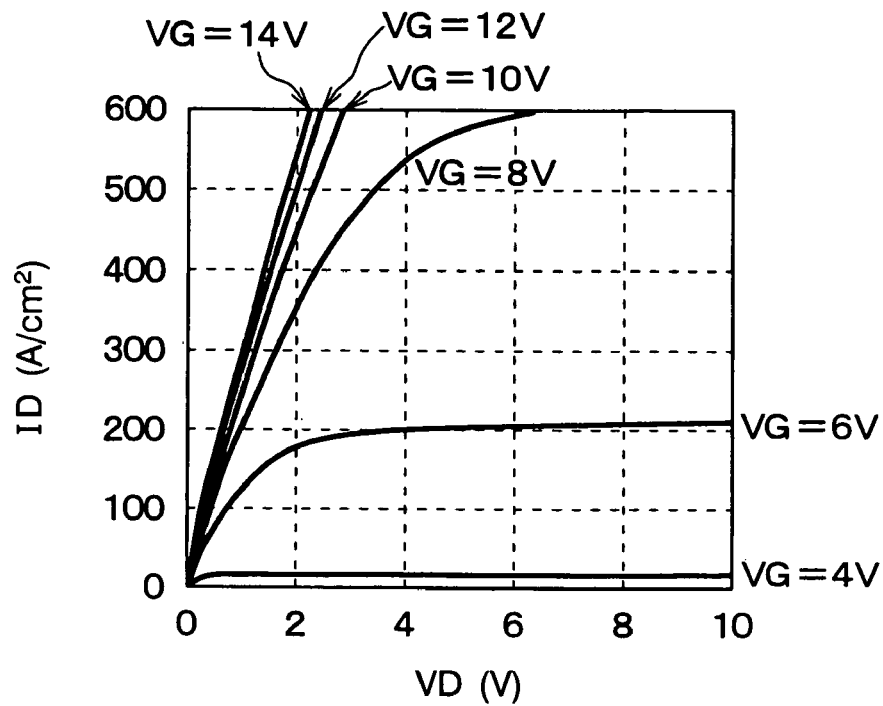
FIG. 40A illustrates drain voltage (VD)-drain current (ID) characteristics.
Figure 40B:
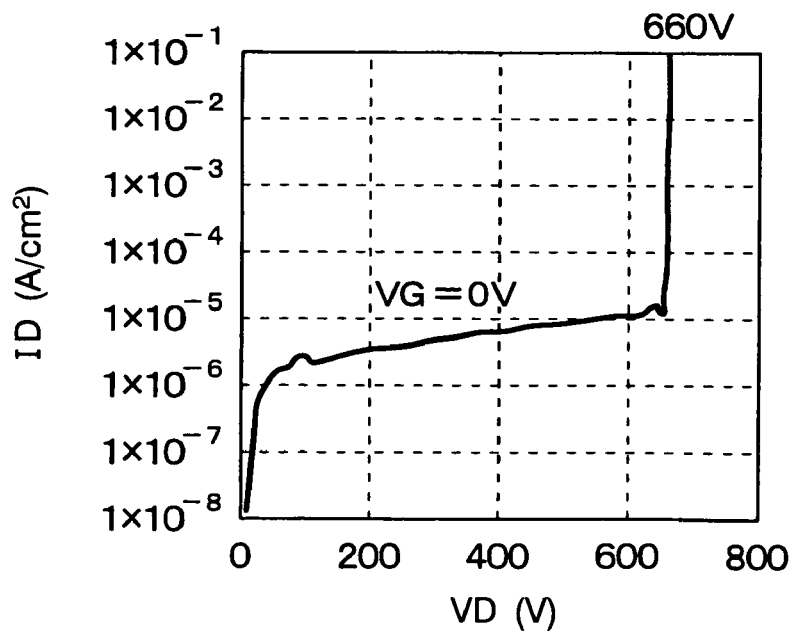
FIG. 40B illustrates the breakdown voltage characteristics.

As a reference, a planar accumulation-mode MOSFET using a substrate having a (11-20) plane and having a cell pitch of 25 μm was manufactured and its characteristic was inspected in order to study whether the vertical type MOS- FET operated well or not. The results are shown in FIGS. 40A and 40B. FIG. 40A is a graph of a drain voltage (VD)—drain current (ID) characteristics, while FIG. 40B is a graph of withstand voltage characteristics. As is apparent from these graphs, it shows characteristics such as 4.5 mΩ·cm$^2$ and a breakdown voltage of 660 V at a gate voltage of 10 V and drain voltage (VD) of 2V. It has therefore been confirmed that the planar accumulation-mode MOSFET operated accurately.

First Embodiment

In view of the above examinations, a SiC semiconductor device is presented.

First embodiment of the present disclosure will be described. In this embodiment, one example is applied to an inversion mode lateral MOSFET. FIG. 1 illustrates a cross-sectional structure of the inversion mode lateral MOSFET, while FIGS. 2A to 3C illustrate manufacturing steps of the inversion mode lateral MOSFET of FIG. 1. With referent to these drawings, the structure and manufacturing method of the inversion mode lateral MOSFET according to this embodiment will be described.

As illustrated in FIG. 1, a p/p$^+$ substrate obtained by forming, with one surface side of a p$^+$ type substrate 1 made of SiC as a main surface, a p type base layer 2 made of epitaxially grown SiC on the main surface is used as a semiconductor substrate. The p$^+$ type substrate 1 is, for example, a substrate which is made of 4H—SiC, has, as a main surface thereof, a (11-20) plane or a (1-100) plane, that is, a plane a vertical to a (0001) Si plane or a (000-1) C plane, and has an impurity concentration of approximately 5×10$^{18}$ cm$^{-3}$. The p type base layer 2 has, for example, an impurity concentration of approximately 5×10$^{15}$ cm$^{-3}$. The inversion mode lateral MOSFET is formed using such a p/p$^+$ substrate as a semiconductor substrate.

The p type base layer 2 has, in the surface layer portion thereof, a p$^+$ type base contact region (which will hereinafter be called "contact region" simply) 3. This contact region 3 has an impurity concentration higher than that of the p type base layer 2. For example, it has an impurity concentration as high as 3×10$^{20}$ cm$^{-3}$ or greater, and has a depth of 0.4 μm. This contact region 3 is used for fixing an electric potential of the p type base layer 2.

In the surface layer portion of the p type base layer 2, an n$^+$ type source region 4 and an n$^+$ type drain region are formed so that they are separated from the contact region 3. They are formed so as to be separated from each other. These n$^+$ type source region 4 and n$^+$ type drain region 5 have, for example, a concentration as high as 3×10$^{20}$ cm$^{-3}$ or greater and a depth of 0.3 μm.

With a portion of the surface layer portion of the p type base layer 2 sandwiched between the n$^+$ type source region 4 and the drain region 5 as a channel region, a gate oxide film 6 having a thickness of, for example, 52 nm is formed so as to cover therewith at least the surface of the channel region. At the interface between this gate oxide film 6 and the p type base layer 2 constituting the channel region, dangling bonds terminated with an element H or OH are present.

On the surface of the gate oxide film 6, a gate 7 made of polysilicon doped with an n type impurity (such as P (phosphorus)) is patterned.

An interlayer insulating film 8 made of, for example, LTO is formed so as to cover therewith the gate 7 and the remaining portion of the gate oxide film 6. In these interlayer insulating film 8 and gate oxide film 6, contact holes 9a to 9c connected to the contact region 3, the n$^+$ type source region 4 and the n$^+$ type drain region 5 are formed, while a contact hole 9d connected to the gate 7 is formed in the interlayer insulating film 8.

By having a potential-fixing base electrode 10 electrically connected to the contact region 3, a source electrode 11 electrically connected to the n$^+$ type source region 4, a drain electrode 12 electrically connected to the n$^+$ type drain region 5, and a gate electrode 13 electrically connected to the gate 7 via the contact holes 9a to 9d, respectively, the inversion mode lateral MOSFET is constructed.

In the inversion mode lateral MOSFET constructed in such a manner, with the channel region formed in the surface layer portion of the p type base layer 2 as a current pathway, an electric current is passed between the n$^+$ type source region 4 and the n$^+$ type drain region 5 placed upstream and downstream of the current pathway. The electric current passed between the n$^+$ type source region 4 and the n$^+$ type drain region 5 can be controlled by controlling a voltage applied to the gate 7, thereby controlling the electric current passed in the channel region.

Based on FIGS. 2A to 3C, the manufacturing method of the inversion mode lateral MOSFET as illustrated in FIG. 1 will next be described.

Figure 2A:
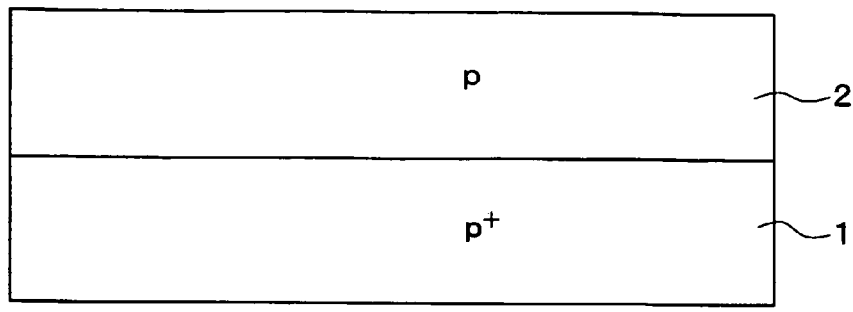
FIGS. 2A to 2C illustrate manufacturing steps of the inversion mode lateral MOSFET shown in FIG. 1.
Figure 2B:
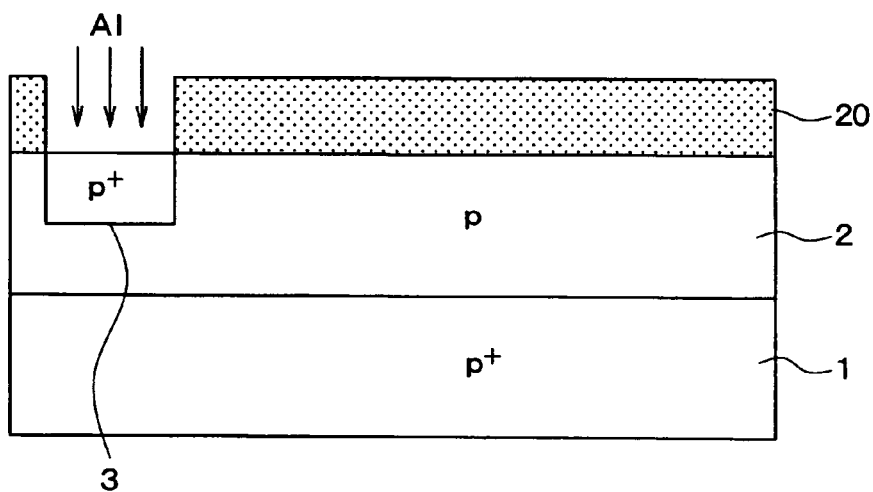

First, as illustrated in FIG. 2A, a semiconductor substrate made of a p/p$^+$ substrate composed of a p$^+$ type substrate 1 and a p type base layer 2 is prepared. As illustrated in FIG. 2B, for example, an LTO film 20 is then formed on the semiconductor substrate, more specifically, on the surface of the p type base layer 2. An opening is then formed by photolithography in the LTO film 20 on a region in which a contact region 3 is to be formed. A p type impurity such as Al (aluminum) is then ion-implanted.

Figure 2C:
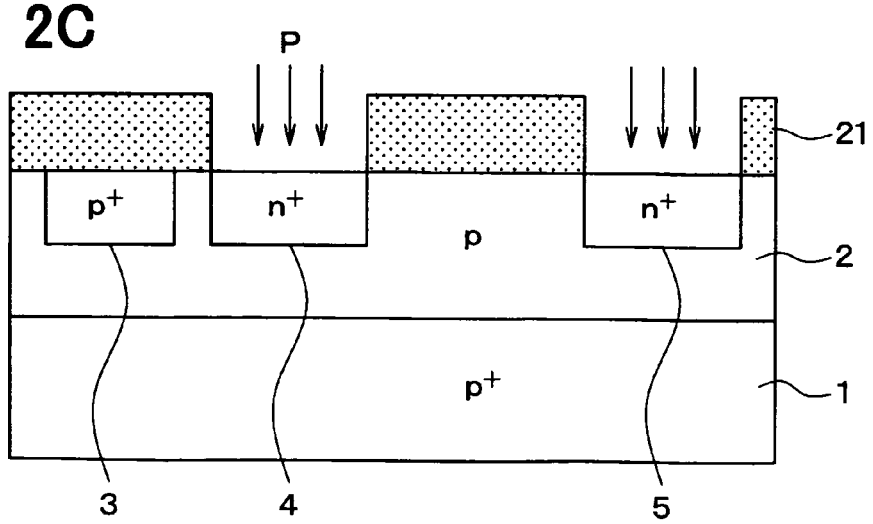

Next, after removal of the LTO film 20, for example, an LTO film 21 is formed as illustrated in FIG. 2C. In the LTO film 21, openings are formed by photolithography on regions in which an n$^+$ type source region 4 and an n$^+$ type drain region 5 are to be formed. An n type impurity such as P (phosphorus) is then ion-implanted.

After removal of the LTO film 21, activation annealing is performed, for example, at 1600° C. for 30 minutes to activate the p type impurity and n type impurity thus ion-implanted, whereby the contact region 3, n$^+$ type source region 4 and n$^+$ type drain region 5 are formed.

Figure 3A:
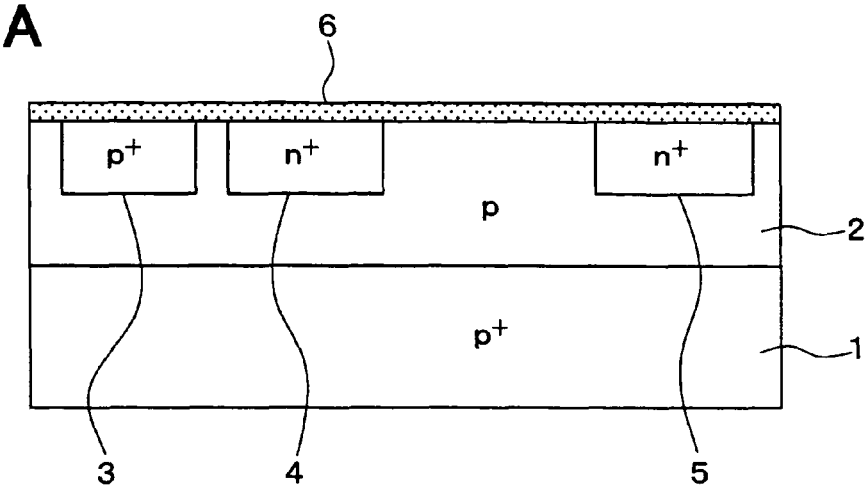
FIGS. 3A to 3C illustrate manufacturing steps of the inversion mode lateral MOSFET following those of FIGS. 2A to 2C.

A gate oxide film formation step is then performed to form a gate oxide film 6 as illustrated in FIG. 3A. Described specifically, the gate oxide film 6 is formed by gate oxidation using a pyrogenic process in a wet atmosphere. During this gate oxide film formation step, the atmosphere and temperature are controlled in accordance with FIG. 4.

Described specifically, from room temperature to 1080° C., the temperature is raised at 10° C./min in a nitrogen (N$_2$) atmosphere. When temperature reaches 1080° C., the temperature is kept for 80 minutes while switching the atmosphere to a wet (H$_2$O) atmosphere, whereby a gate oxide film 6 having a thickness of, for example, 52 nm is formed. Wet oxidation at a temperature exceeding 900° C. in such a manner enables the enhancement of channel mobility. Wet oxidation at a temperature exceeding 1000° C. enables a reduction in time for forming a thick film.

The temperature is then reduced at a rate of 10° C./min while maintaining the wet atmosphere. The wet atmosphere is kept until the temperature decreases to 600° C. or less. The temperature is not limited to 600° C. and it may be not greater than 800° C., which is a termination-desorption temperature, preferably not greater than 700° C. By this step, the gate oxide film 6 is formed on each of the (11-20) plane and (1-100) plane at an equal oxidation rate.

Figure 5:
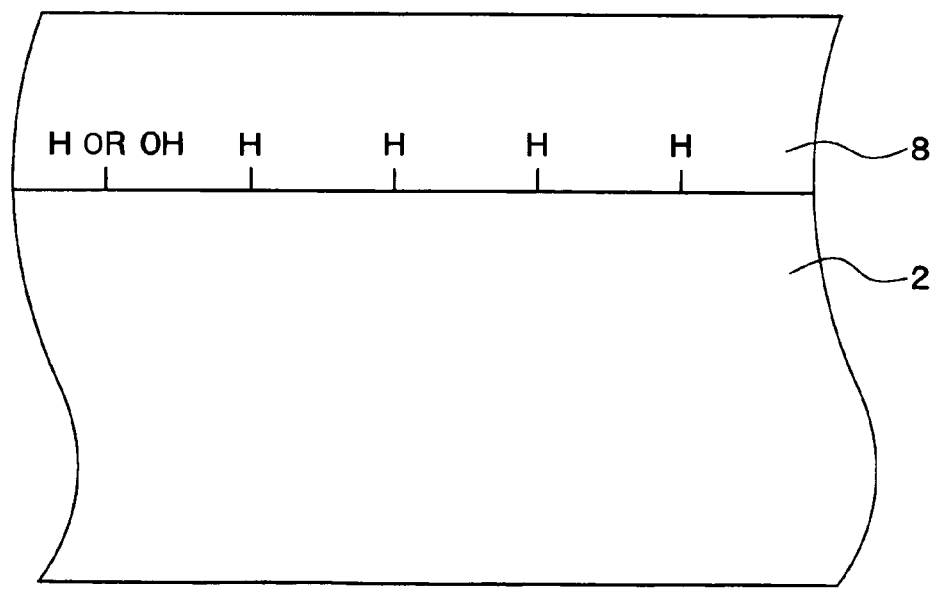
FIG. 5 is a schematic view illustrating how dangling bonds at the interface between a gate oxide film 6 and a p type base layer 2 constituting a channel region are terminated with an element H or OH.

Thus, the wet atmosphere is maintained at the time of the temperature reduction in the gate oxide film formation step, whereby dangling bonds at an interface between the gate oxide film 6 and the p type base layer 2 constituting the channel region are terminated with an element H or OH. FIG. 5 schematically illustrates it and as illustrated therein, for example, the element H or OH enters the gate oxide film 6 formed on the surface of the p type base layer 2.

Figure 3B:
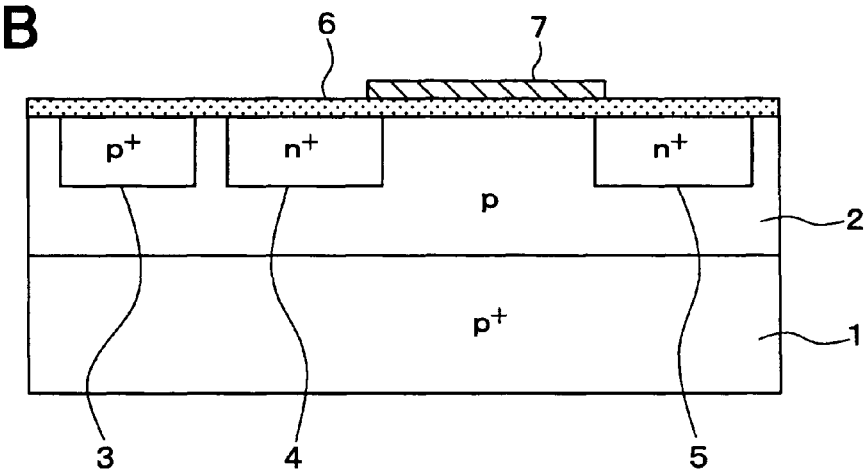

As illustrated in FIG. 3B, a polysilicon layer doped with an n type impurity is then formed on the surface of the gate oxide film 6 at a temperature of 600° C., followed by patterning with an unillustrated resist to form a gate 7.

Figure 3C:
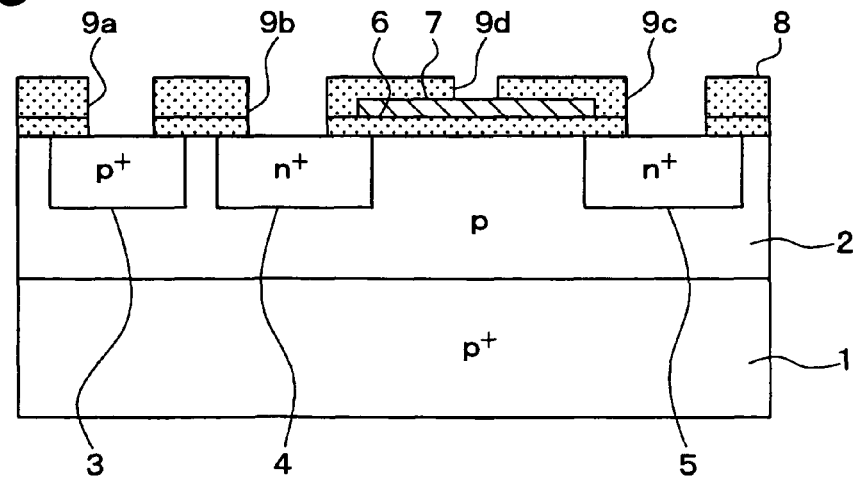

As illustrated in FIG. 3C, an interlayer insulating film 8 made of, for example, LTO is then formed at 420° C., followed by patterning, whereby contact holes 9a to 9c connected to the contact region 3, n$^+$ type source region 4 and n$^+$ type drain region 5 are formed in the interlayer insulating film 8 and the gate oxide film 6, while a contact hole 9d connected to the gate 7 is formed in the interlayer insulating film 8.

A Ni (nickel) film is then formed so as to fill therewith the contact holes 9a to 9d, followed by patterning to form various electrodes 10 to 13. Since the contact region 3, n$^+$ type source region 4 and n$^+$ type drain region 5 have a high impurity concentration as described above, these regions come in ohmic contact with the various electrodes 10 to 13 without conducting a heat treatment step. In such a manner, the inversion mode lateral MOSFET shown in FIG. 1 is completed.

In the above-described manufacturing method of the inversion mode lateral MOSFET, at the time of a temperature reduction in the gate oxide film formation step, the temperature is reduced to the termination-desorption temperature or less while keeping the wet atmosphere as described above. Dangling bonds at the interface between the gate oxide film 6 and the p type base layer 2 constituting the channel region can therefore be terminated with an element H or OH, making it possible to obtain an inversion mode lateral MOSFET having high channel mobility.

The formation step of the interlayer insulating film 8 and the formation step of the various electrodes 10 to 13 are performed after the gate oxide film formation step. All of these steps are performed while controlling the temperature to less than the termination-desorption temperature of H or OH. By these steps, it is therefore possible to prevent the desorption of H or OH from the dangling bonds at the interface between the gate oxide film 6 and the p type base layer 2 constituting the channel region and a deterioration in the channel mobility.

Second Embodiment

Also in this embodiment, one example is applied to an inversion mode lateral MOSFET. The inversion mode lateral MOSFET according to the second embodiment has a similar structure to that according to the first embodiment but they differ partially in the manufacturing method. The inversion mode lateral MOSFET of this embodiment will next be described.

Figure 6:
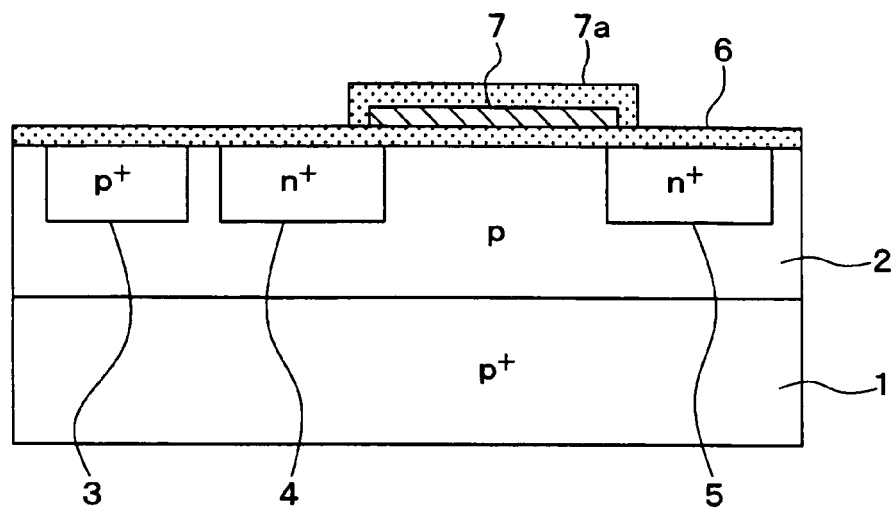
FIG. 6 illustrates manufacturing steps of an inversion mode lateral MOSFET according to a second embodiment.

The inversion mode lateral MOSFET of this embodiment is manufactured by adding a manufacturing step shown in FIG. 6 to the manufacturing method of the inversion mode lateral MOSFET shown in FIGS. 2A to 3C in the first embodiment.

Described specifically, after respective steps shown in FIGS. 2A to 2C and FIGS. 3A and 3B, process shown in FIG. 6 is performed, followed by process shown in FIG. 3C and the like, whereby the inversion mode lateral MOSFET having a structure similar to that of the first embodiment is manufactured.

Described specifically, round-off oxidation of the surface of the gate 7 formed in the step shown in FIG. 3B is performed in the step shown in FIG. 6. Oxidation (wet oxidation) is conducted in a wet atmosphere, for example, at 850° C. for 120 minutes to form an oxide film 7a on the surface of the gate 7, thereby rounding the surface of the gate 7.

Figure 7:
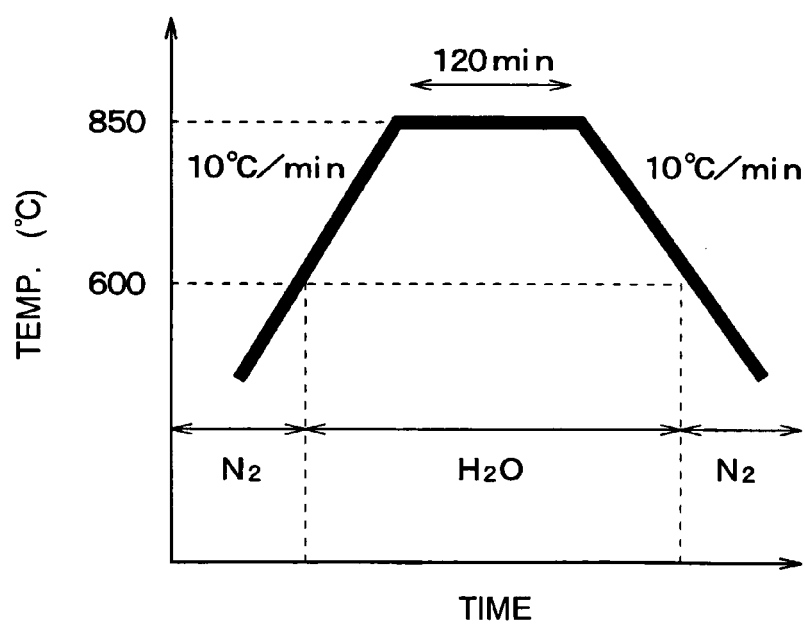
FIG. 7 is a graph schematically showing how to control the atmosphere and temperature of a round-off oxidation step of a gate surface.

During the round-off oxidation, the atmosphere and temperature of wet oxidation are controlled in accordance with FIG. 7.

Described specifically, from room temperature to 600° C. (less than termination-desorption temperature), the temperature is raised at a temperature gradient of 10° C./min in a nitrogen (N$_2$) atmosphere. When the temperature reaches 600° C., it is raised to 850° C. at the same temperature gradient while switching the atmosphere to a wet (H$_2$O) atmosphere. When the temperature reaches 850° C., the temperature is kept at 850° C. for 120 minutes to form the oxide film 7a on the surface of the gate 7. Then, the temperature is reduced at 10° C./min while keeping the wet atmosphere. At the time of this temperature reduction, the wet atmosphere is maintained until the temperature decreases to 600° C. When the temperature reaches 600° C., the atmosphere is switched from wet to nitrogen and the temperature reduction is continued until the temperature becomes room temperature. This starting or stopping temperature of the wet atmosphere is not limited to 600° C. but may be 800° C. or less, preferably 700° C. or less which is not greater than the termination-desorption temperature.

When the temperature exceeds the termination-desorption temperature as described above in the round-off oxidation of the gate 7, the wet atmosphere is maintained. This makes it possible to prevent desorption of an element H or OH from dangling bonds at the interface between the gate oxide film 6 and p type base layer 2 constituting the channel region.

Accordingly, even if high temperature heat treatment is conducted after the gate oxide film formation step as in this embodiment, the channel mobility can be enhanced by employing the wet atmosphere when the temperature exceeds the termination-desorption temperature.

In addition, such round-off oxidation of the gate 7 is performed while covering the gate oxide film 6 therewith so that the gate 7 serves as a cap layer. When an annealing step is performed under a condition permitting the termination of dangling bonds with H or OH preferentially to the desorption, it is possible to terminate the dangling bonds with H or OH while preventing the desorption of H or OH by the cap layer. There is therefore a high possibility of the channel mobility being heightened further. Particularly in the case of polysilicon, hydrogen is generated by the oxidation reaction in the wet atmosphere and it contributes to the termination of dangling bonds so that there is a high possibility of channel mobility being heightened still further.

Third Embodiment

In this embodiment, one example is also applied to an inversion mode lateral MOSFET. The inversion mode lateral MOSFET according to this embodiment has a similar structure to that of Embodiment 1 or 2, but they are partially different from each other in the manufacturing method. The inversion mode lateral MOSFET of this embodiment will next be described.

Figure 8A:
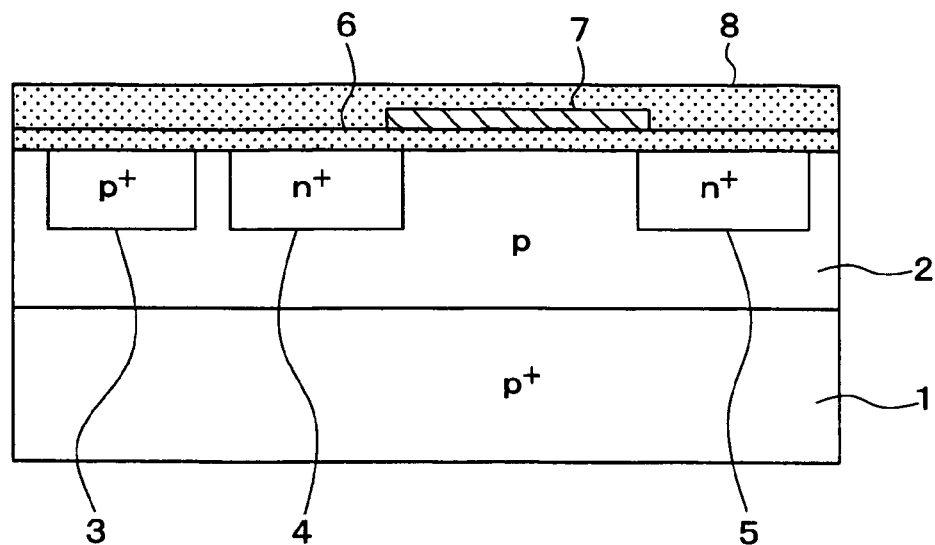
FIGS. 8A and 8B illustrate manufacturing steps of an inversion mode lateral MOSFET according to a third embodiment.
Figure 8B:
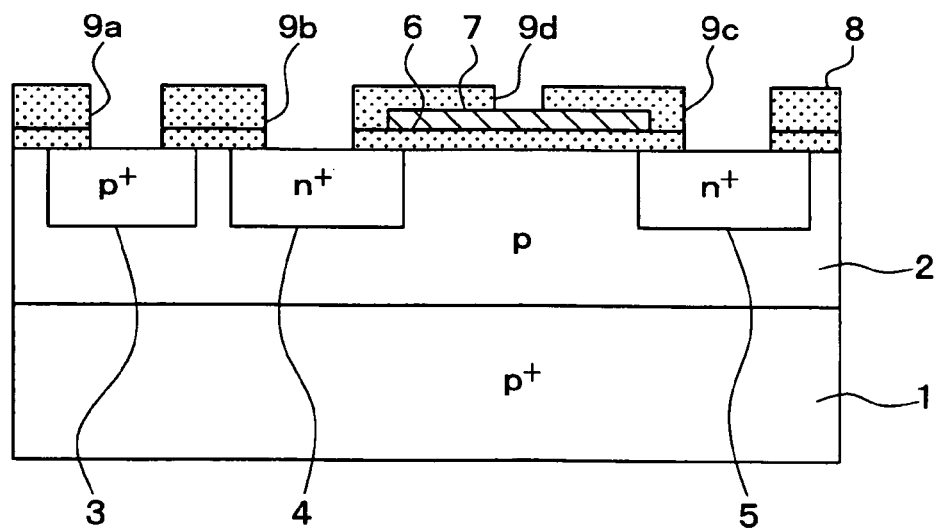

The inversion mode lateral MOSFET according to this embodiment is manufactured in a similar manner to that employed for the inversion mode lateral MOSFET shown in FIGS. 2A to 3C (and FIG. 6) except that the step of forming the interlayer insulating film 8 shown in FIG. 3C is changed to steps shown in FIGS. 8A and 8B.

Described specifically, after the respective steps shown in FIG. 2A to FIG. 2C and FIGS. 3A and 3B (or after the process shown in FIG. 6), processes shown in FIGS. 8A and 8B are performed instead of the process shown in FIG. 3C, whereby an inversion mode lateral MOSFET having a similar structure to that of Embodiment 1 or 2 is manufactured.

Described specifically, in the step shown in FIG. 8A, after formation of an interlayer insulating film 8 on the surfaces of the gate 7 and gate oxide film 6 formed in the step shown in FIG. 3B (or on the surfaces of the oxide film 7a and gate oxide film 6 formed in the step shown in FIG. 6), contact holes 9a to 9d are formed in the interlayer insulating film 8 and gate oxide film 6 as illustrated in FIG. 8B.

In the step shown in FIG. 8A, a BPSG film is formed at 420° C., for example, by plasma CVD, followed by reflow in a wet atmosphere, for example, at 950° C. for 10 minutes to form the interlayer insulating film 8. The atmosphere and temperature for wet oxidation in this step are controlled in accordance with FIG. 9.

Described specifically, the temperature in this step is raised from room temperature to 600° C. (less than the termination-desorption temperature) at a temperature gradient of 10° C./min in a nitrogen ($N_2$) atmosphere. When the temperature reaches 600° C., it is raised to 950° C. at the same temperature gradient while switching the atmosphere to a wet ($H_2O$) atmosphere. When the temperature reaches 950° C., a reflow process is performed by keeping the temperature at 950° C. for 10 minutes. Then, the temperature is reduced at 10° C./min while keeping the wet atmosphere. The wet atmosphere is maintained until the temperature reaches 600° C. When the temperature reaches 600° C., the atmosphere is switched from wet to nitrogen and the temperature reduction is reduced to room temperature. The starting or stopping temperature of the wet atmosphere is not limited to 600° C. and it may be 800° C. or less, preferably 700° C. or less which is not greater than the termination-desorption temperature. As an alternative method, a hydrogen atmosphere may be used instead of the wet atmosphere. Also in this case, the temperature is raised from room temperature to 600° C. (less than termination-desorption temperature) at a temperature gradient of 10° C./min in a nitrogen ($N_2$) atmosphere. When the temperature reaches 600° C., the temperature is raised to 950° C. at the same temperature gradient while switching the atmosphere to the hydrogen atmosphere. When the temperature reaches 950° C., a reflow process is performed by keeping the temperature at 950° C. for 10 minutes. Then, the temperature is reduced at 10° C./min while keeping the hydrogen atmosphere. The hydrogen atmosphere is maintained until the temperature decreases to 600° C. When the temperature reaches 600° C., the atmosphere is returned from the hydrogen one to the nitrogen one and the temperature reduction is continued until the temperature becomes room temperature. The starting or stopping temperature of the hydrogen annealing is not limited to 600° C. but may be 800° C. or less, preferably 700° C. or less which is not greater than the termination-desorption temperature.

Thus, when the temperature exceeds the termination-desorption temperature in the reflow process of the interlayer insulating film 8, the wet atmosphere or hydrogen atmosphere is maintained. This makes it possible to prevent the desorption of H or OH from dangling bonds at the interface between the gate oxide film 6 and the p type base layer 2 constituting the channel region.

Accordingly, even if high-temperature heat treatment follows the gate oxide film formation step as in this embodiment, it is possible to improve the channel mobility by employing the wet atmosphere or hydrogen atmosphere when the temperature becomes the termination-desorption temperature or greater.

Further, such a reflow process is performed while covering the gate oxide film 6 with a plurality of films such as the gate 7 so that the plurality of films such as the gate 7 play a role as a cap layer. When an annealing step is performed under a condition permitting the termination of dangling bonds with H or OH preferentially to the desorption of them, the dangling bonds can be terminated with H or OH while preventing the desorption of H or OH by the cap layer. This makes it possible to improve the channel mobility further.

Fourth Embodiment

Figure 10:
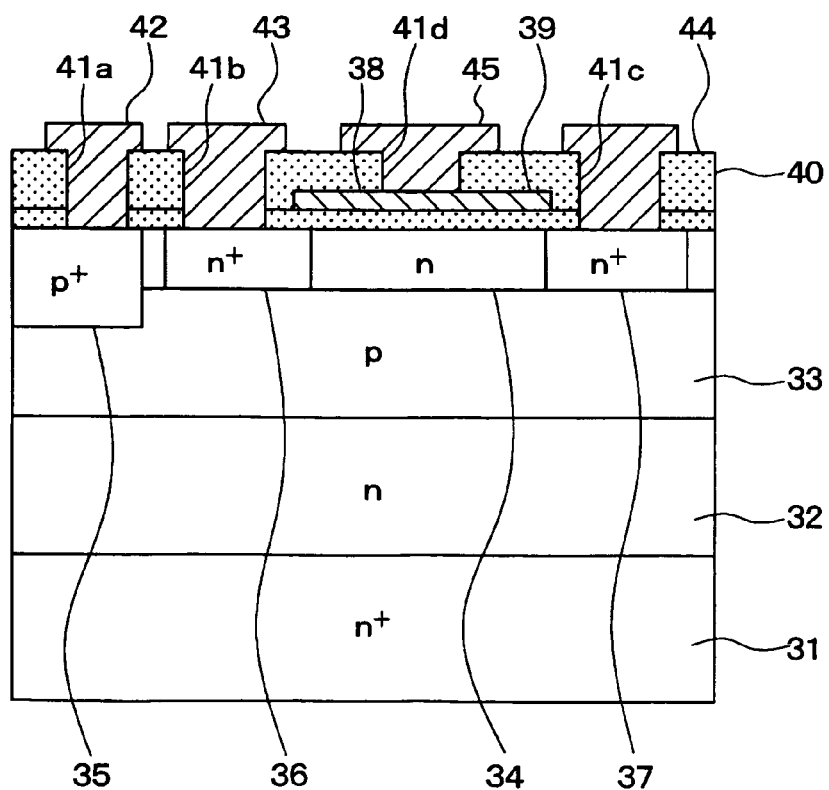
FIG. 10 illustrates a cross-sectional constitution of an lateral accumulation-mode MOSFET according to a fourth embodiment.

In this embodiment, one example is applied to a lateral accumulation-mode MOSFET. FIG. 10 shows a cross-sectional constitution of the lateral accumulation-mode MOSFET. FIGS. 11A to 13C show manufacturing steps of the lateral accumulation-mode MOSFET shown in FIG. 10. The structure and manufacturing method of the lateral accumulation-mode MOSFET of this embodiment will be described with reference to these drawings.

As illustrated in FIG. 10, the lateral accumulation-mode MOSFET is formed on an $n^+$ type substrate 31 made of SiC and having one surface side as a main surface. The $n^+$ type substrate 31 is, for example, composed of 4H—SiC, having, as a main surface thereof, a plane a vertical to a (0001) Si plane or (000-1) C plane, that is, a (11-20) plane or (1-100) plane, and having an impurity concentration of approximately $5 \times 10^{18}$ cm$^{-3}$.

An n type drift layer 32 composed of epitaxially grown SiC is formed on the main surface of this substrate 31. The n type drift layer 32 has, for example, an impurity concentration of approximately $1 \times 10^{16}$ cm$^{-3}$ and has a thickness of 10 μm.

A p type base layer 33 is formed on the surface layer portion of the n type drift layer 32. This p type base layer 33 has approximately $1 \times 10^{19}$ cm$^{-3}$ and has a depth of 0.7 μm.

An n type channel layer (which will hereinafter be called "channel epitaxial layer") 34 for constituting an epitaxially grown channel region is formed on the p type base layer 33. This channel epitaxial layer 34 has, for example, a concentration of approximately $1 \times 10^{16}$ cm$^{-3}$ and a thickness (depth) of 0.3 μm.

A $p^+$ type contact region 35 is formed so as to pass through this channel epitaxial layer 34 and reach the p type base layer 33. This contact region 35 has, for example, a concentration as high as $3 \times 10^{20}$ cm$^{-3}$ or greater and has a depth of 0.4 μm.

An $n^+$ type source region 36 and an $n^+$ type drain region 37 are formed on both sides of the channel epitaxial layer 34 so as to be separated from this contact region 35. These regions 36 and 37 are formed so as to be separated from each other. These $n^+$ type source region 36 and $n^+$ type drain region 37 have, for example, a concentration as high as $3 \times 10^{20}$ cm$^{-3}$ or greater and a depth of 0.3 μm.

Further, with a portion of the surface layer of the channel epitaxial layer 34 sandwiched between the $n^+$ type source region 36 and the $n^+$ type drain region 37 as a channel region, a gate oxide film 38 having a thickness of, for example, 38 nm is formed so as to cover at least the surface of the channel region. At the interface between the gate oxide film 38 and channel epitaxial layer 34 constituting the channel region, dangling bonds are terminated with an element H or OH.

On the surface of the gate oxide film 38, a gate 39 composed of polysilicon doped, for example, with an n type impurity (for example, P (phosphorus)) is patterned.

Further, an interlayer insulating film 40 made of, for example, LTO is formed to cover the gate 39 and a remaining portion of the gate oxide film 38. In the interlayer insulating film 40 and gate oxide film 38, contact holes 41a to 41c connected to the contact region 35, the $n^+$ type source region 36 and the $n^+$ type drain region 37 are formed. A contact hole 41d connected to the gate 39 is formed in the interlayer insulating film 40.

By having a potential-fixing base electrode 42 electrically connected to the contact region 35, a source electrode 43 electrically connected to the $n^+$ type source region 36, a drain electrode 44 electrically connected to the $n^+$ type drain region 37, and a gate electrode 45 electrically connected to the gate 39 via the contact holes 41a to 41d, respectively, the lateral accumulation-mode MOSFET is constructed.

In the lateral accumulation-mode MOSFET constructed in this manner, with the channel epitaxial layer 34, that is, the channel region as a current pathway, an electric current is passed between the $n^+$ type source region 36 and the $n^+$ type drain region 37 placed upstream and downstream of the current pathway. It is possible to control the current to be passed between the $n^+$ type source region 36 and the $n^+$ type drain region 37 by controlling a voltage applied to the gate 39, controlling the width of a depletion layer formed in the channel region, thereby controlling an electric current to be passed thereto.

The manufacturing method of the lateral accumulation-mode MOSFET shown in FIG. 10 will next be described based on FIGS. 11A to 13C.

Figure 11A:
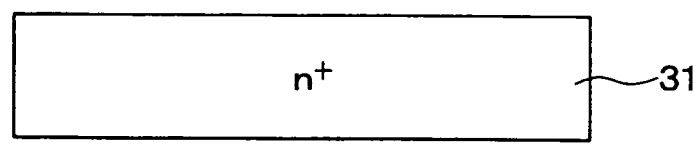
FIGS. 11A to 11D illustrate manufacturing steps of the lateral accumulation-mode MOSFET shown in FIG. 10.
Figure 11B:
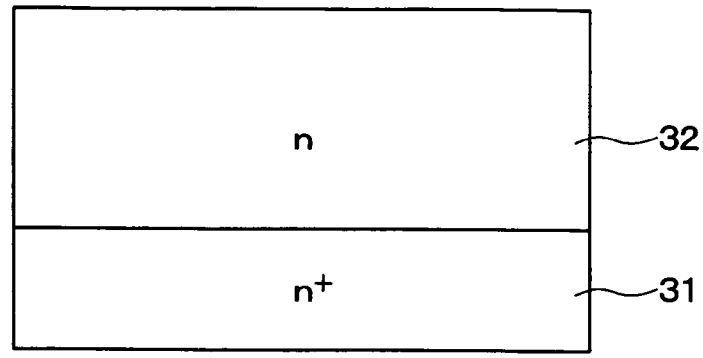

First, as illustrated in FIG. 11A, an $n^+$ type substrate 31 is prepared. As illustrated in FIG. 11B, an n type drift layer 32 is epitaxially grown on the main surface of the substrate 31 so that the n type drift layer 32 has an impurity concentration of approximately $1 \times 10^{16}$ cm$^{-3}$ and a thickness of 10 μm.

Figure 11C:
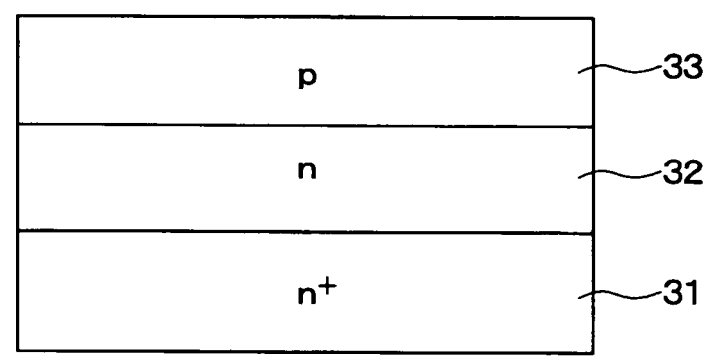
Figure 11D:
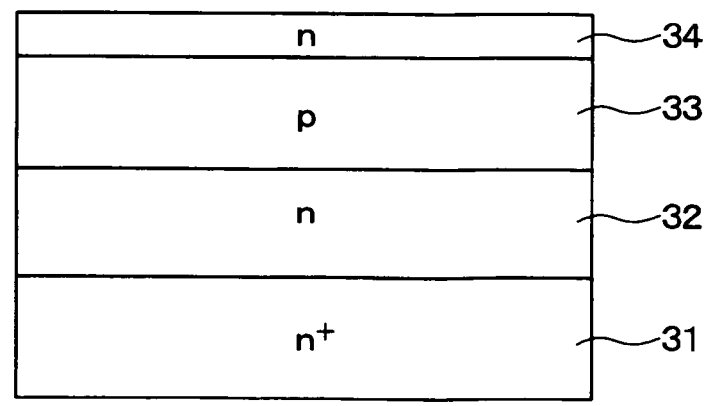

As illustrated in FIG. 11C, Al ions are implanted as a p type impurity into the surface layer portion of the n type drift layer 32. Activation annealing is performed at 1600° C. for 30 minutes, whereby a p type base layer 33 having, for example, an impurity concentration of approximately $1 \times 10^{19}$ cm$^{-3}$ and a depth of 0.7 μm is formed. As illustrated in FIG. 11D, a channel epitaxial layer 34 having a concentration of approximately $1 \times 10^{16}$ cm$^{-3}$ and a film thickness (depth) of 0.3 μm is epitaxially grown on the p type base layer 33.

Figure 12A:
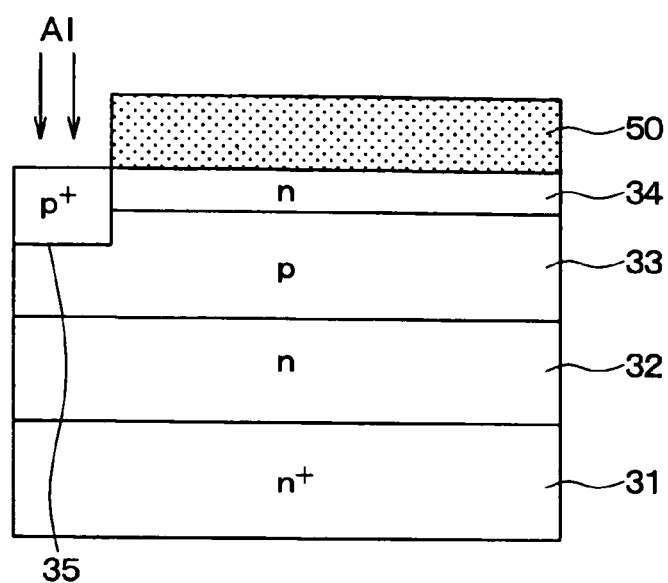
FIGS. 12A to 12C illustrate manufacturing steps of the lateral accumulation-mode MOSFET following those of FIGS. 11A to 11D.

Next, as illustrated in FIG. 12A, after formation of, for example, an LTO film 50, an opening is formed by photolithography in the LTO film 50 on a region in which the contact region 35 is to be formed. Al ions are then implanted with the LTO film 50 as a mask.

Figure 12B:
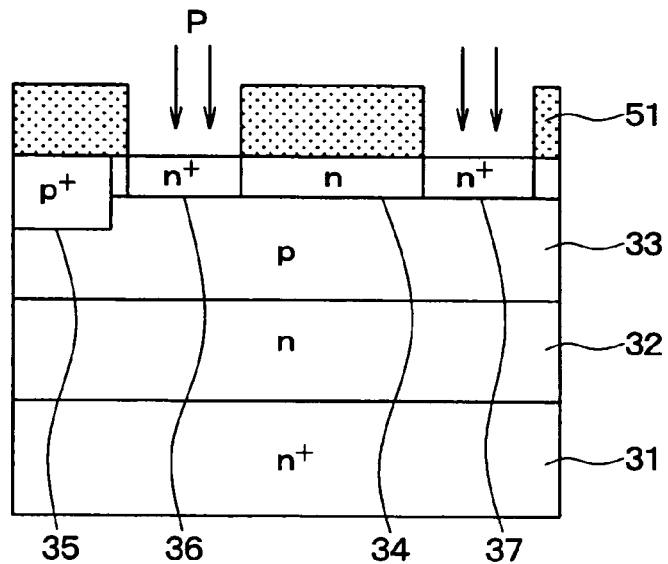

After removal of the LTO film 50, another LTO film 51 is formed as illustrated in FIG. 12B. Openings are formed by photolithography in the LTO film 51 on regions in which the $n^+$ type source region 36 and the $n^+$ type drain region 37 are to be formed. Then, for example, P ions are implanted as an n type impurity.

After removal of the LTO film 51, activation annealing is performed, for example, at 1600° C. for 30 minutes to activate the implanted p type impurities and n type impurities, whereby the contact region 35, the $n^+$ type source region 36 and the $n^+$ type drain region 37 are formed.

Figure 4:
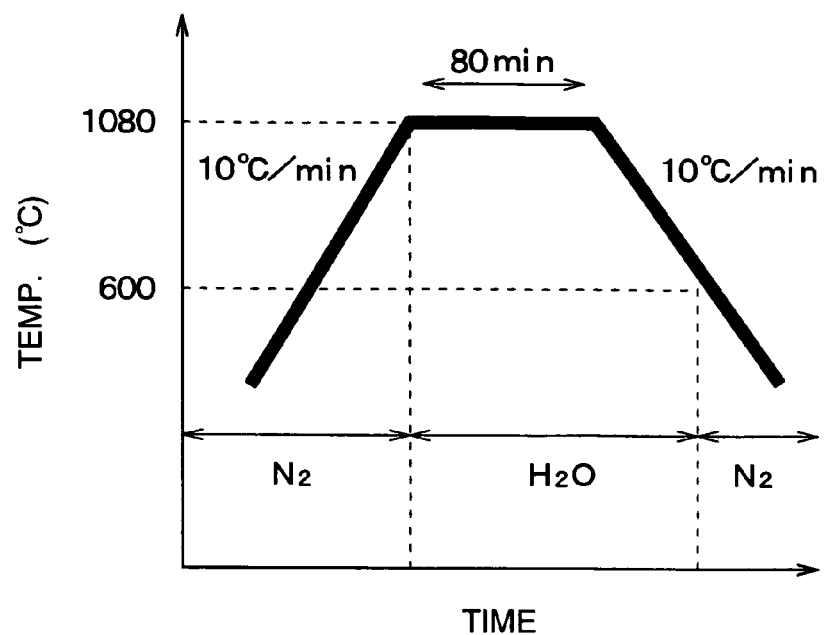
FIG. 4 is a graph schematically showing how to control the atmosphere and temperature in a gate oxide film formation step.
Figure 12C:
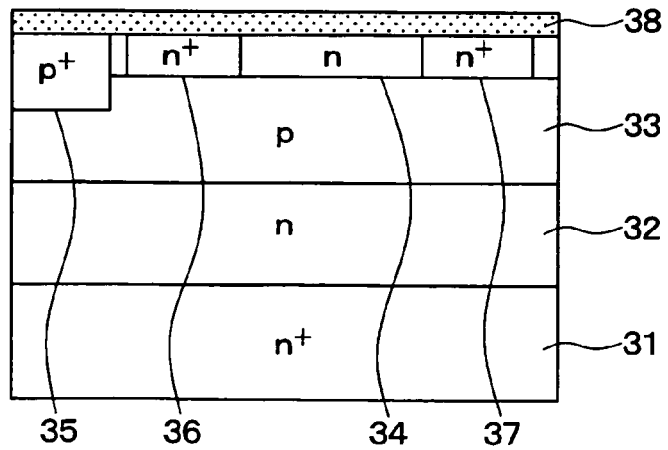

A gate oxide film 38 is formed as illustrated in FIG. 12C by carrying out a gate oxide film formation step. Described specifically, the gate oxide film 38 is formed by gate oxidation in accordance with a pyrogenic process in a wet atmosphere. The atmosphere and temperature of the gate oxide film formation step are controlled as illustrated in FIG. 4 shown in the first embodiment. However, a temperature is maintained at 1080° C. for 60 minutes, while the atmosphere is switched from wet to nitrogen at 700° C. at the time of the temperature reduction.

Described specifically, from the room temperature to 1080° C., the temperature is raised at a temperature gradient of 10° C./min in a nitrogen ($N_2$) atmosphere. When the temperature reaches 1080° C., the atmosphere is switched to a wet ($H_2O$) atmosphere and this temperature is maintained for 60 minutes, whereby a gate oxide film 38 having a thickness of, for example, 38 nm is formed. Then, the temperature is reduced at a rate of 10° C./min while keeping the wet atmosphere. The wet atmosphere is maintained until the temperature decreases to 70° C. or less.

In such a manner, the wet atmosphere is maintained at the time of the temperature reduction in the gate oxide film formation step. As a result, dangling bonds are terminated with an element H or OH at the interface between the gate oxide film 38 and the channel epitaxial layer 34 constituting the channel region.

Figure 13A:
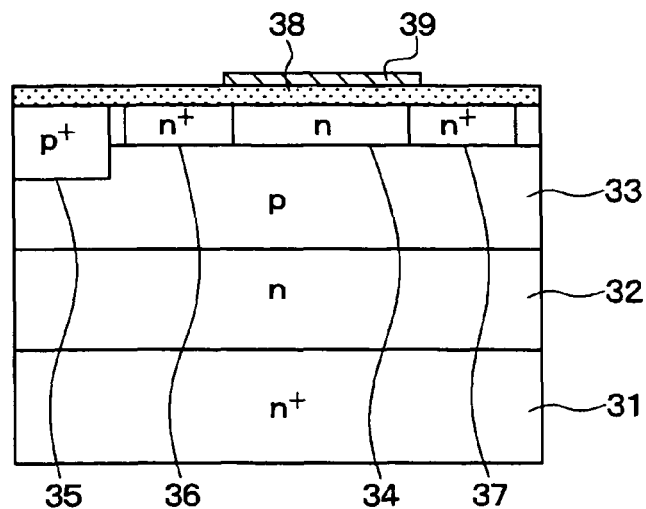
FIGS. 13A to 13C illustrate manufacturing steps of the lateral accumulation-mode MOSFET following those of FIGS. 12A to 12C.

As illustrated in FIG. 13A, a polysilicon layer doped with an n type impurity is formed on the surface of the gate oxide film 38 at a temperature of 600° C. Then, the film is patterned using an unillustrated resist to form a gate 39.

Figure 13B:
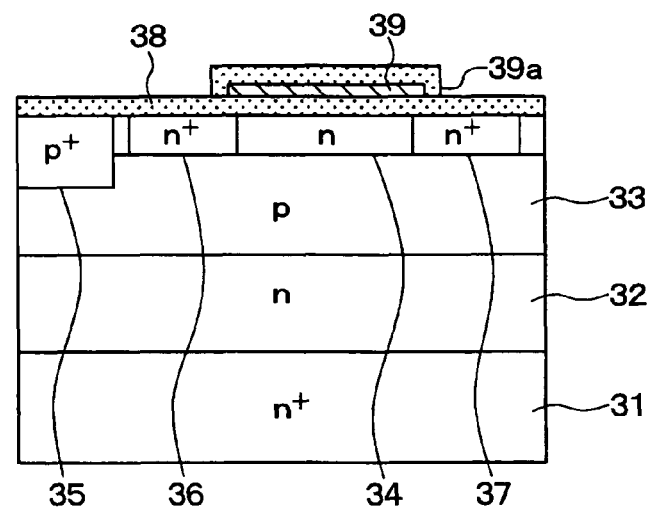

As illustrated in FIG. 13B, round-off oxidation of the surface of the gate 39 is then performed. For example, oxidation (wet oxidation) is performed in a wet atmosphere, for example, at 850° C. for 120 minutes to form an oxide film 39a on the surface of the gate 39 to round the surface of the gate 39.

At the time of round-off oxidation, the atmosphere and temperature for wet oxidation are controlled as illustrated in FIG. 7 shown in the second embodiment, and the wet atmosphere is maintained when the temperature becomes a termination-desorption temperature or greater. This makes it possible to prevent desorption of H or OH from the dangling bonds at the interface between the gate oxide film 38 and the channel epitaxial layer 34.

Figure 9:
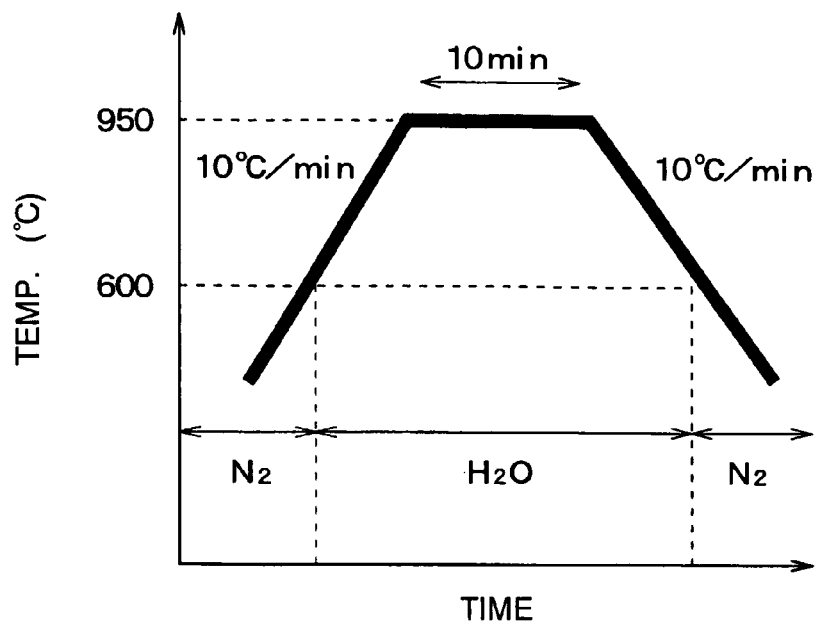
FIG. 9 is a graph schematically showing how to control the atmosphere and temperature of a reflow step of an interlayer insulating film.
Figure 13C:
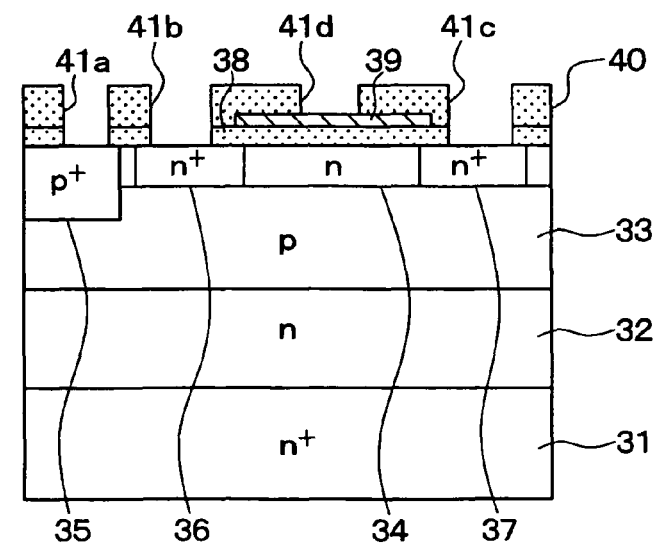

As illustrated in FIG. 13C, an interlayer insulating film 40 is formed. A BPSG film is formed, for example, at 420° C. by plasma CVD, followed by reflow at 950° C. for 10 minutes in the wet atmosphere to form the interlayer insulating film 40. The atmosphere and temperature for the wet oxidation are controlled at this time in accordance with FIG. 9 shown in the third embodiment. The wet atmosphere is maintained when the temperature becomes the termination-desorption temperature or greater in the reflow process of the interlayer insulating film 40. This makes it possible to prevent desorption of H or OH from dangling bonds at the interface between the gate oxide film 38 and the channel epitaxial layer 34.

The interlayer insulating film 40 is then patterned, whereby contact holes 41a to 41c connected to the contact region 35, the $n^+$ type source region 36 and the $n^+$ type drain region 37 are formed in the interlayer insulating film 40 and the gate oxide film 38. At the same time, a contact hole 41d connected to the gate 39 is formed in the interlayer insulating film 40.

After formation of an Ni film so as to fill therewith the contact holes 41 to 41d, the Ni film is patterned to form various electrodes 42 to 45. At this time, since the contact region 35, the $n^+$ type source region 36 and the $n^+$ type drain region 37 have a high concentration, these regions form an ohmic contact with the various electrodes 42 to 45 without carrying out a heat treatment step or the like. In such a manner, the lateral accumulation-mode MOSFET shown in FIG. 10 is completed.

In the above-described manufacturing method of the lateral accumulation-mode MOSFET, as described above, the temperature is decreased to the termination-desorption temperature or less without switching the wet atmosphere at the time of the temperature reduction in the gate oxide film formation step. The dangling bonds at the interface between the gate oxide film 38 and the channel epitaxial layer 34 can therefore be terminated with an element H or OH. This makes it possible to manufacture a lateral accumulation-mode MOSFET having high channel mobility.

The wet atmosphere is maintained when the temperature becomes the termination-desorption temperature or greater in the round-off oxidation of the gate 39. This makes it possible to prevent desorption of H or OH from the dangling bonds at the interface between the gate oxide film 38 and the channel epitaxial layer 34.

Moreover, when the temperature becomes the termination-desorption temperature or greater in the reflow process of the interlayer insulating film 40, the wet atmosphere is maintained. This makes it possible to prevent desorption of H or OH from the dangling bonds at the interface between the gate oxide film 38 and the channel epitaxial layer 34.

Accordingly, even when the gate oxide film formation step is followed by high-temperature heat treatment as in this Embodiment, it is possible to improve channel mobility by maintaining the wet atmosphere when the temperature becomes the termination-desorption temperature or greater.

Fifth Embodiment

Figure 14:
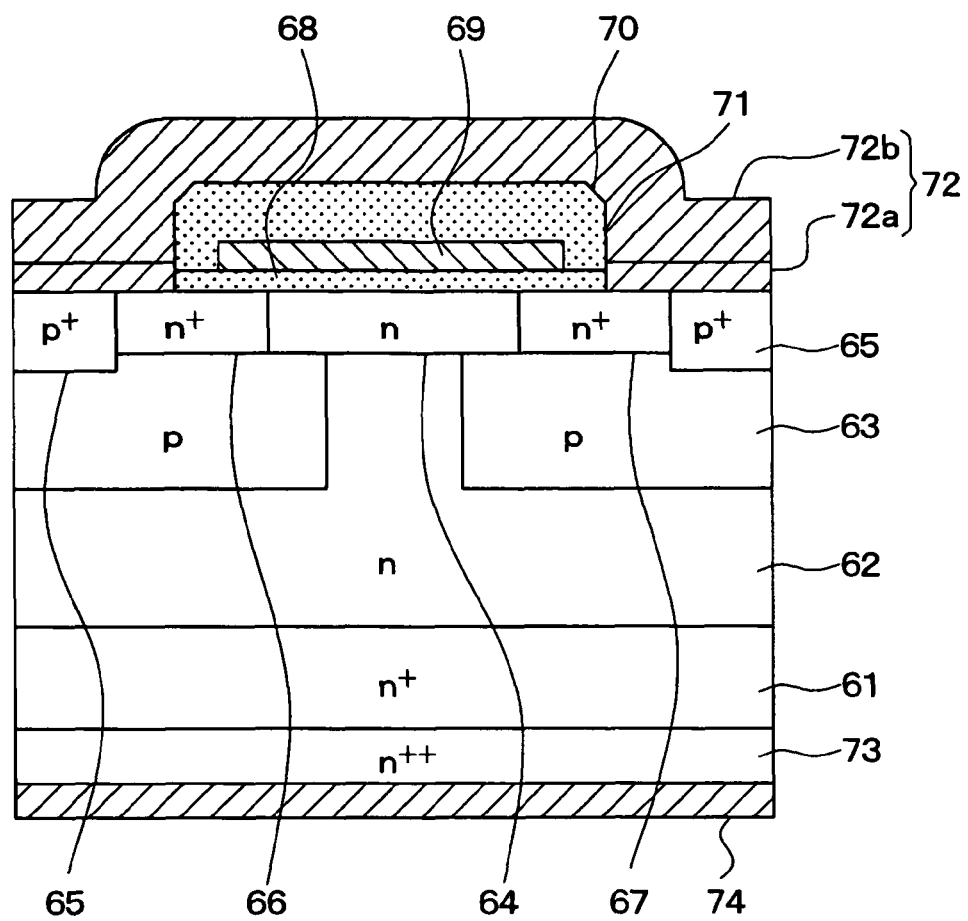
FIG. 14 illustrates a cross-sectional constitution of a planar MOSFET according to a fifth embodiment.

In this embodiment, one example is applied to a planar MOSFET. In FIG. 14, a cross-sectional constitution of the planar MOSFET is illustrated. Manufacturing steps of the planar MOSFET shown in FIG. 14 are illustrated in FIGS. 15A to 19C. The structure and manufacturing method of the planar MOSFET of this embodiment will be described with reference to these drawings.

As illustrated in FIG. 14, the planar MOSFET is formed on an $n^+$ type substrate 61 having one surface side as a main surface and made of SiC. The $n^+$ type substrate 61 is, for example, made of 4H—SiC, has, as a main surface thereof, a plane a vertical to a (0001) Si plane or (000-1) C plane, that is, a (11-20) plane or (1-100) plane, and has an impurity concentration of approximately $5 \times 10^{18}$ cm$^{-3}$.

An n type drift layer 62 made of epitaxially grown SiC is formed on the main surface of this substrate 61. The n type drift layer 62 has, for example, an impurity concentration of approximately $1 \times 10^{16}$ cm$^{-3}$ and a thickness of 10 μm.

A plurality of p type base regions 63 is formed in the surface layer portion of the n drift layer 62 with a predetermined interval provided between any two of them. The p type base region 63 has, for example, a concentration of approximately $1 \times 10^{19}$ cm$^{-3}$ and a depth of 0.7 μm.

Further, an n type channel layer (which will hereinafter be called "channel epitaxial layer") 64 for constituting an epitaxially grown channel region is formed on the p type base region 63. The channel epitaxial layer 64 has, for example, a concentration of approximately $1 \times 10^{16}$ cm$^{-3}$ and a thickness (depth) of 0.3 μm.

A $p^+$ type contact region 65 is formed so as to pass through this channel epitaxial layer 34 and reach the p type base region 63. The contact region 65 has, for example, a concentration as high as $3 \times 10^{20}$ cm$^{-3}$ or greater, and a depth of 0.4 μm.

On the inside of the contact region 65, $n^+$ type source regions 66 and 67 are formed on both sides of the channel epitaxial layer 64 so as to sandwich it with these regions.

These $n^+$ type source regions 66 and 67 are formed so as to be separated from each other. These $n^+$ type source regions 66 and 67 have an impurity concentration as high as $3 \times 10^{20}$ cm$^{-3}$ or greater and a depth of 0.3 μm.

With a portion of the surface layer portion of the channel epitaxial layer 64 located on the p type base region 63 as a channel region, a gate oxide film 68 having, for example, a thickness of 38 nm is formed so as to cover at least the surface of the channel region. At an interface between the gate oxide film 68 and the channel epitaxial layer 64 constituting the channel region, dangling bonds are terminated with an element H or OH.

A gate 69 made of polysilicon doped, for example, with an n type impurity (such as P (phosphorus)) is patterned on the surface of the gate oxide film 68.

Further, an interlayer insulating film 70 made of, for example, BPSG is formed so as to cover the gate 69 and a remaining portion of the gate oxide film 68. A contact hole 71 connected to the contact region 65 and the $n^+$ type source regions 66 and 67, an unillustrated contact hole connected to the gate 69, and the like are formed in this interlayer insulating film 70 and the gate oxide film 68. A source electrode 72 having a contact portion 72a electrically connected to the contact region 65 and the $n^+$ type source regions 66 and 67 via the contact hole 71 and an interconnect electrode 72b composed of Al is provided.

On the back side of the substrate 61, on the other hand, a $n^+$ type drain contact region 73 having a higher concentration than that of the substrate 61 is formed. In the drain contact region 73, a drain electrode 74 which is made of, for example, Ni and will be a backside electrode is formed. The planar MOSFET has such a structure.

In the planar MOSFET having such a structure, with the channel epitaxial layer 64, that is, channel region, as a current pathway, an electric current is passed between the $n^+$ type source regions 66 and 67 and the drain contact region 73 placed upstream and downstream of the current pathway. An electric current to be passed between the $n^+$ type source regions 66 and 67 and the drain contact region 73 can be controlled by controlling a voltage to be applied to the gate 69, controlling the width of a depletion layer formed in the channel region, thereby controlling an electric current sent thereto.

Next, the manufacturing method of the planar MOSFET shown in FIG. 14 will be described using FIGS. 15A to 19C.

Figure 15A:
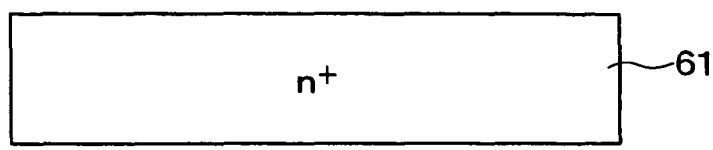
FIGS. 15A to 15D illustrate manufacturing steps of the planar MOSFET shown in FIG. 14.
Figure 15B:
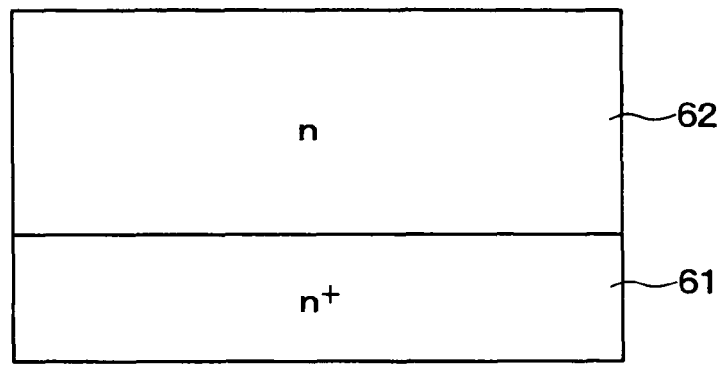

First, an $n^+$ type substrate 61 is prepared as illustrated in FIG. 15A. Then, as illustrated in FIG. 15B, an n type drift layer 62 is epitaxially grown on the main surface of the substrate 61 so as to have an impurity concentration of approximately $1 \times 10^{16}$ cm$^{-3}$ and a thickness of 10 μm.

Figure 15C:
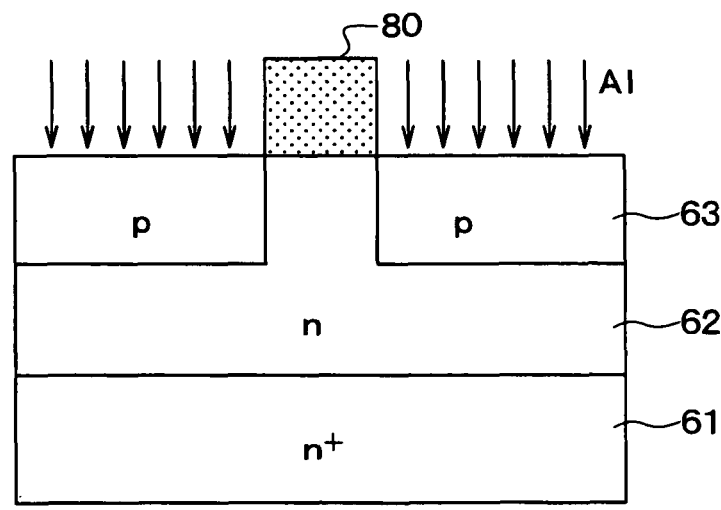
Figure 15D:
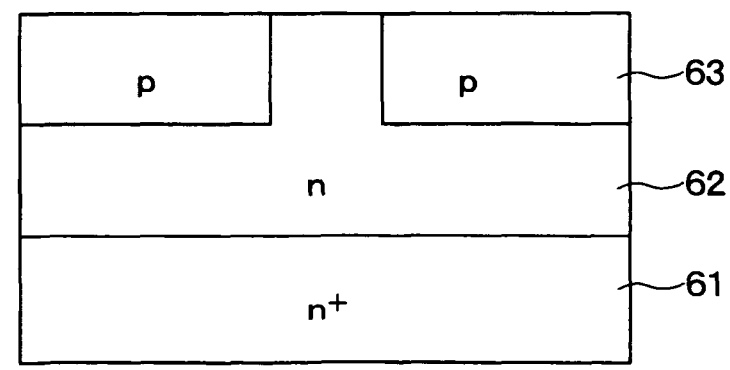

As illustrated in FIG. 15C, after formation of, for example, an LTO film 80 as illustrated in FIG. 15C, openings are made therein by photolithography on regions in which p type base regions 63 are to be formed. Al which will be a p type impurity is then ion-implanted into the surface layer portion of the n type drift layer 62 with the LTO film 80 as a mask. As illustrated in FIG. 15D, the LTO film 80 is removed and activation annealing is performed at 1600° C. for 30 minutes to form the p type base regions 63 having, for example, an impurity concentration of approximately $1 \times 10^{19}$ cm$^{-3}$ and a depth of 0.7 μm.

Figure 16A:
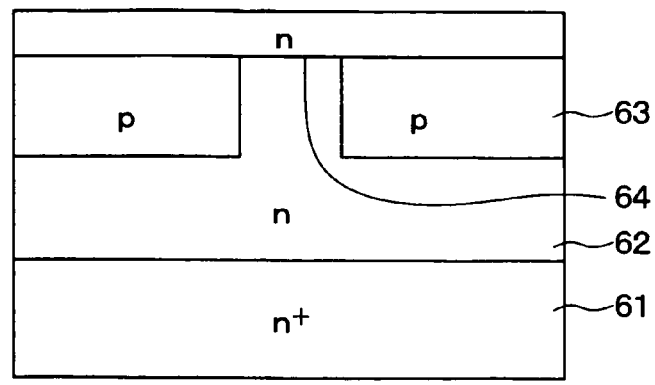
FIGS. 16A to 16C illustrate manufacturing steps of the planar MOSFET following those of FIGS. 15A to 15D.

Then, as illustrated in FIG. 16A, a channel epitaxial layer 64 having, for example, a concentration of approximately $1 \times 10^{16}$ cm$^{-3}$ and a film thickness (depth) of 0.3 μm is epitaxially grown on the p type base regions 63.

Figure 16B:
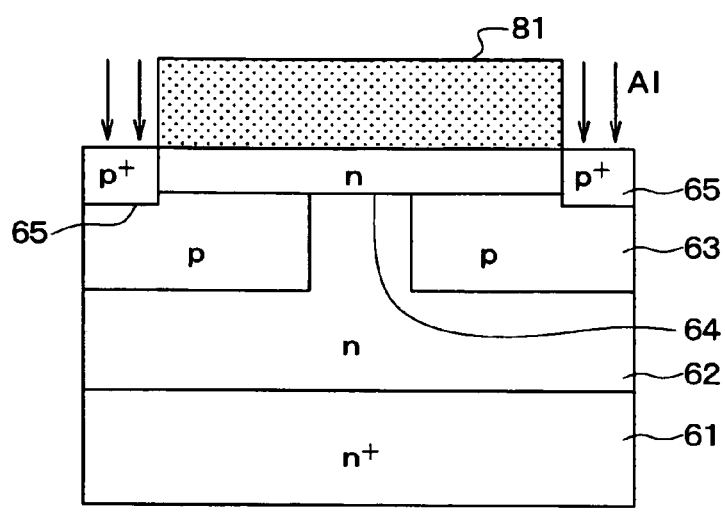

Next, as illustrated in FIG. 16B, for example an LTO film 81 is formed and openings are made therein by photolithography on regions in which contact regions 65 are to be formed. Al is then ion-implanted with the LTO film 81 as a mask.

Figure 16C:
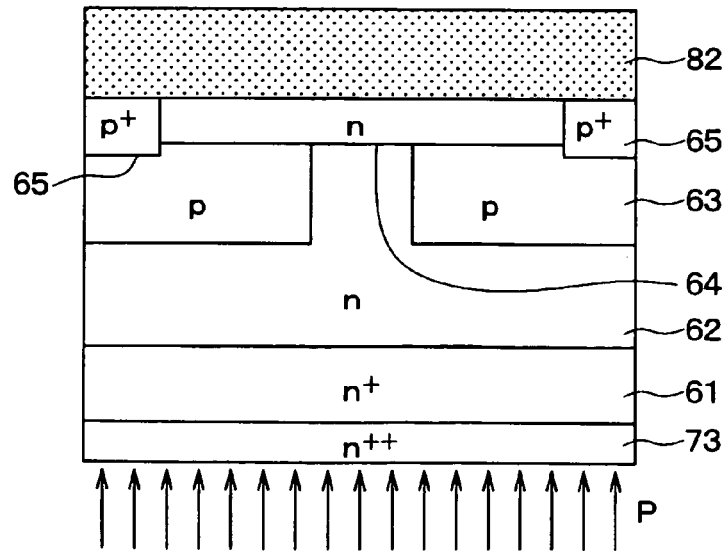

After removal of the LTO film 81, for example, an LTO film 82 is formed to protect the surface of the substrate, followed by ion implantation of P from the backside of the substrate 61 as illustrated in FIG. 16C.

Figure 17A:
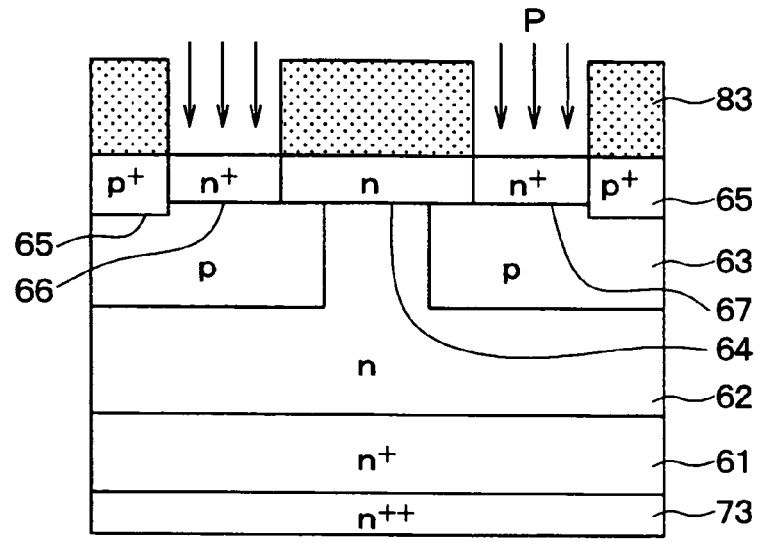
FIGS. 17A to 17C illustrate manufacturing steps of the planar MOSFET following those of FIG. 16A to 16C.
Figure 17B:
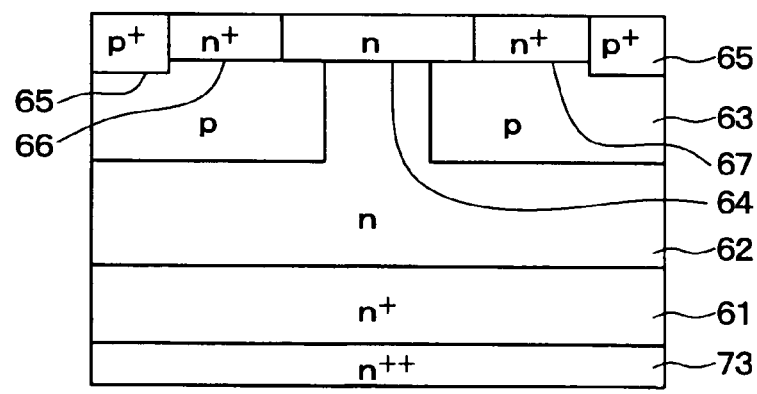

After removal of the LTO film 82, for example, an LTO film 83 is formed and openings are made in the LTO film 83 by photolithography on regions in which n⁺ type source regions 66 and, 67 are to be formed as illustrated in FIG. 17A. Then, for example, P is ion-implanted as an n type impurity.

After removal of the LTO film 83, activation annealing is performed, for example, at 1600° C. for 30 minutes to activate the p type impurity and n type impurity thus implanted, whereby the contact region 65 and the n⁺ type source regions 66 and 67 are formed.

Figure 17C:
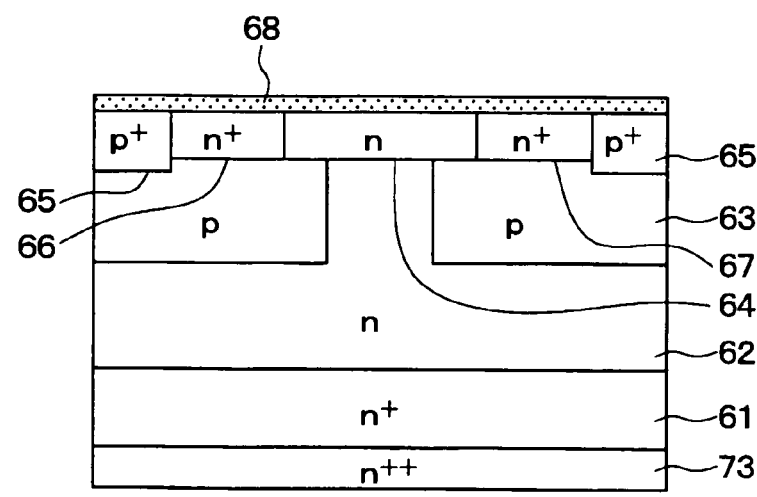

The gate oxide film formation step is then performed to form a gate oxide film 68 as illustrated in FIG. 17C. Described specifically, the gate oxide film 68 is formed by gate oxidation in accordance with the pyrogenic process in a wet atmosphere. The atmosphere and temperature of the gate oxide film formation step are controlled in accordance with FIG. 4 in the first embodiment. However, the temperature is maintained at 1080° C. for 60 minutes and at the time of the temperature reduction, the atmosphere is switched from wet to nitrogen at 700° C.

Described specifically, the temperature is raised at a temperature gradient of 10° C./min in a nitrogen (N₂) atmosphere during from room temperature to 1080° C. When the temperature reaches 1080° C., the atmosphere is switched to wet (H₂O) and this temperature is kept for 60 minutes, whereby a gate oxide film 68 having, for example, a thickness of 38 nm is formed. Without switching the wet atmosphere, the temperature is reduced at a rate of 10° C./min. The atmosphere is not switched until the temperature decreases to 700° C. or less.

Thus, the wet atmosphere is maintained at the time of the temperature reduction in the gate oxide film formation step, whereby dangling bonds are terminated with an element H or OH at the interface between the gate oxide film 68 and the channel epitaxial layer 64 constituting the channel region.

Figure 18A:
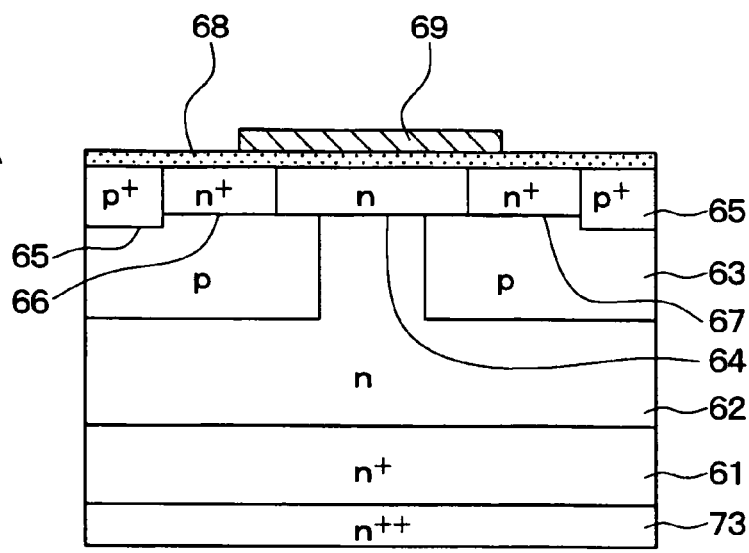
FIGS. 18A to 18C illustrate manufacturing steps of the planar MOSFET following those of FIGS. 17A to 17C.

Then, as illustrated in FIG. 18A, a polysilicon layer doped with an n type impurity is formed on the surface of the gate oxide film 68 at a temperature of 600° C. and is then patterned using an unillustrated resist to form a gate 69.

Figure 18B:
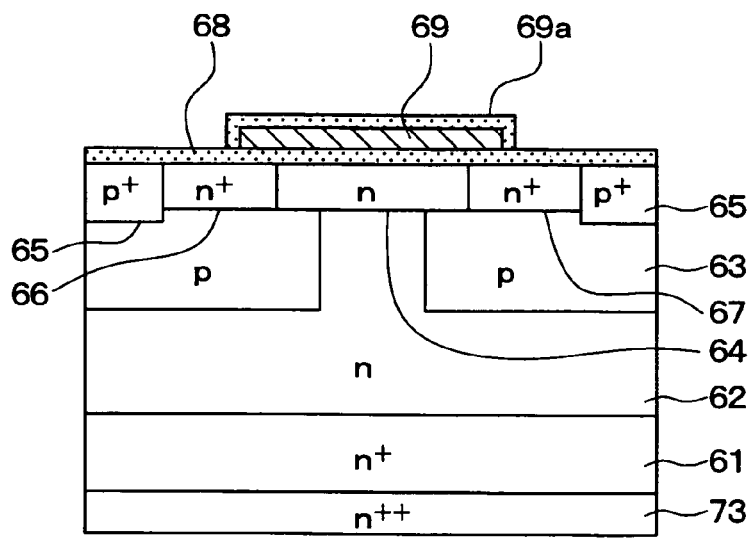

Further, as illustrated in FIG. 18B, round-off oxidation of the surface of the gate 69 is performed. The surface of the gate 69 is rounded, for example, by carrying out oxidation (wet oxidation) in a wet atmosphere at 850° C. for 120 minutes to form an oxide film 69a on the surface of the gate 69.

In this step, the atmosphere and temperature of wet oxidation are controlled in accordance with FIG. 7 shown in the second embodiment and the wet atmosphere is maintained when the temperature becomes the termination-desorption temperature or greater. However, the switching of the atmosphere from nitrogen to wet at the time of the temperature elevation and the switching of the atmosphere from wet to nitrogen at the time of the temperature reduction are each performed at 700° C. This makes it possible to prevent desorption of H or OH from dangling bonds at the interface between the gate oxide film 68 and the channel epitaxial layer 64.

Figure 18C:
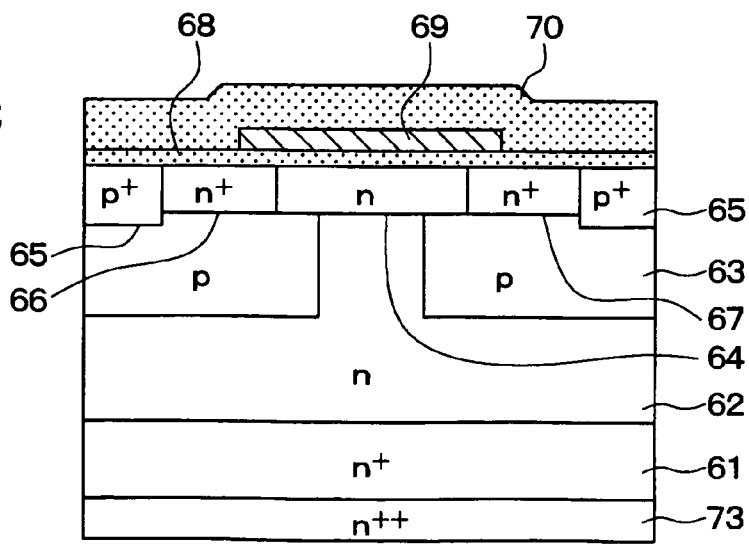

An interlayer insulating film 70 is then formed as illustrated in FIG. 18C. The interlayer insulating film 70 is formed by forming a BPSG film, for example, at 420° C. by plasma CVD and carrying out reflow in a wet atmosphere, for example, at 950° C. for 10 minutes. The atmosphere and temperature of wet oxidation in this step are controlled in accordance with FIG. 9 shown in the third embodiment. The wet atmosphere is maintained when the temperature becomes the termination-desorption temperature or greater in the reflow process of the interlayer insulating film 70. The switching of the atmosphere from nitrogen to wet at the time of the temperature elevation and the switching of the atmosphere from wet to nitrogen at the time of the temperature reduction are each performed at 700° C. This makes it possible to prevent desorption of H or OH from dangling bonds at the interface between the gate oxide film 68 and the channel epitaxial layer 64.

Figure 19A:
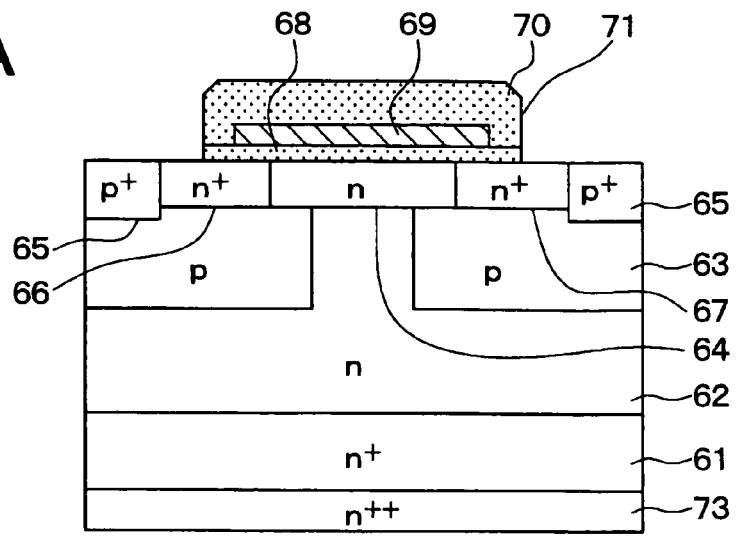
FIGS. 19A to 19C illustrate manufacturing steps of the planar MOSFET following those of FIGS. 18A to 18C.

The interlayer insulating film 70 is then patterned as illustrated in FIG. 19A, whereby contact holes 71 connected to the contact region 65 and the n⁺ type source regions 66 and 67 are formed in the interlayer insulating film 70 and the gate oxide film 68.

Figure 19B:
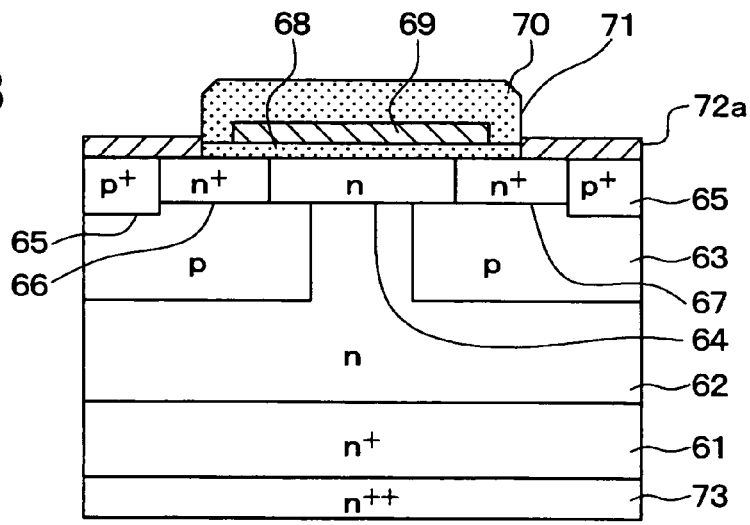
Figure 19C:
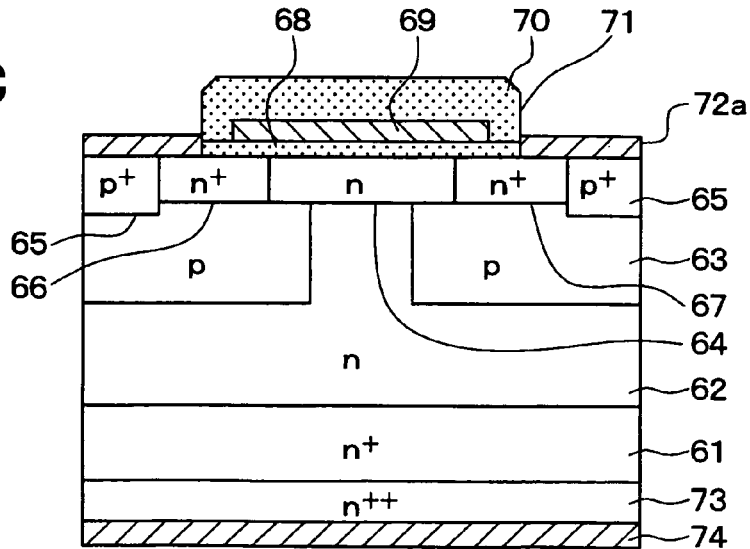

As illustrated in FIG. 19B, a Ni film is formed to fill the contact hole 71 therewith, and is then patterned to form a contact portion 72a for various source electrodes 72. Further, as illustrated in FIG. 19C, a drain electrode 74 made of Ni is formed on the back surface side of the substrate 61 so as to be brought into contact with a drain contact region 73.

Annealing is then performed at 700° C. or less in an Ar atmosphere so as to form an ohmic contact with the contact portion 72a and the drain electrode 74. In this step, since the contact region 65 and the n⁺ type source regions 66 and 67 have high concentrations as described above, these regions sufficiently form an ohmic contact with various electrodes 72a even without a high-temperature heat treatment step.

If annealing is performed in a hydrogen atmosphere, heat treatment at 700° C. or greater can be carried out. Thus, annealing, for example, at 1000° C. can be carried out if a hydrogen atmosphere is employed. This makes it possible to prevent desorption of H or OH from the dangling bonds at the interface between the gate oxide film 68 and the channel epitaxial layer 64, thereby reducing a contact resistance.

Finally, a contact hole (not illustrated) connected to the gate 69 is formed in the interlayer insulating film 70 by using an unillustrated resist, followed by the formation of an interconnect electrode 72b from Al. As a result, a source electrode 72 is formed and the planar MOSFET shown in FIG. 14 is completed.

In the above-described manufacturing method of the planar MOSFET, at the time of temperature reduction in the gate oxide film formation step, the temperature is reduced to the termination-desorption temperature or less while maintaining the wet atmosphere. Dangling bonds at the interface between the gate oxide film 68 and the channel epitaxial layer 64 can therefore be terminated with an element H or OH. This makes it possible to manufacture a planar MOSFET having high channel mobility.

Further, when the round-off oxidation of the gate 69 is performed at the termination-desorption temperature or greater, the wet atmosphere is maintained. This makes it possible to prevent desorption of H or OH from the dangling bonds at the interface between the gate oxide film 68 and the channel epitaxial layer 64.

Further, when the reflow process of the interlayer insulating film 70 is carried out at the termination-desorption temperature or greater, the wet atmosphere is maintained. This makes it possible to prevent desorption of H or OH from the dangling bonds at the interface between the gate oxide film 68 and the channel epitaxial layer 64.

Accordingly, even in the case where the gate oxide film formation step is followed by high-temperature heat treatment as in this Embodiment, it is possible to improve the channel mobility by employing the wet atmosphere when the temperature becomes the termination-desorption temperature or greater.

Sixth Embodiment

Figure 20:
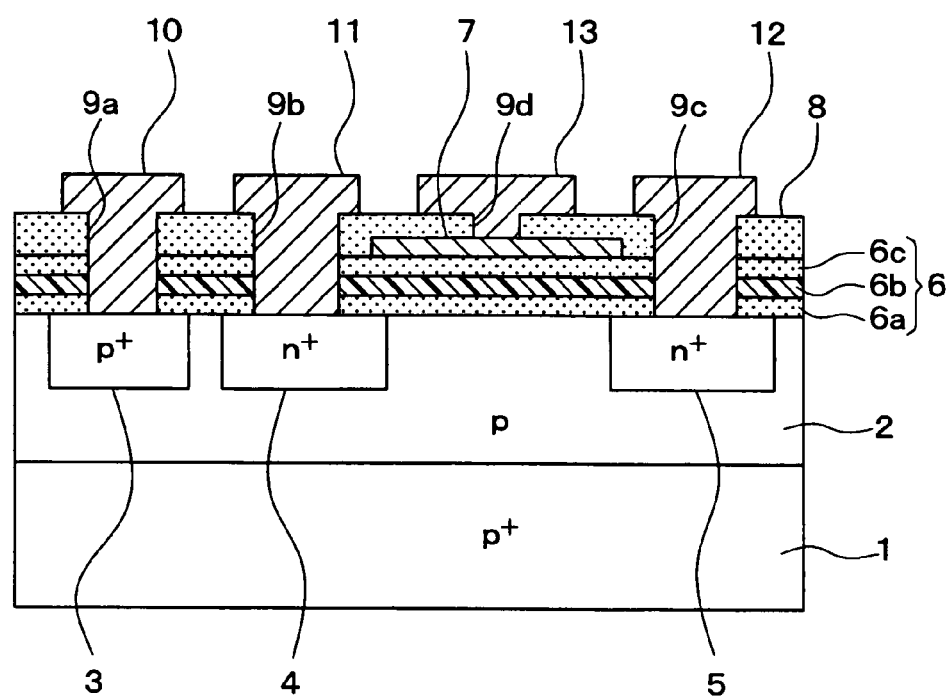
FIG. 20 illustrates a cross-sectional constitution of an inversion mode lateral MOSFET according to a sixth embodiment.

The inversion mode lateral MOSFET is similar to that of the first embodiment except for the structure of the gate insulating film. FIG. 20 shows a cross-sectional constitution of the inversion mode lateral MOSFET of this embodiment. FIGS. 21A to 22B show manufacturing steps of the inversion mode lateral MOSFET shown in FIG. 20. The structure and manufacturing method of the inversion mode lateral MOSFET of this embodiment will be described with reference to these drawings.

In this embodiment, as shown in FIG. 20, the gate insulating film 6 of the inversion mode lateral MOSFET shown in the first embodiment is constructed of an ONO film having three layers of a silicon oxide film 6a, a silicon nitride film 6b and a silicon oxide film 6c.

Next, the manufacturing method of the inversion mode lateral MOSFET shown in FIG. 20 will be described based on FIGS. 21A to 22B.

Figure 21A:
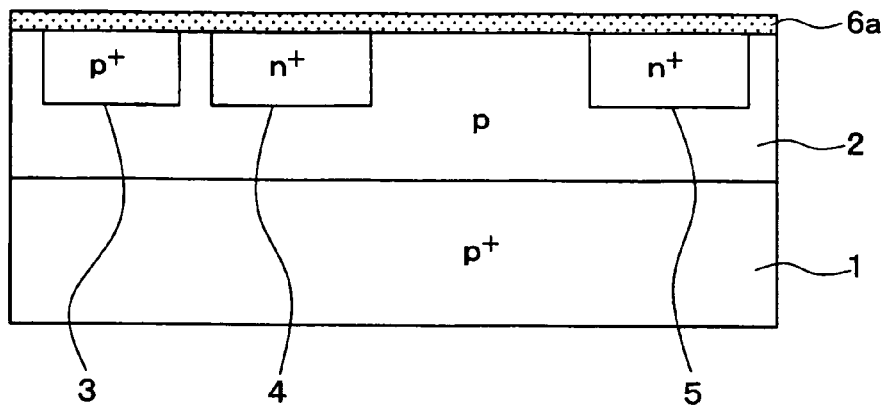
FIGS. 21A to 21C are cross-sectional views illustrating the manufacturing steps of the inversion mode lateral MOSFET shown in FIG. 20.

First, as shown in FIG. 21A, a p/p$^+$ type substrate composed of a p$^+$ type substrate 1 and a p type base layer 2 formed on the main surface thereof is prepared. A contact region 3, an n$^+$ type source region 4 and an n$^+$ type drain region 5 are formed in advance in the surface layer portion of the p type base layer 2. After wet oxidation of the substrate at 1080° C. for 80 minutes by the pyrogenic process, the temperature is reduced and when it reaches 700° C., the atmosphere is switched from wet to nitrogen, whereby a silicon oxide film 6a having a thickness of approximately 52 nm is formed.

Figure 21B:
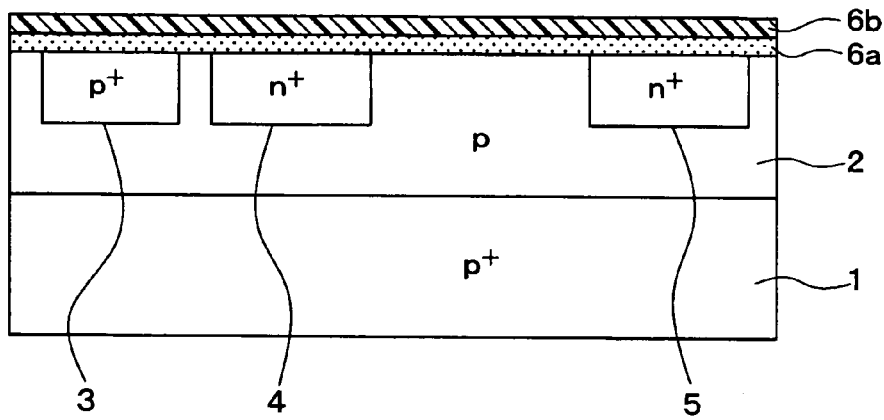

As shown in FIG. 21B, a silicon nitride film 6b having a thickness of approximately 15 nm is formed on the surface of the silicon oxide film 6a by using an LP-CVD device. In this step, the film is formed at 800° C. Occurrence of desorption of terminal elements can be prevented by adjusting the film formation temperature at 800° C. or less.

Figure 21C:
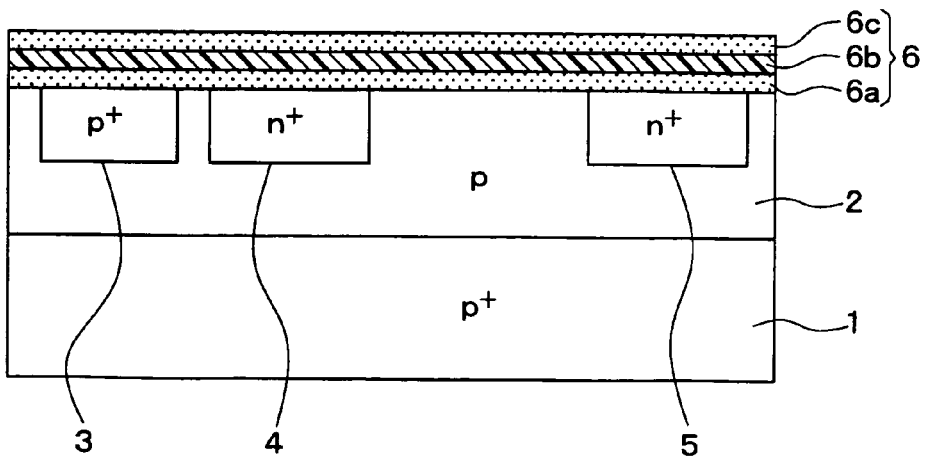

As shown in FIG. 21C, the surface of the silicon nitride film 6b is then oxidized by wet oxidation at 950° C. and a silicon oxide film (top oxide film) 6c having a thickness of approximately 7 nm is formed. In this step, the temperature is raised from 700° C. while employing a wet atmosphere and the wet atmosphere is maintained at the time of the temperature reduction until the temperature decreases to 700° C. Desorption of terminal elements can be prevented by maintaining the wet atmosphere at a temperature of 700° C. or greater. In particular, as a cap effect and generation of hydrogen by the oxidation reaction of the silicon nitride film 6b act synergistically, this step contributes to improvement in the termination effect of the dangling bonds at the MOS interface and improvement in the channel mobility.

Figure 22A:
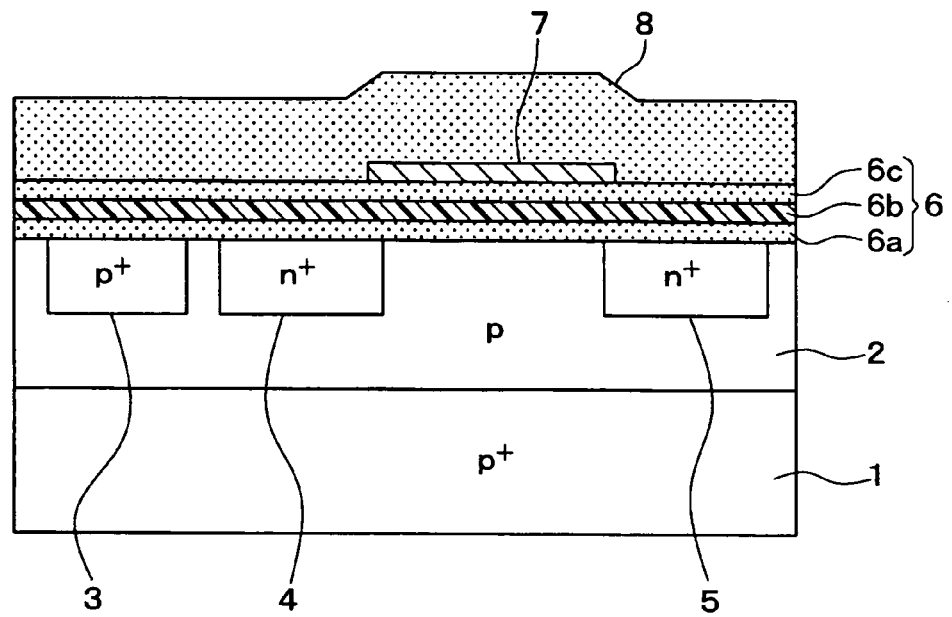
FIGS. 22A and 22B are cross-sectional views illustrating the manufacturing steps of the inversion mode lateral MOSFET following those of FIGS. 21A to 21C.
Figure 22B:
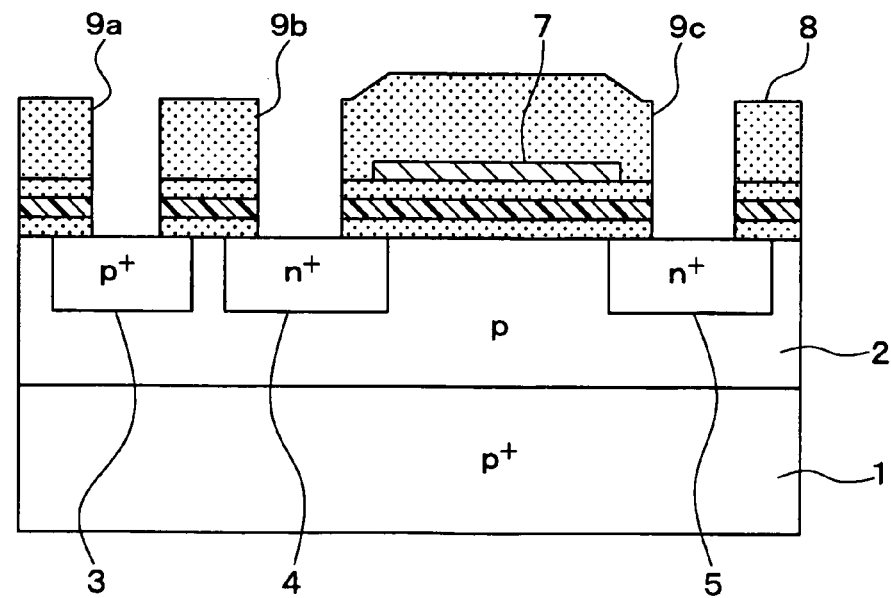

As shown in FIG. 22A, after a step of forming a gate oxide film 7 on the surface of the silicon oxide film 6c, an interlayer insulating film 8 is formed by forming an LTO film at 420° C. As shown in FIG. 22B, after steps of forming contact holes 9a to 9c connected to the contact region 3, the n$^+$ type source region 4, the n$^+$ type drain region 5, a base electrode 10, a source electrode 11, a drain electrode 12 and a gate electrode 13 are formed, whereby the inversion mode lateral MOSFET of this embodiment is completed.

The inversion mode lateral MOSFET may thus have the gate insulating film 6 made of an ONO film. In this Embodiment, an insulating film sandwiched between the silicon oxide films 6a and 6c of the gate insulating film 6 is a silicon nitride film 6b. Alternatively, a high dielectric film such as $HfO_2$, HfSiON, HfAlO, $Al_2O_3$, or $Ta_2O_5$ film may be sandwiched between them. In this case, oxidation temperature employed for the formation of the top oxide film to be formed by oxidation of the surface of the high dielectric film may be changed as needed.

Other Embodiments (1) In the above embodiments, the description was made of the formation of the gate oxide film 6, 38 or 68 by wet oxidation. In order to terminate, with an element H or OH, the dangling bonds at the interface between the gate oxide film 6, 38 or 68 and the p type base layer 2 or the channel epitaxial layer 34 or 64 during the gate oxide film formation step, it is only necessary to maintain the wet atmosphere or the hydrogen atmosphere at least at the time of the temperature reduction in the gate oxide film formation step.

Accordingly, it is also possible to form the gate oxide film 6, 38 or 68 in advance by a method other than wet oxidation, and switch the atmosphere to wet only at the time of the temperature reduction, thereby terminating the dangling bonds at the interface between SiC and the gate oxide film 6, 38 or 68 with H or OH at the time of the temperature reduction.

For example, after formation of the gate oxide film by oxidation in a dry atmosphere, an $N_2O$ atmosphere, an NO atmosphere, an ozone atmosphere, an $H_2O$ radical atmosphere, or the like or by deposition of LTO, TEOS, HTO, or the like by CVD or the like method, the temperature may be reduced to the termination-desorption temperature or less while introducing $H_2O$ into a chamber for forming the gate oxide film at the time of the temperature reduction, thereby switching the atmosphere to wet one. If the gate oxide film can be formed employing deposition in combination in such a manner, it becomes possible to increase the thickness of the gate oxide film even by using low-temperature wet annealing having a low oxidation rate in combination with deposition. Moreover, owing to a reduction in thermally-oxidized film thickness, the strain at the interface decreases, making it possible to reduce the interface state density, thereby improving the channel mobility.

In this embodiment, a description was made of the formation of a gate insulating film using an oxide film. When this method is employed, the gate insulating film may be constructed of another insulating film. Examples of the other insulating film include $HfO_2$, HfSiON, HfAlO, $Al_2O_3$, $Ta_2O_5$, and $Si_3N_4$.

(2) In the above-described embodiments, the wet atmosphere is employed at the time of the temperature reduction in the gate oxide film formation step. The gate oxide film formation step may be followed by annealing for improving the properties by using the wet atmosphere or hydrogen atmosphere.

Figure 23:
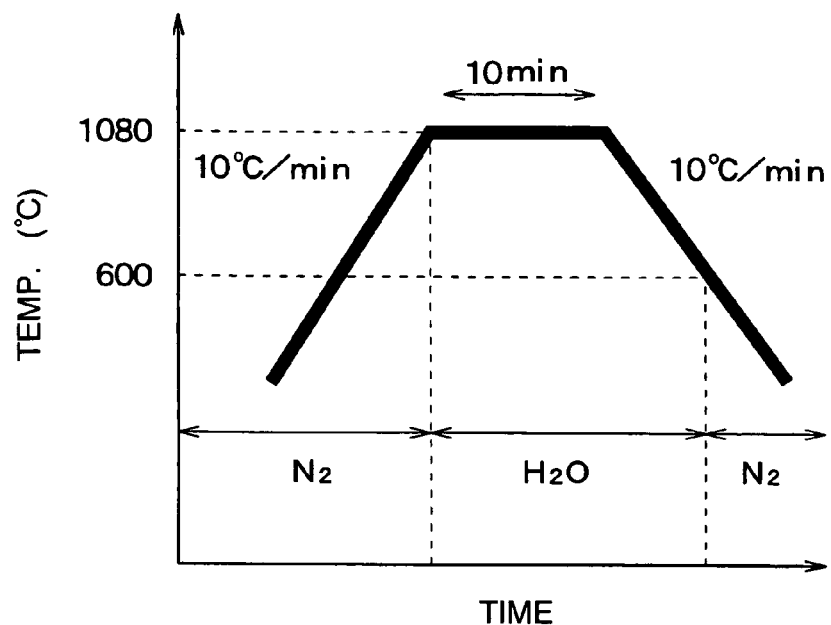
FIG. 23 is a graph schematically showing how to control the atmosphere and temperature of a gate oxide film formation step shown in another embodiment.

For example, annealing in the wet atmosphere is performed after carrying out the step shown in FIG. 3A of the first embodiment in the following manner. FIG. 23 schematically shows how to control the atmosphere and temperature of annealing in the wet atmosphere.

First, an HTO film is formed, for example, by introducing $N_2O$ and $SiH_4$ gases at 800° C. using a CVD device or the like to form a gate oxide film 6. The resulting film is then annealed in the wet atmosphere.

Described specifically, the temperature is raised from the room temperature to 1080° C. at a temperature gradient of 10° C./min in the nitrogen ($N_2$) atmosphere. When the temperature reaches 1080° C., annealing is performed while switching the atmosphere to wet ($H_2O$) and maintaining the temperature for 10 minutes. The temperature is the decreased at 10° C./min while maintaining the wet atmosphere. The wet atmosphere is maintained until the temperature decreases to 600° C. or less.

In such a manner, annealing is conducted after the gate oxide film formation step and the wet atmosphere is maintained at the time of the temperature reduction during annealing. This makes it possible to terminate, with an element H or OH, the dangling bonds at the interface between the gate oxide film 6 and the p type base layer 2 constituting the channel region.

Also by this embodiment, similar effects to those available in the above-described embodiments can be obtained. If annealing is conducted after the gate oxide film formation step as described above, the gate oxide film may be formed by a method other than wet oxidation or the gate insulating film may be made of an insulating film other than an oxide film.

Such annealing is also effective when conducted after formation of the gate oxide film 6, 38 or 68 in the wet atmosphere for the purpose of improving the properties further.

In this embodiment, annealing is performed immediately after the gate oxide film formation step, that is, prior to the gate formation step, but it may be performed after the gate formation step, an interlayer insulating film formation step, or the like. If annealing is performed in such a manner, the gate 6, 38 or 68, or the interlayer insulating film 8, 40 or 70 plays a role as a cap layer, thereby making it possible to improve the properties at the interface between the gate oxide film 6, 38 or 68 and SiC further.

(3) Similarly, at the time of the temperature reduction in the gate oxide film formation step, the wet atmosphere is constantly maintained during a period until the temperature is reduced to 600° C. or 700° C. However, it is sufficient to continuously maintain the wet atmosphere in a temperature range including at least the termination-desorption temperature.

Figure 24:
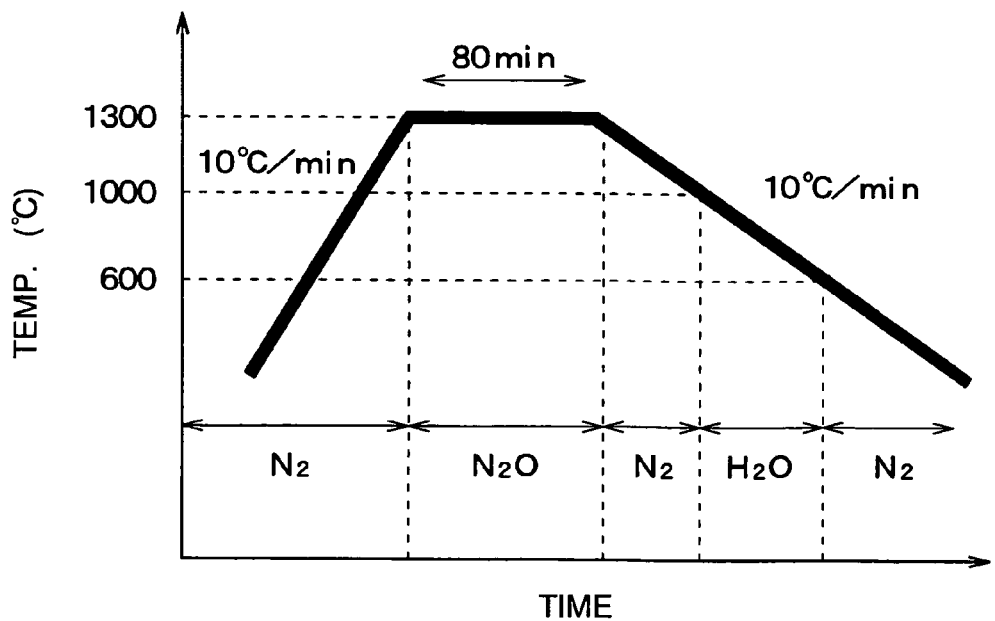
FIG. 24 is a graph schematically showing how to control the atmosphere and temperature of a gate oxide film formation step shown in a further embodiment.

For example, in the step shown in FIG. 3A of the first embodiment, the atmosphere and temperature can be controlled in accordance with FIG. 24.

Described specifically, the temperature is raised from room temperature to 1300° C. at a temperature gradient of 10° C./min in a nitrogen atmosphere. When the temperature reaches 1300° C., oxidation is performed for 80 minutes in an $N_2O$ atmosphere ($N_2$ dilution) to form the gate oxide film 6. The atmosphere is then returned to a nitrogen atmosphere and the temperature is reduced at a temperature gradient of 10° C./min. When it reaches 1000° C., the atmosphere is switched to a wet atmosphere. The temperature is reduced at 10° C./min while maintaining the wet atmosphere until the temperature decreases to 600° C. or less. When the temperature reaches 600° C., the atmosphere is returned to a nitrogen one and the temperature is reduced to room temperature.

If a wet atmosphere is maintained in a temperature range including at least the termination-desorption temperature at the time of the temperature reduction in the gate oxide film formation step, the dangling bonds at the interface between the gate oxide film 6 and the p type base layer 2 constituting the channel region can be terminated with an element H or OH.

When an $N_2O$ atmosphere is employed as described above, the dangling bonds at the interface between the gate oxide film 6 and the p type base layer 2 constituting the channel region can be also terminated with N as well as with H or OH. This makes it possible to reduce the interface state density further, thereby improving the channel mobility further. When gate oxidation is performed in an NO atmosphere instead of an $N_2O$ atmosphere, similar effects can be produced and the channel mobility can be improved further.

(4) In the above-described embodiments, the wet atmosphere is formed by the pyrogenic process, but it may also be formed by a bubbling method in which $H_2O$ is boiled.

(5) In the second to fifth embodiments, the description was made of the combination of a method of employing a wet atmosphere at the time of the temperature reduction in the gate oxide film formation step and a method of carrying out annealing, reflow treatment or the like in a wet atmosphere or hydrogen atmosphere. The combination of these methods is however not indispensable. It is possible to produce the above-described effects even when these methods are used singly.

(6) In the above embodiments, the description was made of the case where plane a of 4H—SiC, that is, a (11-20) plane or (1-100) plane is used as a plane vertical to a (0001) Si plane or (000-1) C plane is used. It is also possible to use another plane or another crystal structure.

(7) In the above-described embodiments, the description was made of the inversion mode lateral MOSFET, the lateral accumulation-mode MOSFET and the planar MOSFET as examples of a semiconductor device having an MOS structure. However, these MOSFETs are merely shown as one example of the semiconductor device having an MOS structure. The present invention can be also applied to, for example, IGBT having an MOS structure or a trench gate MOSFET. In case of the trench gate MOSFET, a groove having a perpendicular sidewall is formed on a (000-1)-orientation c-surface of a substrate or a (0001)-orientation Si-surface of a substrate. The sidewall of the trench is used as a channel surface so that the channel surface is a surface perpendicular to the (0001)-orientation surface, which has high channel mobility. Accordingly, the high channel mobility MOSFET is obtained. In short, the present invention can be applied to any semiconductor device having an MOS structure, in which a channel surface is a surface perpendicular to the (0001)-orientation Si-surface so that the device has high channel mobility.

(8) In the above-described embodiments, the atmosphere is not necessarily be a 100% wet atmosphere or hydrogen atmosphere, but it may be diluted with another gas.

(9) Although crystal orientation must originally be shown with a bar (-) affixed above a desired number, the bar is affixed before the desired number in this specification because there is a restriction in expression due to patent application using a computer.

The above disclosure has the following aspects.

According to a first aspect of the present disclosure, a silicon carbide semiconductor device having an MOS structure includes: a substrate made of silicon carbide and having a main surface; a channel region made of silicon carbide on the substrate, wherein the channel region provides a current path as a channel; a first impurity region disposed on an upstream side of the current path and a second impurity region disposed on a downstream side of the current path; a gate insulating film disposed on a surface of the channel region; and a gate disposed on the gate insulating film. The channel of the channel region for flowing current between the first impurity region and the second impurity region is controlled by a voltage applied to the gate. An interface between the channel region and the gate insulating film has a hydrogen concentration equal to or greater than $2.6 \times 10^{20}$ $cm^{-3}$. The interface provides a channel surface perpendicular to a (0001)-orientation plane.

It is possible to obtain a silicon carbide semiconductor device having high channel mobility by using the substrate made of silicon carbide and having as a main surface a plane vertical to the (0001) Si plane; terminating dangling bonds at the interface between the channel region and the gate insulating film with H or OH; and controlling a hydrogen concentration at the interface to as high as $2.6 \times 10^{20}$ cm$^{-3}$ or greater.

Alternatively, the interface between the channel region and the gate insulating film may have a dangling bond, which is terminated with a H atom or a OH group, and the dangling bond may be further terminated with a nitrogen atom. Termination of the dangling bonds at the interface between the channel region and the gate insulating film also with a nitrogen element enables a further reduction of an interface state density, which leads to an improvement in channel mobility.

Alternatively, the channel surface may be a (11-20)-orientation plane or a (1-100)-orientation plane. Use of such a plane orientation decreases mismatch of a lattice constant with $SiO_2$. This suppresses generation of dangling bonds and makes it possible to obtain a silicon carbide semiconductor device having particularly high channel mobility.

Alternatively, the dangling bond may be terminated with at least one of a H atom, a $H_2$ molecule, a deuterium atom and a deuterium molecule, and the at least one of the H atom, a $H_2$ molecule, a deuterium atom and a deuterium molecule terminating the dangling bond has a desorption amount peak in a range between 800° C. and 900° C.

According to a second aspect of the present disclosure, a method for manufacturing a silicon carbide semiconductor device having an MOS structure includes: preparing a substrate made of silicon carbide and having a main surface; forming a channel region made of silicon carbide on the substrate, wherein the channel region provides a current path as a channel; forming a first impurity region on an upstream side of the current path and a second impurity region on a downstream side of the current path; forming a gate insulating film on a surface of the channel region; forming a gate on the gate insulating film; and performing a heat treatment. The channel of the channel region for flowing current between the first impurity region and the second impurity region is controlled by a voltage applied to the gate. The performing the heat treatment includes: reducing temperature in a range between 800° C. and 900° C.; and maintaining a wet atmosphere or a hydrogen atmosphere continuously in the reducing the temperature. The interface provides a channel surface perpendicular to a (0001)-orientation plane.

Thus, at the time of the temperature reduction in the heat treatment step, the temperature is reduced to the termination-desorption temperature or less while continuously maintaining the wet atmosphere or hydrogen atmosphere in a temperature range of from 800 to 900° C., which is a termination-desorption temperature. This enables termination of the dangling bonds at the interface between the gate insulating film and the channel region with H or OH elements, thereby making it possible to obtain a silicon carbide semiconductor device having higher channel mobility.

Alternatively, the performing the heat treatment may provide to form the gate insulating film in the forming the gate insulating film. Further, the maintaining the wet atmosphere or the hydrogen atmosphere may be performed until the temperature is reduced equal to or smaller than 800° C. in the reducing the temperature. Further, the maintaining the wet atmosphere or the hydrogen atmosphere may be performed until the temperature is reduced equal to or smaller than 700° C. in the reducing the temperature. Furthermore, the performing the heat treatment may further include increasing the temperature equal to or greater than 900° C. in the wet atmosphere so that a gate oxide film as the gate insulating film is formed by wet oxidation. Furthermore, the performing the heat treatment may further include increasing the temperature equal to or greater than 1000° C. in the wet atmosphere so that a gate oxide film as the gate insulating film is formed by wet oxidation. Furthermore, the performing the heat treatment may further include increasing the temperature equal to or greater than 800° C. in the wet atmosphere so that a gate oxide film as the gate insulating film is formed by wet oxidation. Further, in the maintaining the wet atmosphere or the hydrogen atmosphere, the wet atmosphere may be maintained in the reducing the temperature after the increasing the temperature.

Alternatively, in the forming the gate insulating film, the gate insulating film is formed by a method other than wet oxidation in the wet atmosphere. Thus, it is possible to form the gate insulating film by a method different from wet oxidation using a wet atmosphere. For example, a gate oxide film is formed by depositing LTO, TEOS, HTO or the like while using a dry atmosphere, $N_2O$ atmosphere, NO atmosphere, ozone atmosphere, $H_2O$ radical or CVD. It may be an insulating film other than an oxide film such as $HfO_2$, HfSiON, HfAlO, $Al_2O_3$, $Ta_2O_5$ or $Si_3N_4$. Further, the gate insulating film may be formed by oxidation in an $N_2O$ atmosphere or a NO atmosphere. In this case, it is possible to terminate the dangling bonds at the interface between the channel region and the gate insulating film with an element H or OH, and in addition with a nitrogen element when the gate insulating film is made of a gate oxide film by oxidation in an $N_2O$ atmosphere or NO atmosphere. This makes it possible to reduce the interface state density further, thereby improving the channel mobility.

Alternatively, the forming the gate insulating film further includes depositing a LTO, TEOS or HTO gate insulating film. If at least a portion of the gate insulating film is formed by depositing LTO, TEOS or HTO in the gate insulating film formation step, a gate oxide film can be formed by using deposition in combination. This makes it possible to thicken the gate oxide film even by using it in combination with low-temperature wet annealing having a slow oxidation rate. Moreover, since the thickness of a film to be thermally oxidized decreases, a strain at the interface decreases, making it possible to reduce the interface state density and improve the channel mobility.

Alternatively, the performing the heat treatment may further include maintaining the temperature to be a predetermined temperature in a range between 800° C. and 900° C. for a predetermined time in the reducing the temperature in a range between 800° C. and 900° C. By maintaining a predetermined temperature within a temperature range of from 800 to 900° C. for a predetermine time in such a manner, that is, maintaining the termination-desorption temperature for long hours, a termination effect of dangling bonds with H or OH can be improved.

Alternatively, the performing the heat treatment may further include: reducing the temperature in a range between 700° C. and 1000° C.; and maintaining the temperature to be a predetermined temperature in a range between 700° C. and 1000° C. for a predetermined time in the reducing the temperature in a range between 700° C. and 1000° C.

Alternatively, the performing the heat treatment may be performed as an anneal step for improving characteristics of the interface between the gate insulating film and the channel region after the forming the gate insulating film. As described above, it is possible to carry out a heat treatment step as annealing for improving the characteristics of the interface between the gate insulating film and the channel region after the gate insulating film formation step. Such annealing can be performed either together with heat treatment in the gate insulating film formation step or instead of the heat treatment in the gate insulating film formation step. Further, the maintaining the wet atmosphere or the hydrogen atmosphere is performed until the temperature is equal to or smaller than 800° C. Further, the maintaining the wet atmosphere or the hydrogen atmosphere may be performed during the temperature is in a range between 700° C. and 1000° C. Furthermore, the maintaining the wet atmosphere or the hydrogen atmosphere may be performed until the temperature is reduced equal to or smaller than 700° C. Furthermore, the maintaining the wet atmosphere or the hydrogen atmosphere may be performed when the temperature is equal to or greater than 800° C. in both of a temperature increasing step and a temperature reducing step. Furthermore, the maintaining the wet atmosphere or the hydrogen atmosphere may be performed when the temperature is equal to or greater than 700° C. in both of a temperature increasing step and a temperature reducing step. Furthermore, the performing the heat treatment further includes maintaining the temperature to be a predetermined temperature in a range between 800° C. and 900° C. for a predetermined time in the reducing the temperature in a range between 800° C. and 900° C. Furthermore, the performing the heat treatment may further include: reducing the temperature in a range between 700° C. and 1000° C.; and maintaining the temperature to be a predetermined temperature in a range between 700° C. and 1000° C. for a predetermined time in the reducing the temperature in a range between 700° C. and 1000° C. Furthermore, the method may further include: forming a cap layer on a surface of the gate insulating film. The anneal step in the performing the heat treatment is performed after the forming the cap layer. Further, the forming the cap layer may provide the forming the gate so that the gate is formed as the cap layer. Furthermore, the gate may be made of polysilicon. Furthermore, the performing the heat treatment may further include round-off oxidation of the gate made of the polysilicon in the wet atmosphere. Furthermore, the round-off oxidation may be performed at a temperature in a range between 800° C. and 900° C.

Alternatively, the forming the cap layer may provide to form an interlayer insulating film to cover the gate so that the interlayer insulating film is formed as the cap layer.

Alternatively, the method may further include: forming an interlayer insulating film to cover the gate; and performing a reflow treatment of the interlayer insulating film. The performing the reflow treatment provides the performing the heat treatment.

Alternatively, the maintaining the wet atmosphere or the hydrogen atmosphere may be performed when the temperature is equal to or greater than 800° C. after the forming the gate insulating film.

Alternatively, the maintaining the wet atmosphere or the hydrogen atmosphere may be performed when the temperature is equal to or greater than 700° C. after the forming the gate insulating film.

Alternatively, all steps after the forming the gate insulating film may be performed within a temperature equal to or smaller than 800° C.

Alternatively, all steps after the forming the gate insulating film may be performed within a temperature equal to or smaller than 700° C.

Alternatively, the method may further include: forming a source region as the first impurity layer, wherein the source region has an impurity concentration equal to or greater than $3 \times 10^{20}$ cm$^{-3}$, and wherein the source region contacts the channel region; and forming a source electrode having a portion made of Ni, which contacts the source region.

Alternatively, the method may further include: forming a drain region as the second impurity layer, wherein the drain region has an impurity concentration equal to or greater than $3 \times 10^{20}$ cm$^{-3}$, and wherein the drain region contacts the channel region or is disposed on a back surface of the substrate; and forming a drain electrode having a portion made of Ni, which contacts the drain region.

Alternatively, the method may further include: forming a base region on the substrate, wherein the base region has a conductivity type different from those of the first impurity region and the second impurity region; forming a contact region contacting the base region, wherein the contact region has a conductivity type equal to that of the base region, and wherein the contact region has an impurity concentration equal to or greater than $3 \times 10^{20}$ cm$^{-3}$; and forming an electrode having a portion made of Ni, which contacts the contact region, wherein the electrode fixes a potential of the base region.

Alternatively, the method may further include: annealing the electrode at a temperature equal to or smaller than 800° C.

Alternatively, the method may further include: annealing the electrode at a temperature equal to or smaller than 700° C.

Alternatively, the method may further include: annealing the electrode at a temperature equal to or greater than 800° C. The maintaining the wet atmosphere or the hydrogen atmosphere is performed when the temperature is equal to or greater than 800° C. in both of a temperature increasing step and a temperature reducing step of the annealing the electrode.

Alternatively, the method may further include: annealing at a predetermined temperature equal to or smaller than 800° C. in an atmosphere different from the wet atmosphere after the performing the heat treatment. Further, the predetermined temperature in the annealing after the performing the heat treatment may be equal to or smaller than 700° C.

Alternatively, the forming the gate insulating film may include: forming a first silicon oxide film on the surface of the channel region; forming an intermediate insulating film made of a silicon nitride film or a high dielectric constant film over the first silicon oxide film; and forming an oxide film by oxidizing the surface of the intermediate insulating film. The forming the first silicon oxide film may include: performing a second heat treatment in a temperature range between 800° C. and 900° C.; and continuously maintaining the wet atmosphere or the hydrogen atmosphere in a temperature reducing step of the performing the second heat treatment. The forming the oxide film includes: performing a third heat treatment in a temperature range equal to or greater than 800° C.; and continuously maintaining the wet atmosphere or the hydrogen atmosphere in the performing the third heat treatment. Furthermore, the continuously maintaining the wet atmosphere or the hydrogen atmosphere may be performed in the temperature reducing step of the performing the second heat treatment when the temperature is equal to or greater than 700° C., and the continuously maintaining the wet atmosphere or the hydrogen atmosphere may be performed in the performing the third heat treatment when the temperature is equal to or greater than 700° C. in a temperature reducing step of the performing the third heat treatment.

Alternatively, the performing the heat treatment may have a maximum temperature in the maintaining the wet atmosphere or the hydrogen atmosphere, and the maximum temperature is in a range between 800° C. and 1100° C.

Alternatively, the main surface of the substrate may be a (11-20)-orientation plane or a (1-100)-orientation plane.

Alternatively, the main surface of the substrate may be a (0001)-orientation plane or a (000-1)-orientation plane. The substrate further includes a trench having a sidewall, which is provided by a plane perpendicular to the (000-1)-orientation plane, and the gate insulating film is disposed in the trench so that a trench gate MOSFET is formed.

Alternatively, the channel surface may be a (11-20)-orientation plane or a (1-100)-orientation plane.

Alternatively, in the maintaining the wet atmosphere or the hydrogen atmosphere continuously, a dangling bond at an interface between the gate insulating film and the channel region may be terminated with a H atom or a OH group.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A method for manufacturing a silicon carbide semiconductor device having an MOS structure, the method comprising:
    preparing a substrate made of silicon carbide and having a main surface;
    forming a channel region made of silicon carbide on the substrate, wherein the channel region provides a current path as a channel and has an impurity concentration lower than an impurity concentration of the substrate;
    forming a first impurity region on an upstream side of the current path and a second impurity region on a downstream side of the current path;
    forming a gate insulating film on a surface of the channel region;
    forming a gate on the gate insulating film; and
    performing a heat treatment either during or after the forming of the gate insulating film, wherein
    the channel of the channel region for flowing current between the first impurity region and the second impurity region is controlled by a voltage applied to the gate,
    the performing the heat treatment includes:
        reducing temperature at a predetermined rate from 900° C. to 800° C.; and
        maintaining a wet atmosphere or a hydrogen atmosphere continuously during the reducing of the temperature,
    an interface between the channel region and the gate insulating film provides a channel surface perpendicular to a (0001)-orientation plane, and
    the channel surface is oriented so that current flows along the channel surface.

2. The method according to claim 1, wherein
the performing the heat treatment provides to form the gate insulating film in the forming the gate insulating film.

3. The method according to claim 2, wherein
the maintaining the wet atmosphere or the hydrogen atmosphere continues to be performed until the temperature is reduced equal to or smaller than 800° C. in the reducing the temperature.

4. The method according to claim 2, wherein
the maintaining the wet atmosphere or the hydrogen atmosphere continues to be performed until the temperature is reduced equal to or smaller than 700° C. in the reducing the temperature.

5. The method according claim 2, wherein
the performing the heat treatment further includes initially increasing the temperature equal to or greater than 900° C. in the wet atmosphere so that a gate oxide film as the gate insulating film is formed by wet oxidation.

6. The method according to claim 2, wherein
the performing the heat treatment further includes initially increasing the temperature equal to or greater than 1000° C. in the wet atmosphere so that a gate oxide film as the gate insulating film is formed by wet oxidation.

7. The method according to claim 2, wherein
the performing the heat treatment further includes initially increasing the temperature equal to or greater than 800° C. in the wet atmosphere so that a gate oxide film as the gate insulating film is formed by wet oxidation.

8. The method according to claim 7, wherein
in the maintaining the wet atmosphere or the hydrogen atmosphere, the wet atmosphere is maintained in the reducing the temperature after the increasing the temperature.

9. The method according to claim 2, wherein
in the forming the gate insulating film, the gate insulating film is formed by a method other than wet oxidation in the wet atmosphere.

10. The method according to claim 9, wherein
the gate insulating film is formed by oxidation in an $N_2O$ atmosphere or a NO atmosphere.

11. The method according to claim 2, wherein
the forming the gate insulating film further includes depositing a LTO, TEOS or HTO gate insulating film.

12. The method according to claim 2, wherein
the performing the heat treatment further includes maintaining the temperature to be a predetermined temperature in a range between 800° C. and 900° C. for a predetermined time in the reducing temperature at a predetermined rate from 900° C. to 800° C.

13. The method according to claim 2, wherein
the performing the heat treatment further includes:
    reducing the temperature at a predetermined rate from 1000° C. to 700° C.; and
    maintaining the temperature to be a predetermined temperature in a range between 700° C. and 1000° C. for a predetermined time in the reducing the temperature at a predetermined rate from 1000° C. to 700° C.

14. The method according to claim 1, wherein
the performing the heat treatment is performed as an anneal step for improving characteristics of an interface between the gate insulating film and the channel region after the forming the gate insulating film.

15. The method according to claim 14, wherein
the maintaining the wet atmosphere or the hydrogen atmosphere is performed until the temperature is equal to or smaller than 800° C.

16. The method according to claim 14, wherein
the maintaining the wet atmosphere or the hydrogen atmosphere is performed when the temperature is in a range between 700° C. and 1000° C.

17. The method according to claim 16, wherein
the maintaining the wet atmosphere or the hydrogen atmosphere is performed until the temperature is reduced equal to or smaller than 700° C.

18. The method according to claim 14, wherein
the maintaining the wet atmosphere or the hydrogen atmosphere is performed when the temperature is equal to or greater than 800° C. in both of a temperature increasing step and a temperature reducing step.

19. The method according to claim 14, wherein
the maintaining the wet atmosphere or the hydrogen atmosphere is performed when the temperature is equal to or greater than 700° C. in both of a temperature increasing step and a temperature reducing step.

20. The method according to claim 15, wherein the performing the heat treatment further includes maintaining the temperature to be a predetermined temperature in a range between 800° C. and 900° C. for a predetermined time in the reducing the temperature at a predetermined rate from 900° C. to 800° C.

21. The method according to claim 15, wherein the performing the heat treatment further includes:
reducing the temperature at a predetermined rate from 1000° C. to 700° C.; and
maintaining the temperature to be a predetermined temperature in a range between 700° C. and 1000° C. for a predetermined time in the reducing the temperature at a predetermined rate from 1000° C. to 700° C.

22. The method according to claim 15, further comprising:
forming a cap layer on a surface of the gate insulating film, wherein
the anneal step in the performing the heat treatment is performed after the forming the cap layer.

23. The method according to claim 22, wherein the forming the cap layer provides the forming the gate so that the gate is formed as the cap layer.

24. The method according to claim 23, wherein the gate is made of polysilicon.

25. The method according to claim 24, wherein the performing the heat treatment further includes round-off oxidation of the gate made of the polysilicon in the wet atmosphere.

26. The method according claim 25, wherein the round-off oxidation is performed at a temperature in a range between 800° C. and 900° C.

27. The method according to claim 22, wherein the forming the cap layer provides to form an interlayer insulating film to cover the gate so that the interlayer insulating film is formed as the cap layer.

28. The method according to claim 1, further comprising:
forming an interlayer insulating film to cover the gate; and
performing a reflow treatment of the interlayer insulating film, wherein
the performing the reflow treatment provides the performing the heat treatment.

29. The method according to claim 1, wherein the maintaining the wet atmosphere or the hydrogen atmosphere is performed when the temperature is equal to or greater than 800° C. after the forming the gate insulating film.

30. The method according to claim 1, wherein the maintaining the wet atmosphere or the hydrogen atmosphere is performed when the temperature is equal to or greater than 700° C. after the forming the gate insulating film.

31. The method according to claim 1, wherein all steps after the forming the gate insulating film are performed at a temperature equal to or smaller than 800° C.

32. The method according to claim 1, wherein all steps after the forming the gate insulating film are performed at a temperature equal to or smaller than 700° C.

33. The method according to claim 1 further comprising:
forming a source region as the first impurity layer, wherein the source region has an impurity concentration equal to or greater than $3\times10^{20}$ cm$^{-3}$, and wherein the source region contacts the channel region; and
forming a source electrode having a portion made of Ni, which contacts the source region.

34. The method according to claim 1 further comprising:
forming a drain region as the second impurity layer, wherein the drain region has an impurity concentration equal to or greater than $3\times10^{20}$ cm$^{-3}$, and wherein the drain region contacts the channel region or is disposed on a back surface of the substrate; and
forming a drain electrode having a portion made of Ni, which contacts the drain region.

35. The method according to claim 1 further comprising:
forming a base region over the main surface of the substrate, wherein the base region has a conductivity type different from those of the first impurity region and the second impurity region;
forming a contact region contacting the base region, wherein the contact region has a conductivity type equal to that of the base region, and wherein the contact region has an impurity concentration equal to or greater than $3\times10^{20}$ cm$^{-3}$; and
forming an electrode having a portion made of Ni, which contacts the contact region, wherein the electrode fixes a potential of the base region.

36. The method according to claim 33 further comprising:
annealing the electrode at a temperature equal to or smaller than 800° C.

37. The method according to claim 33 further comprising:
annealing the electrode at a temperature equal to or smaller than 700° C.

38. The method according to claim 33 further comprising:
annealing the electrode at a temperature equal to or greater than 800° C., wherein
the maintaining the wet atmosphere or the hydrogen atmosphere is performed when the temperature is equal to or greater than 800° C. in both of a temperature increasing step and a temperature reducing step of the annealing the electrode.

39. The method according to claim 1, further comprising:
annealing at a predetermined temperature equal to or smaller than 800° C. in an atmosphere different from the wet atmosphere after the performing the heat treatment.

40. The method according to claim 39, wherein the predetermined temperature in the annealing after the performing the heat treatment is equal to or smaller than 700° C.

41. The method according to claim 1, wherein:
the forming the gate insulating film includes:
forming a first silicon oxide film on the surface of the channel region;
forming an intermediate insulating film made of a silicon nitride film or a high dielectric constant film over the first silicon oxide film; and
forming an oxide film by oxidizing the surface of the intermediate insulating film,
the forming the first silicon oxide film includes:
performing a second heat treatment as the temperature is reduced at the predetermined rate from 900° C. to 800° C.; and
continuously maintaining the wet atmosphere or the hydrogen atmosphere in a temperature reducing step of the performing the second heat treatment, and
the forming the oxide film includes:
performing a third heat treatment when the temperature is greater than or equal to 800° C.; and
continuously maintaining the wet atmosphere or the hydrogen atmosphere in the performing the third heat treatment, wherein the second heat treatment is performed simultaneously with the first heat treatment and the third heat treatment is performed before the first heat treatment.

42. The method according to claim 41, wherein
the continuously maintaining the wet atmosphere or the hydrogen atmosphere is performed in the temperature reducing step of the performing the second heat treatment when the temperature is equal to or greater than 700° C., and
the continuously maintaining the wet atmosphere or the hydrogen atmosphere is performed in the performing the third heat treatment when the temperature is equal to or greater than 700° C. in a temperature reducing step of the performing the third heat treatment.

43. The method according to claim 1, wherein
the performing the heat treatment has a maximum temperature in the maintaining the wet atmosphere or the hydrogen atmosphere, and
the maximum temperature is in a range between 800° C. and 1100° C.

44. The method according to claim 1, wherein
the main surface of the substrate is a (11-20)-orientation plane or a (1-100)-orientation plane.

45. The method according to claim 1, wherein
the main surface of the substrate is a (0001)-orientation plane or a (000-1)-orientation plane,
the substrate further includes a trench having a sidewall, which is provided by a plane perpendicular to the (000-1)-orientation plane, and
the gate insulating film is disposed in the trench so that a trench gate MOSFET is formed.

46. The method according to claim 1, wherein
the channel surface is a (11-20)-orientation plane or a (1-100)-orientation plane.

47. The method according to claim 1, wherein
in the maintaining the wet atmosphere or the hydrogen atmosphere continuously, a dangling bond at an interface between the gate insulating film and the channel region is terminated with a H atom or a OH group.

48. The method according to claim 1, wherein the forming the channel region is performed by an epitaxial growth method.

49. The method according to claim 1, wherein a process time in the reducing the temperature is equal to or greater than one minute.

* * * * *